(12) United States Patent
Sasago et al.

(10) Patent No.: US 9,385,320 B2
(45) Date of Patent: Jul. 5, 2016

(54) SEMICONDUCTOR STORAGE DEVICE AND METHOD FOR MANUFACTURING SAME

(71) Applicant: Hitachi, Ltd., Chiyoda-ku, Tokyo (JP)

(72) Inventors: Yoshitaka Sasago, Tachikawa (JP); Akio Shima, Hino (JP); Satoru Hanzawa, Hachioji (JP); Takashi Kobayashi, Higashimurayama (JP); Masaharu Kinoshita, Tsukuba (JP); Norikatsu Takaura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/857,217

(22) Filed: Sep. 17, 2015

(65) Prior Publication Data

US 2016/0005969 A1    Jan. 7, 2016

Related U.S. Application Data

(60) Division of application No. 14/468,513, filed on Aug. 26, 2014, now Pat. No. 9,153,775, which is a division of application No. 14/046,984, filed on Oct. 6, 2013, now Pat. No. 8,841,646, which is a continuation of application No. 13/515,435, filed as application No. PCT/JP2010/072398 on Dec. 13, 2010, now Pat. No. 8,563,961.

(30) Foreign Application Priority Data

Dec. 17, 2009    (JP) .................................. 2009-285876

(51) Int. Cl.
*H01L 47/00* (2006.01)
*H01L 45/00* (2006.01)
(Continued)

(52) U.S. Cl.
CPC .......... *H01L 45/1666* (2013.01); *H01L 27/224* (2013.01); *H01L 27/2409* (2013.01);
(Continued)

(58) Field of Classification Search
CPC ............ H01L 45/1666; H01L 45/1206; H01L 45/1233; H01L 45/1608; H01L 45/1641; H01L 45/1675; H01L 27/2409; H01L 27/2481; G11C 13/0004

USPC ....................... 257/4, 42, E45.002, E27.004; 365/230.04
See application file for complete search history.

(56) References Cited

U.S. PATENT DOCUMENTS 7,663,900 B2    2/2010  Stipe
7,719,870 B2    5/2010  Hanzawa et al.
(Continued)

FOREIGN PATENT DOCUMENTS

JP    2005-522045 A    7/2005
JP    2007-180389 A    7/2007
(Continued)

OTHER PUBLICATIONS

Ryota Katsmata, "Pipe-shaped BiCS Flash memory with 16 Stacked Layers and Multi-Level-Cell Operation for Ultra High Density Storage Devices", Symposium on VSLI Technology Digest of Technical Papers, pp. 136-137 (2009).
(Continued)

*Primary Examiner* — Tu-Tu Ho
(74) *Attorney, Agent, or Firm* — Miles & Stockbridge P.C.

(57) ABSTRACT

Disclosed are a semiconductor storage device and a method for manufacturing the semiconductor storage device, whereby the bit cost of memory using a variable resistance material is reduced. The semiconductor storage device has: a substrate; a first word line (2) which is provided above the substrate; a first laminated body, which is disposed above the first word line (2), and which has the N+1 (N≥1) number of first inter-gate insulating layers (11-15) and the N number of first semiconductor layers (21p-24p) alternately laminated in the height direction of the substrate; a first bit line (3), which extends in the direction that intersects the first word line (2), and which is disposed above the laminated body; a first gate insulating layer (9) which is provided on the side surface of the N+1 number of the first inter-gate insulating layers (11-15) and those of the N number of the first semiconductor layers (21p-24p); a first channel layer (8p) which is provided on the side surface of the first gate insulating layer (9); and a first variable resistance material layer (7) which is provided on the side surface of the first channel layer. The first variable material layer (7) is in a region where the first word line (2) and the first bit line (3) intersect each other. Furthermore, a polysilicon diode (PD) is used as a selection element.

17 Claims, 89 Drawing Sheets

(51) Int. Cl.
*H01L 27/24* (2006.01)
*H01L 27/22* (2006.01)

(52) U.S. Cl.
CPC ........ *H01L27/2454* (2013.01); *H01L 27/2481* (2013.01); *H01L 45/04* (2013.01); *H01L 45/12* (2013.01); *H01L 45/1206* (2013.01); *H01L 45/1608* (2013.01); *H01L 45/1641* (2013.01); *H01L 45/1675* (2013.01); *H01L 45/06* (2013.01); *H01L 45/1233* (2013.01); *H01L 45/144* (2013.01); *H01L 45/1683* (2013.01)

(56) References Cited

U.S. PATENT DOCUMENTS

| | | | |
|---|---|---|---|
| 8,071,969 B2 * | 12/2011 | Aoyama | ................ H01L 27/24 257/2 |
| 8,384,059 B2 | 2/2013 | Toda | |
| 2007/0158736 A1 | 7/2007 | Arai et al. | |
| 2008/0048237 A1 | 2/2008 | Iwata | |
| 2008/0149913 A1 | 6/2008 | Tanaka et al. | |
| 2009/0067229 A1 | 3/2009 | Kang et al. | |
| 2009/0086525 A1 | 4/2009 | Park et al. | |
| 2011/0065272 A1 | 3/2011 | Mizukami et al. | |

FOREIGN PATENT DOCUMENTS

| | | |
|---|---|---|
| JP | 2008-034456 A | 2/2008 |
| JP | 2008-160004 A | 7/2008 |
| JP | 2009-016400 A | 1/2009 |
| JP | 2009-071313 A | 4/2009 |

OTHER PUBLICATIONS

H. Tanaka et al., "Bit Cost Scalable Technology with Punch and Plug Process for Ultra High Density Flash Memory", Symposium on VLSI Technology Digest of Technical Papers, Jun. 12, 2007, pp. 14-15.

* cited by examiner

SEMICONDUCTOR STORAGE DEVICE AND METHOD FOR MANUFACTURING SAME

TECHNICAL FIELD

This invention relates to a semiconductor storage device and a method for manufacturing the same, and particularly relates to a nonvolatile semiconductor storage device that can store information and can be electrically programmed by using a material in which electric properties are changed by applying current to elements.

BACKGROUND ART

Recently, variable resistance type memories have been studied as memories replacing flash memories which approach the limit of reduction of flash memory size. As one example of these studies, phase change memories in which chalcogenide materials are used as storage materials have been actively studied. A memory structure of the phase change memory is a structure in which the storage material is sandwiched by metal electrodes. The phase change memory is a variable resistance type memory that stores information by using a phenomenon in which the storage material between the electrodes has different resistance states.

The phase change memory stores information by using a phenomenon in which resistivities of the phase change materials such as $Ge_2Sb_2Te_5$ are different in an amorphous state and a crystal state. The phase change memory has higher resistance in the amorphous state and has lower resistance in the crystal state. Therefore, read is performed by applying voltage difference across an element, measuring current flown through the element and determining whether the resistance state of the element is high or low.

The phase change memory programs data by changing electric resistance of a phase change film in different states by Joule heat generated by current. A reset operation, in other words, an operation to change into the amorphous state being high resistance is performed by melting the phase change material by applying large current for a short time, and thereafter by quenching by rapid decrease in the current. On the other hand, a set operation, in other words, an operation to change into the crystal state being low resistance is performed by applying sufficient current to maintain crystallization temperature of the phase change material for a long period. This phase change memory is suitable for reduction of memory size in principle because, when the reduction of phase change memory size proceeds, required current to change a state of a phase change film becomes lower. Therefore, the phase change memory has been actively studied.

As a method for integrating the memory using these variable resistance type elements, Patent Literature 1 discloses constitution in which, in stacked structure formed by alternately stacking a plurality of gate electrode materials and insulator films, a plurality of through holes that pass through the entire layers is collectively patterned at the same time, and a gate insulator film, a channel layer, and the phase change film are formed and patterned on the inside of the through holes.

A literature related to this invention includes Nonpatent Literature 1. Nonpatent Literature 1 discloses an NAND-type flash memory having a similar structure to Patent Literature 1.

CITATION LIST

Patent Literature
Patent Literature 1: Japanese Patent Application Publication No. 2008-160004

Nonpatent Literature
Nonpatent Literature 1: Symposium on VSLI technology, pp. 136-137 (2009).

SUMMARY OF INVENTION

Technical Problem

However, there are following problems in the phase change memory described in Patent Literature 1.

A first problem is in that a select transistor selecting one unit cell is formed by a vertical type transistor. In the select transistor, a plurality of select transistors are provided for one source line. These select transistors are required to be independently selected. Therefore, the gate electrode is required to be isolated by an insulator film. As a result, a gap is generated in a direction along a source line, and thereby increase in integration is prevented.

Subsequently, a second problem is in that the through holes are previously formed, and then a memory film and a channel film are formed in a memory part. As described above, when the through holes are previously formed, the memory film and the channel layer are formed toward the center of the through hole. Here, the memory film and the channel film may not be formed because reduction of through hole size proceeds and the through hole becomes smaller, and thereby the through hole is almost plugged when film thicknesses of the memory film and the channel film are too thick to the size of the through hole. Therefore, the through hole is required to be expanded. However, in this case, the through hole is required to be expanded in both vertical and horizontal direction. Minimum feature sizes cannot be maintained in the both directions. As a result, small memory cells cannot be formed.

The above-described and other objects and novel characteristics of this invention will be clarified from the description of the specification and the accompanying drawings.

The NAND-type flash memory described in Nonpatent Literature 1 programs information by storing electrons flowing through a channel in a charge trap film existing between the gate electrode and the channel by biased high voltage at the gate electrodes. Therefore, the NAND-type flash memory has far different programming principle from the memory using variable resistance type elements in which current is applied to the storage elements themselves. Consequently, intact technologies applied for the NAND-type memory cannot be applied for the memory using variable resistance type elements.

Solution to Problem

Among inventions disclosed by this invention, outlines of representative examples are briefly described below.

As a first means, a stacked body formed by alternately stacking a semiconductor layer turning into a gate and an insulating layer, a gate insulator film layer formed on the side surface of the stacked body, a channel layer and a variable resistance material layer are included. Further, a diode is used as a selection element. Thereby, a degree of integration can be increased.

As a second means, a switch selecting a plurality of layers is provided as well as word lines, bit lines and gate signal lines corresponding to a plurality of layers are commonly controlled and memories are selected at the same time. Thereby, each word line, bit line and gate signal line, and a driving circuit of control lines of the layer selection switch can be reduced, and an area of the driving circuit can be reduced. Thereby, a bit cost is reduced.

As a third means, a gate insulator film layer, a channel layer, and a variable resistance material layer are provided in a region having a first semiconductor layer and a second semiconductor layer turning into the gate, and a first insulator film layer, and a second insulator film layer, and surrounded by the first semiconductor layer, the second semiconductor layer, the first insulator film layer, and the second insulator film layer. Both ends of the gate insulator film layer, the channel layer, and the variable resistance material layer are provided so as to be in contact with the first insulator film layer and the second insulator film layer. Thereby, in a direction in which the first insulator film layer and the second insulator film layer are parallelly arranged, a feature size can be determined without relation to film thicknesses of the gate insulator film layer, the channel layer, and the variable resistance material layer. Thereby, a cell area can be reduced and the bit cost can be reduced.

As a fourth means, two current paths and a phase change region are provided in a region where the bit line and the word line intersect each other, and each current paths is independently controlled. Thereby, the numbers of bits provided in the region where one bit line and one word line intersect each other can be increased and the bit cost can be reduced.

As a fifth means, memory chains connected in a chain-like manner and a diode selecting the memory chains are serially connected to each of regions where a plurality of word lines and a plurality of bit lines intersect each other. Thereby, the area of the memory cell can be reduced and the bit cost can be reduced.

Advantageous Effect of Invention

According to this invention, the bit cost of the semiconductor storage device can be reduced.

DESCRIPTION OF EMBODIMENTS

Hereinafter, embodiments of this invention are described in detail based on the drawings. In all drawings for illustrating the embodiments, the same reference sign is assigned for a member having the same function and repeated description thereof is omitted. It is previously described that sections in which characteristic constitution is described are not limited to each embodiment, and a similar effect is obtained when common constitution is formed.

Embodiment 1

Figure 1:
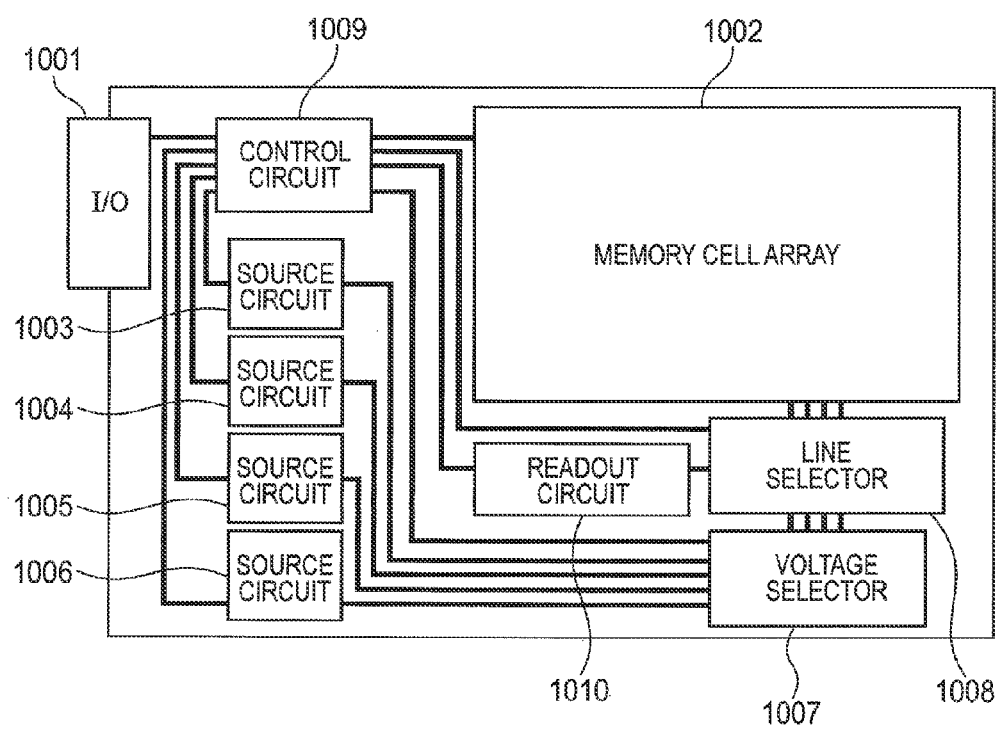
FIG. 1 is a total plan view of a semiconductor storage device according to this invention.

As illustrated in FIG. 1, a semiconductor storage device in the embodiment 1 of this invention includes an I/O interface 1001 providing an input-output buffer and the like for outputting and inputting data, a memory cell array 1002, a plurality of power supplies 1003-1006 for supplying a plurality of different voltages, a voltage selector 1007 for selecting the voltage from the power supplies 1003-1006, a line selector 1008 for selecting connection points of output from the voltage selector 1007 from wires such as a bit line and a word line of the memory cell array 1002, and a control circuit 1009 for controlling the whole deceive. A readout circuit 1010 having a sense amplifier and the like is connected to the line selector 1008.

When data is inputted from an external device to the I/O interface 1001, the control circuit 1009 selects a voltage for data programming using the voltage selector 1007, generates voltage pulse using any one of the power supplies 1003-1006, and supplies the voltage pulse to a predetermined wire of the memory cell array 1002 using the line selector 1008. Thereby, the data inputted into a phase change memory cell of the memory cell array is programmed.

When a read signal of data is inputted from the external device to the I/O interface 1001, the control circuit 1009 selects a voltage for reading data using the voltage selector 1007, generates the voltage using any one of the power supplies 1003-1006, and supplies the voltage into a predetermined wire of the memory cell array 1002 using the line selector 1008. As a result of the voltage supply, read current is read by the readout circuit 1010. This reproduces the stored data and the data are sent to the external device through the control circuit 1009 and the I/O interface 1001.

Figure 2:
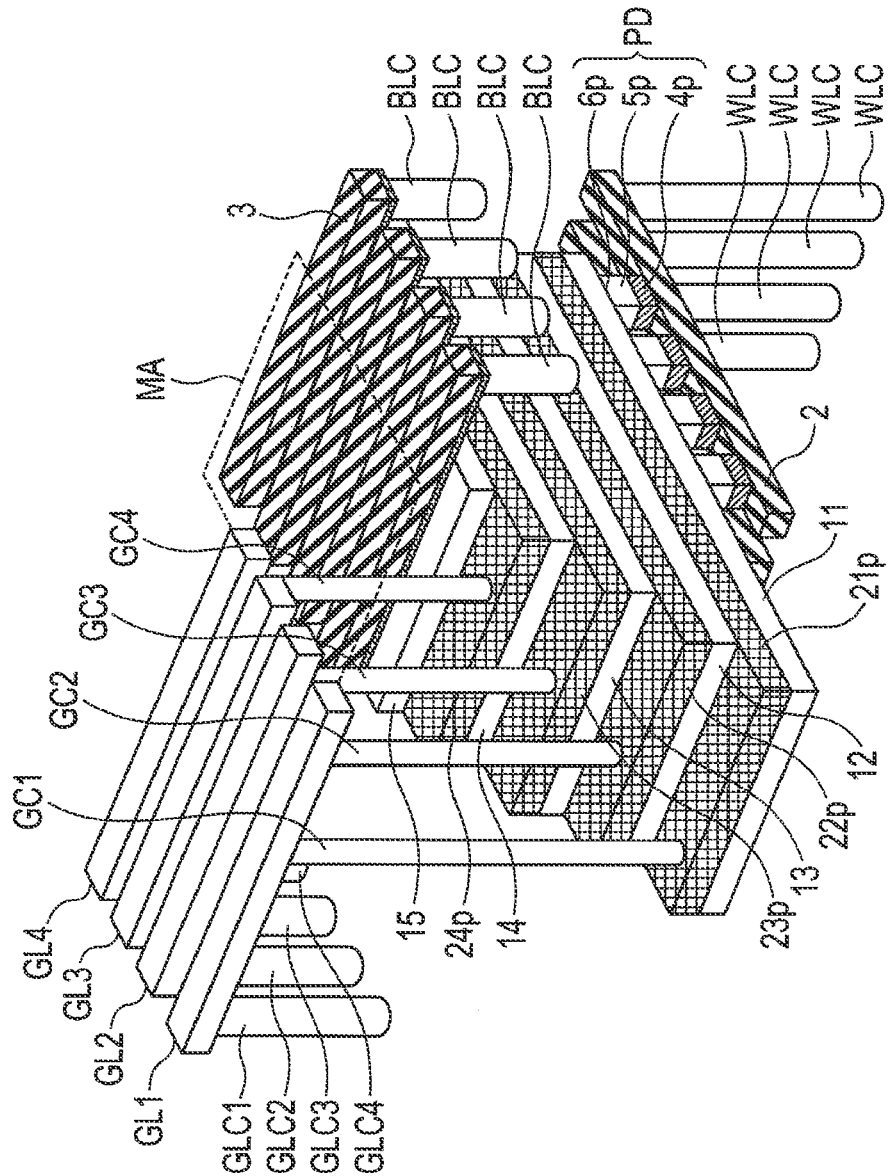
FIG. 2 is a partial three dimensional schematic view of a semiconductor storage device in an embodiment 1 of this invention.

FIG. 2 is a partial three dimensional schematic view of the semiconductor storage device in the embodiment 1, and illustrates a part of the memory cell array, wires and contacts. A part constituted by a word line 2 made of a metal wire; a contact hole WLC for connecting the word line 2 and the line selector illustrated in FIG. 1; a polysilicon diode PD made of a polysilicon layer 4p in which a p-type impurity is doped, a polysilicon layer 5p in which a low concentration impurity is doped and a polysilicon layer 6p in which an n-type impurity is doped; gate polysilicon layers 21p, 22p, 23p, 24p; metal wires GL1, GL2, GL3, GL4 for supplying electricity to the gate polysilicon, contacts GC1, GC2, GC3, GC4 for connecting the gate polysilicon layers 21p, 22p, 23p, 24p and the metal wires GL1, GL2, GL3, GL4, respectively; contacts GLC1, GLC2, GLC3, GLC4 for connecting the metal wires GL1, GL2, GL3, GL4 and the line selector, respectively; a bit line 3 made of a metal wire; a contact hole BLC for connecting the bit line 3 and the line selector illustrated in FIG. 1; an insulator film layer 11 between the polysilicon diode PD and the gate polysilicon layer 21; insulator film layers 12, 13, 14 between the gate polysilicon layers; and an insulator film 15 between the gate polysilicon layer 24p and the bit line 3 is illustrated in FIG. 2.

Figure 3:
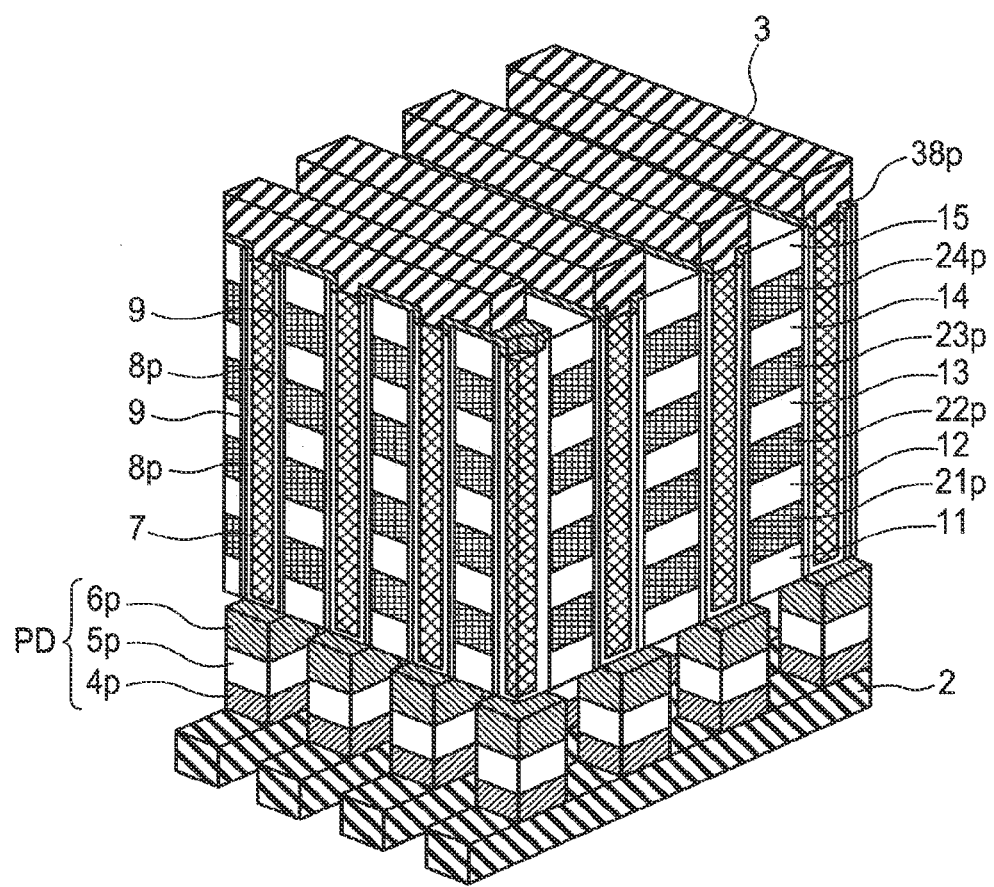
FIG. 3 is a three dimensional schematic view of a memory cell array in the embodiment 1 of this invention.

FIG. 3 is a view illustrating a part of the memory array MA particularly extracted from FIG. 2. Above a plurality of word lines 2, polysilicon diodes PD are periodically formed in an extending direction of the word lines 2. Between the bit line 3 and the polysilicon diode PD, a hole (a connection hole) passing through the gate polysilicon layers 21p, 22p, 23p, 24p and inter-gate insulator film layers 11, 12, 13, 14, 15 is formed. In the hole, a gate insulator film 9, a channel polysilicon layer 8p and a phase change material layer 7 are embedded. The hole is formed in a region where the word line 2 and the bit line 3 intersect each other.

The semiconductor storage device of this invention stores information by using a phenomenon in which phase change materials such as $Ge_2Sb_2Te_5$ included in the phase change material layer 7 has different resistivities in an amorphous state and a crystal state. The phase change memory has higher resistance in the amorphous state and has lower resistance in the crystal state. Therefore, the read is performed by applying voltage difference across the variable resistance type element, measuring current flown through the element, and determining whether the resistance state of the element is high or low.

Figure 4:
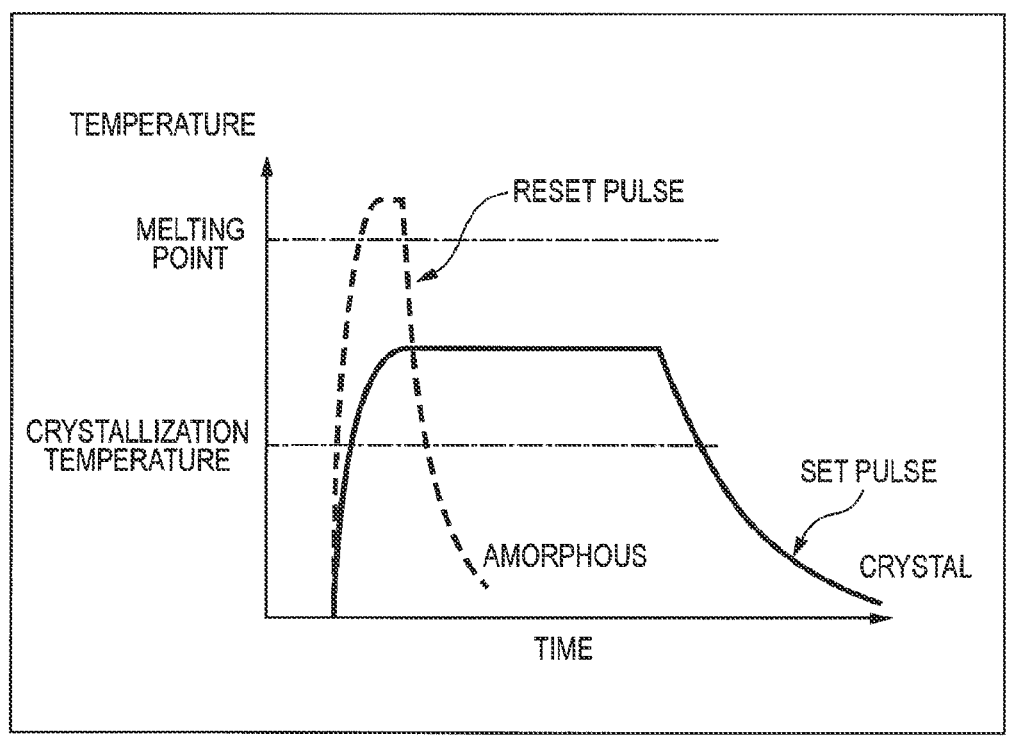
FIG. 4 is a graph illustrating a high resistance operation and a low resistance operation of a phase change memory of this invention.

FIG. 4 is a graph illustrating temperature change of a recording layer at the time of programming/erasing operation of the phase change memory in the embodiment 1 of this invention. An operation in which the phase change material is changed from the amorphous state being high resistance to the crystal state being low resistance, that is, the set operation, and, on the other hand, an operation in which the phase change material is changed from the crystal state being low resistance to the amorphous state being high resistance, that is, the reset operation are performed by temperature change such as change in FIG. 4 is applied to the phase change material. Specifically, the amorphous state of the phase change material can be turned into the crystal state by heating the material equal to or higher than the crystallization temperature and maintaining the temperature for $10^{-6}$ seconds or more. On the contrary, the crystal state of the phase change material can be turned into the amorphous state by heating the material up to a temperature equal to or higher than the melting point to turn into a liquid state, and then rapidly quenching.

Figure 5:
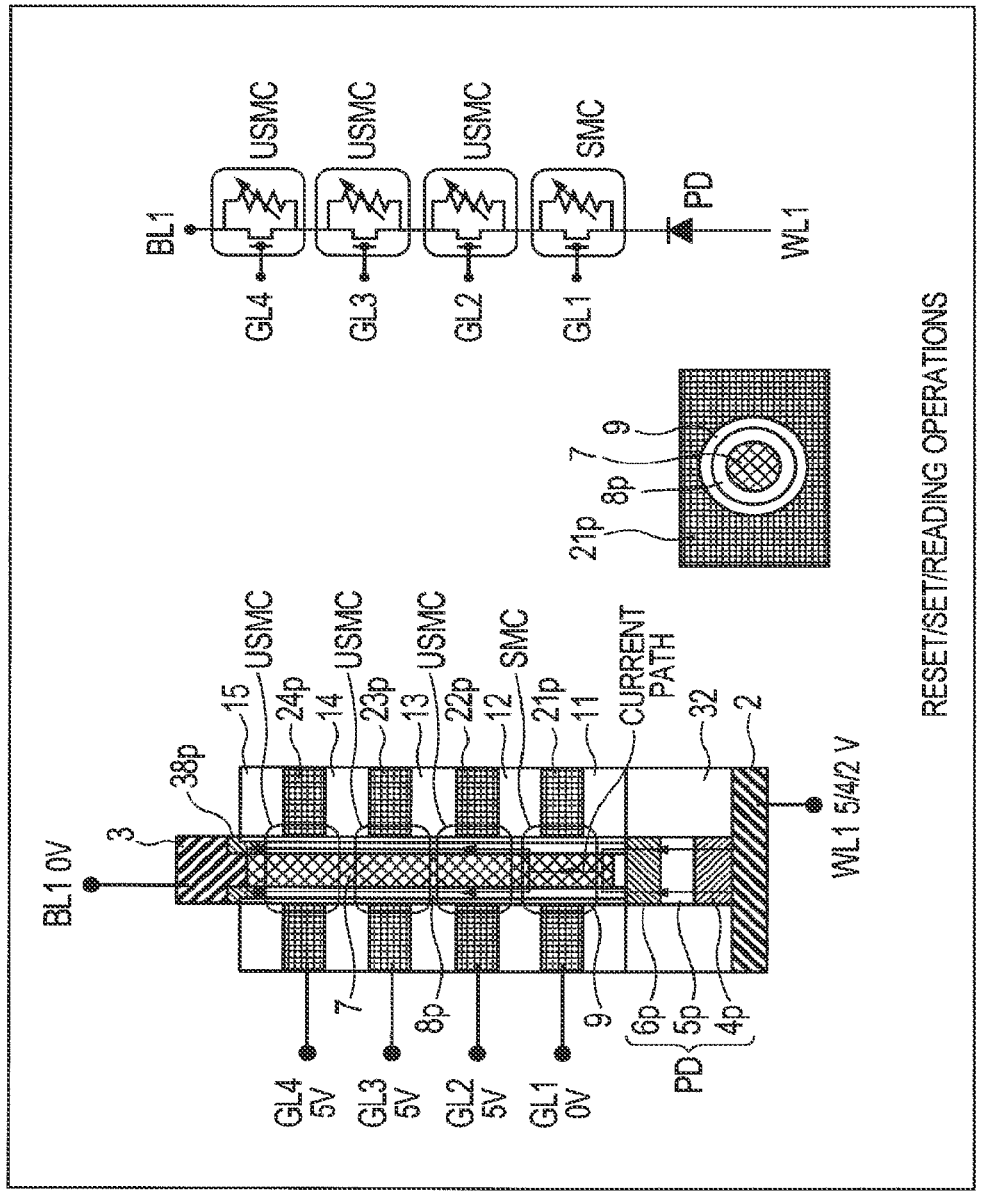
FIG. 5 is a view illustrating a reset operation, a set operation and a read operation of the memory cell array in the embodiment 1 of this invention.

FIG. 5 is a view illustrating a part extracted from the memory cell array in the embodiment 1. The extracted view is illustrated with a top view of one gate polysilicon layer 21p and an equivalent circuit diagram corresponding to a part of the memory cell array. Although an insulator film 32 is omitted in FIG. 2 and FIG. 3 because of understandability, the insulator film 32 is an insulator film embedded in space between PDs. An operation of the memory cell is performed as follows. Zero volts are biased to a gate line GL1 connected to a selection cell SMC, and a transistor using a channel polysilicon 8p as a channel is set to the OFF state. Five volt is biased to gate lines GL2, GL3, GL4 connected to an unselected cell USMC, and the transistor is set to the ON state. Zero volts are applied to a bit line BL1, and 5, 4, and 2 V are biased to a word line WL1 at the time of the reset operation, the set operation and the read operation, respectively. In the unselected cell USMC, in which the transistor is in the ON state, the channel has low resistance, and thereby current flows through the channel polysilicon 8p. Almost same current can be flown not depending on the state of the phase change material 7 in the USMC part. In SMC, current flows through the phase change material 7 because the transistor is in the OFF state. At the time of the reset operation and the set operation, the operations are performed by changing the resistivity of the phase change material 7 because of current flown through the phase change material 7 using SMC. At the time of the read operation, the operation is performed by determining a current value flown through the phase change material 7 using SMC.

Figure 6:
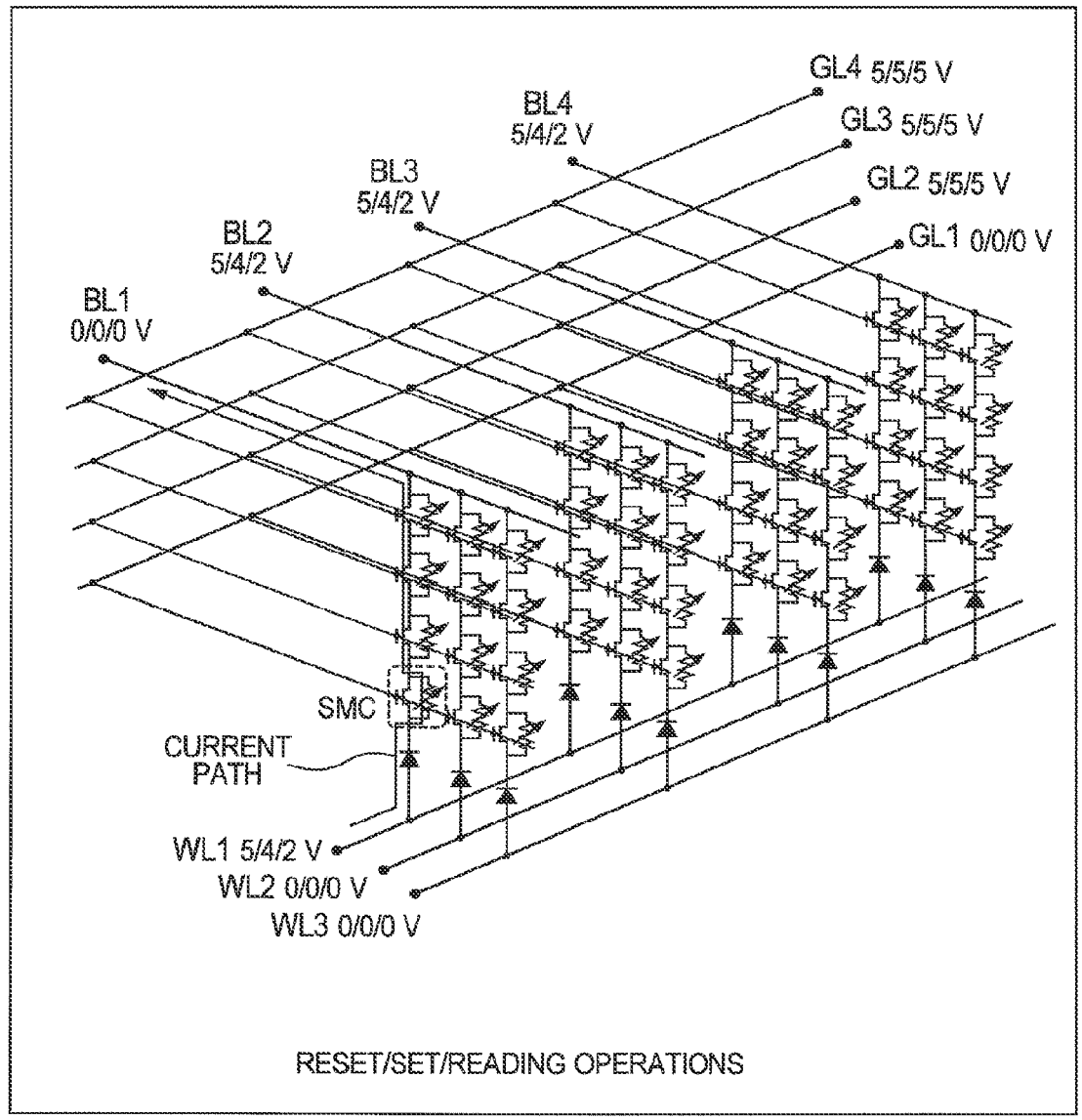
FIG. 6 is a circuit diagram illustrating the reset operation, the set operation and the read operation of the memory cell array in the embodiment 1 of this invention.

The memory cell array in the embodiment 1 is constituted by a plurality of bit lines, word lines, vertical type chain memories and polysilicon diodes PD. Therefore, the reset operation, the set operation and the read operation are performed by, for example as illustrated in FIG. 6, controlling voltages of the bit lines BL1, BL2, BL3, BL4; the word lines WL1, WL2, WL3; and the gate signal lines GL1, GL2, GL3, GL4. As similar to FIG. 5, voltages of WL1, that is, 5/4/2 V, are voltages at the time of the reset operation, the set operation and the read operation, respectively. Similarly, notations of voltages of other terminals in FIG. 6 represent voltages at the time of the reset operation, at the time of the set operation and at the time of the read operation in this order. In the vertical type chain memory in which the bit line side is connected to BL2, BL3, or BL4 and the word line side is connected to WL1, both voltages of the bit line and the word line are 5 V at the time of the reset operation, 4 V at the time of the set operation, and 2 V at the time of the read operation. As a result, current does not flow because the bit line and the word line have no voltage difference. In the vertical type chain memory in which the bit line side is connected to BL1 and the word line side is connected to WL2 or WL3, both voltages of the bit line and the word line are 0 V at the time of the reset operation, at the time of the set operation, and at the time of the read operation. As a result, current does not flow because the bit line and the word line have no voltage difference. In the vertical type chain memory in which the bit line side is connected to BL2, BL3, or BL4 and the word line side is connected to WL2 or WL3, 0 V and 5 V are biased to the word line and the bit line respectively at the time of the reset operation; 0 V and 4 V are applied to the word line and the bit line respectively at the time of the set operation, and 0 V and 2 V are applied to the word line and the bit line respectively at the time of the read operation. Voltages are biased in a reverse bias direction of the polysilicon diode PD that selects the vertical type chain memory. Withstand voltage of PD can be formed so as to be higher than 5 V, and thereby, it is possible that current does not flow.

Therefore, only the vertical type chain memory in which the bit line side is connected to BL1 and the word line side is connected to WL1 can bias the forward bias to PD to flow current. As a result, SMC in the memory array can be selected and operated because SMC in the vertical type chain can be selected and operated by the method described in FIG. 5.

As described above, each vertical type chain memory can be formed in a region where the word line 2 and the bit line 3 intersect each other by serially connecting the vertical type chain memory and the diode PD between the word line 2 and the bit line 3, and thereby, what is called a cross point type memory can be formed. As a result, the bit cost can be reduced because the area above the plane of the memory cells can be reduced and the memory cells can be more integrated. In the constitution in Patent Literature 1, signal lines required to have contacts outside of the memory array part are four types of lines, that is, a bit line, a gate, a word line and a source line. In contrast, when the diode PD is used as described in this embodiment, signal lines controlling a select transistor can be eliminated and an area outside of the memory array part can be reduced.

Here, it has been described that the voltages at the time of the reset operation, at the time of the set operation, and at the time of the read operation are determined as 5/4/2 V, respectively. The voltage becomes higher at the time of the reset operation, at the time of the set operation and at the time of the read operation in this order. However, required voltage for the operations is varied depending on circuit elements used and does not limited to the voltages of 5/4/2 V.

As illustrated in FIG. 5, in a chain type memory array using a phase change element 7, the gate polysilicon layers 21p, 22p, 23p, 24p and the insulator film layers 11, 12, 13, 14, and 15 are alternately formed and the channel polysilicon layer 8p and the phase change element are continuously provided at the side surface of the gate polysilicon layers and the insulator film layers. The current flown through the channel polysilicon layer 8p or the phase change element 7 is switched by controlling a gate voltage and thereby the phase change element can store information.

This chain type phase change memory cell array is stacked in a three dimensional manner in the height direction of the semiconductor substrate. The stacked body has constitution in which the stacked body has a connection hole connecting upper surfaces and lower surfaces of the alternately formed gate polysilicon layers 21p, 22p, 23p, 24p and insulator film layers 11, 12, 13, 14, 15, and a gate insulator film layer 9 being formed so as to cover the gate polysilicon layers and the insulator film layers and the phase change element 7 being formed so as to cover the gate insulator film layer 9 exist on the side surface of the connection hole. By this constitution, as the number of the stacked layers in the height direction increases, the number of the gate polysilicon layers covered with the gate insulator film layer 9 and the phase change element 7 that are formed by layer forming at the same time increases. Therefore, this constitution has an effect which increases the number of the memory cells formed at the same time compared with the case in which the gate insulator film layer 9 and the phase change element 7 are separately formed in every gate polysilicon layer. As a result, the bit cost can be reduced. In addition, by this constitution, the number of the memory cells commonly using a pair of the bit line BL and the word line WL is increased, because the number of the memory cells included in one vertical type chain memory increases. As a result, the bit cost can be reduced.

Another characteristic is in that the phase change material layer is formed so as to cover the channel layer (the gate, the channel and the phase change material layer are formed in this order). A horizontal memory cell chain structure cannot help forming the phase change material layer above the gate because the channel is formed in the substrate. Therefore, a contact to connect the channel layer and the phase change material layer is required because the gate is needed to be bypassed. On the other hand, in this embodiment, the phase change material layer is formed so as to cover the channel layer. Therefore, the gate is not needed to be bypassed, and further reduction of memory cell size is possible because of not providing the contact. This leads to reduction in the bit cost.

Constitution in which thicknesses of the insulator film layers 11, 12, 13, 14, 15 are thinner than those of the gate polysilicon layers 21p, 22p, 23p, 24p is also possible. When this constitution is formed as described above, in the channel polysilicon layer 8p, a length in the vertical direction of the channel polysilicon layer 8p formed on the surfaces of the insulator film layers 11, 12, 13, 14, 15, which are difficult to be affected by gate voltage, can be shortened. As a result, conductance of the current path of the channel part can be reduced and a programming/erasing operation can be performed in low current.

On the other hand, when the thicknesses of the insulator film layers 11, 12, 13, 14, 15 are too thin, thermal disturbance between adjacent memory cells each other may be generated because programming/erasing regions of the phase change material 7 become close. Therefore, change in the thicknesses of the insulator film layers 11, 12, 13, 14, 15 provides a trade-off relationship between reduction in the channel conductance and the thermal disturbance. In such a case, use of a high dielectric constant material such as SiN for the insulator film layer 11, 12, 13, 14, 15 can provide strong inversion of the channel layer positioned between the gate polysilicon layers. Current of the channel layer increases and an effective programming/erasing operation can be performed without reduction in the thicknesses of the insulator film layer 11, 12, 13, 14, 15. It goes without saying that reduction in the thicknesses of the insulator film layers 11, 12, 13, 14, 15 in such a degree that the thermal disturbance is not generated and use of the high dielectric constant material such as SiN for the insulator film layers are also possible.

Hereinafter, a method for manufacturing the semiconductor storage device in the embodiment 1 is described by using FIG. 7 to FIG. 28.

Figure 7:
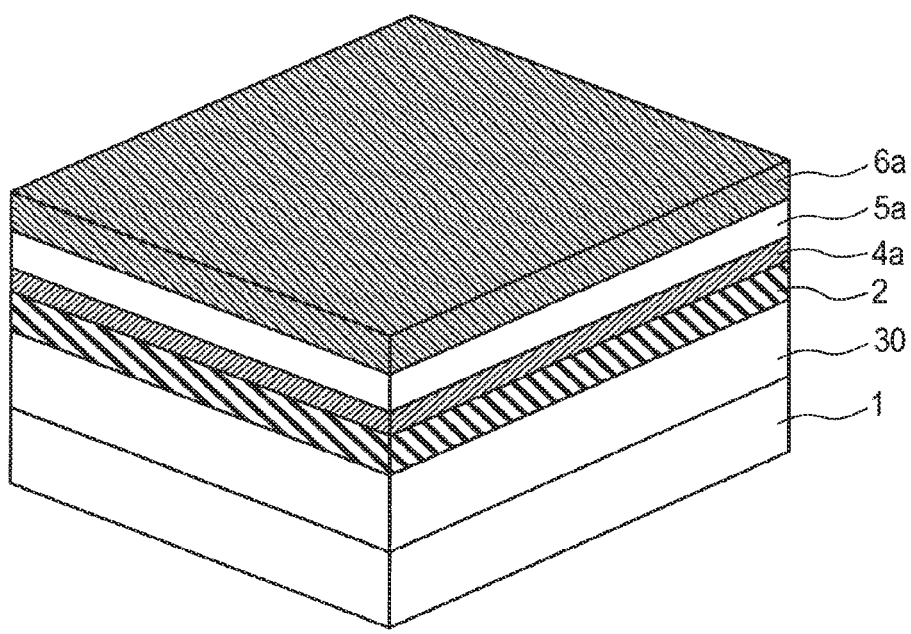
FIG. 7 is a partial three dimensional schematic view illustrating one example of a method for manufacturing the semiconductor storage device in the embodiment 1 of this invention.

As illustrated in FIG. 7, an interpoly dielectric film 30, a tungsten film layer 2 turning into a word line, an amorphous silicon layer 4a in which a p-type impurity is doped, an amorphous silicon layer 5a in which a low concentration impurity is doped, an amorphous silicon layer 6a in which an n-type impurity is doped are formed in this order above a semiconductor-substrate 1 in which peripheral circuit and a word line contact WLC are formed.

Figure 8:
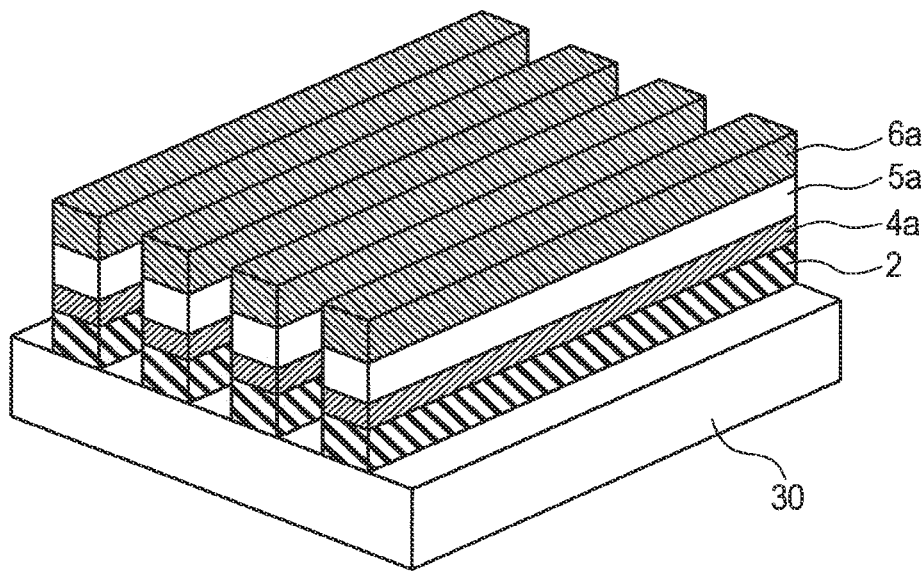
FIG. 8 is a partial three dimensional schematic view illustrating one example of the method for manufacturing the semiconductor storage device in the embodiment 1 of this invention.

Subsequently, as illustrated in FIG. 8, the formed film is patterned in a stripe-shaped pattern, which extends in a word line direction. This patterning is collectively performed from the amorphous silicon layers 4a, 5a, and 6a to the word line in a self-aligned manner at the same time. Therefore, stack misalignment between the word line and each layer of an amorphous silicon pillar is not generated in the word line direction, and thereby the reliability for the memory programming/erasing operation can be enhanced.

Figure 9:
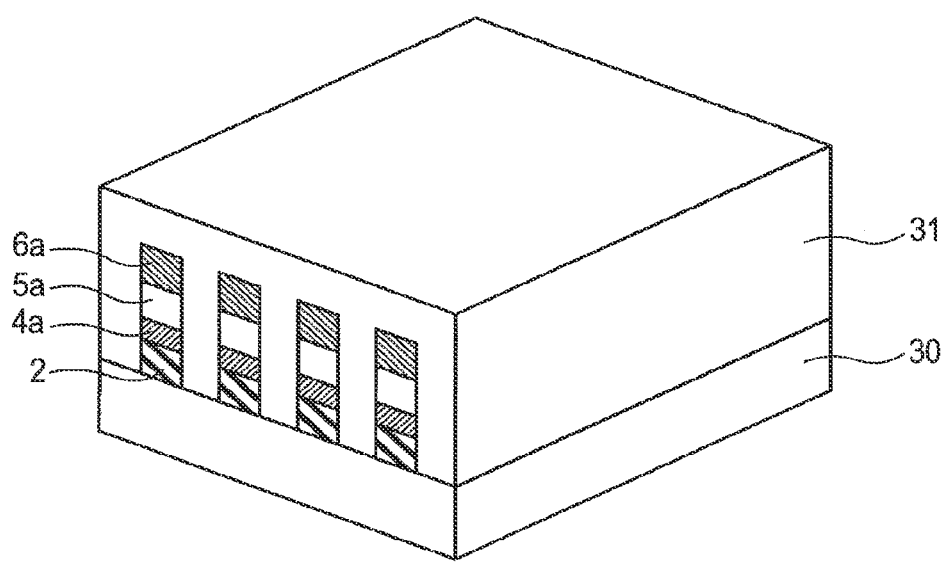
FIG. 9 is a partial three dimensional schematic view illustrating one example of the method for manufacturing the semiconductor storage device in the embodiment 1 of this invention.

Subsequently, the space illustrated in FIG. 8 is embedded with an insulator film 31 as illustrated in FIG. 9. Thereafter, the insulator film 31 is patterned in a stripe-shaped pattern perpendicular to the extending direction of the word line 2. At this time, only the insulator film 31 and the amorphous silicon layers 4a, 5a, 6a are patterned, and the word line 2 made from tungsten is not patterned.

Figure 10:
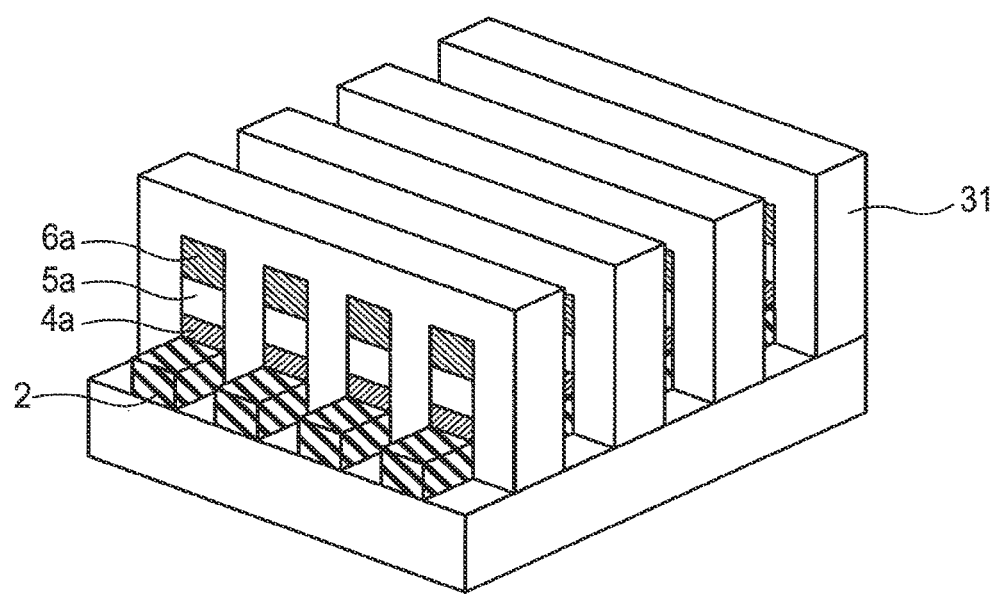
FIG. 10 is a partial three dimensional schematic view illustrating one example of the method for manufacturing the semiconductor storage device in the embodiment 1 of this invention.
Figure 11:
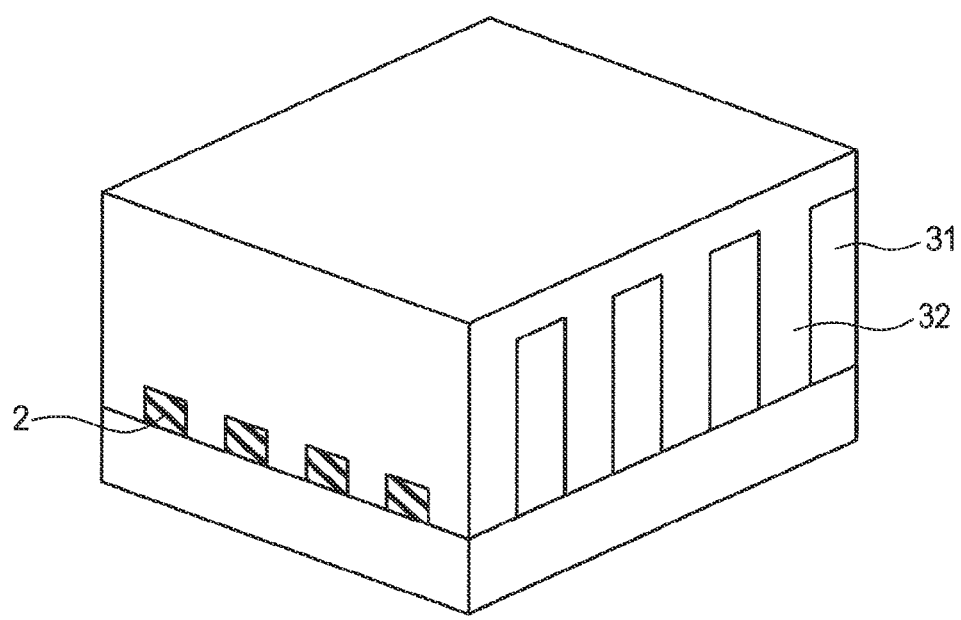
FIG. 11 is a partial three dimensional schematic view illustrating one example of the method for manufacturing the semiconductor storage device in the embodiment 1 of this invention.
Figure 12:
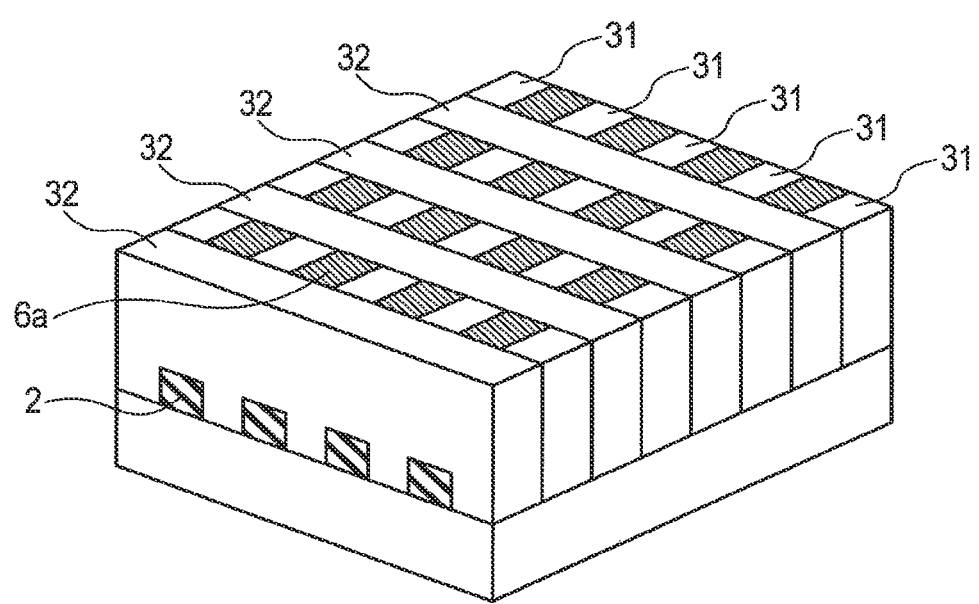
FIG. 12 is a partial three dimensional schematic view illustrating one example of the method for manufacturing the semiconductor storage device in the embodiment 1 of this invention.

Subsequently, as illustrated in FIG. 11, the space illustrated in FIG. 10 is embedded with an insulator film 32. Thereafter, as illustrated in FIG. 12, upper parts of the insulator films 31, 32 are removed by a chemical mechanical polishing method (CMP), and the upper surface of 6a is exposed. In the stage of FIG. 12, the word line and the amorphous silicon pillar formed in a self-aligned manner to the word line are formed.

Figure 13:
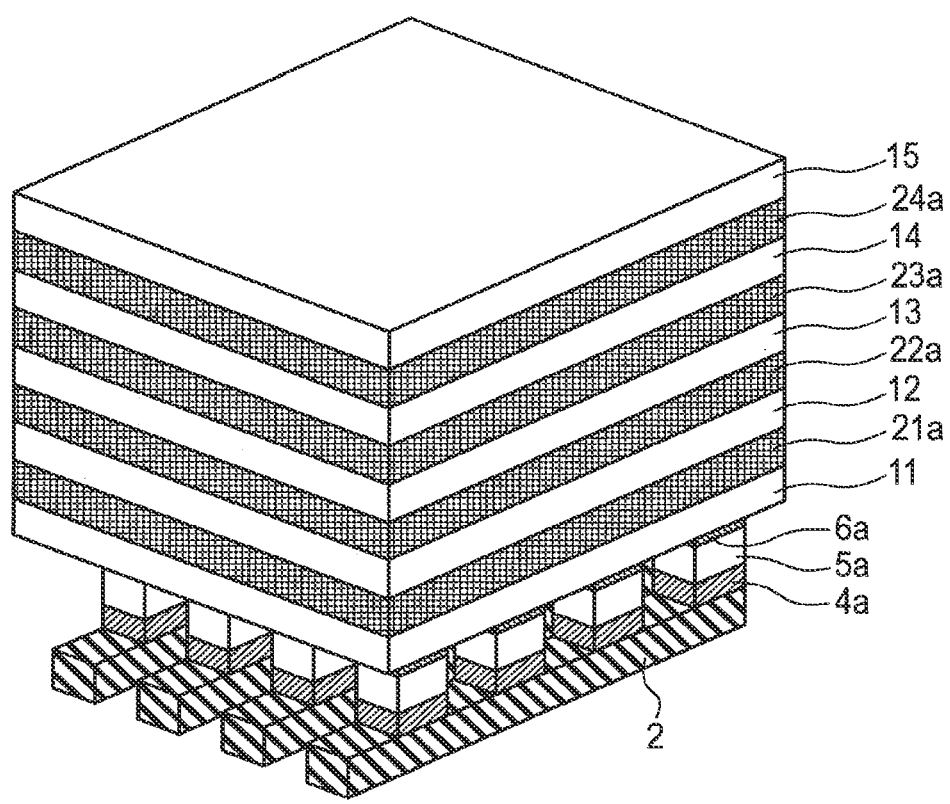
FIG. 13 is a partial three dimensional schematic view illustrating one example of the method for manufacturing the semiconductor storage device in the embodiment 1 of this invention.

In the three dimensional views described below, illustration of the insulator films 31, 32 are omitted because of understandability. As illustrated in FIG. 13, the insulator film layer 11, an amorphous silicon layer 21a, the insulator film layer 12, an amorphous silicon layer 22a, the insulator film layer 13, an amorphous silicon layer 23a, the insulator film layer 14, an amorphous silicon layer 24a and the insulator film layer 15 are formed in this order.

Figure 14:
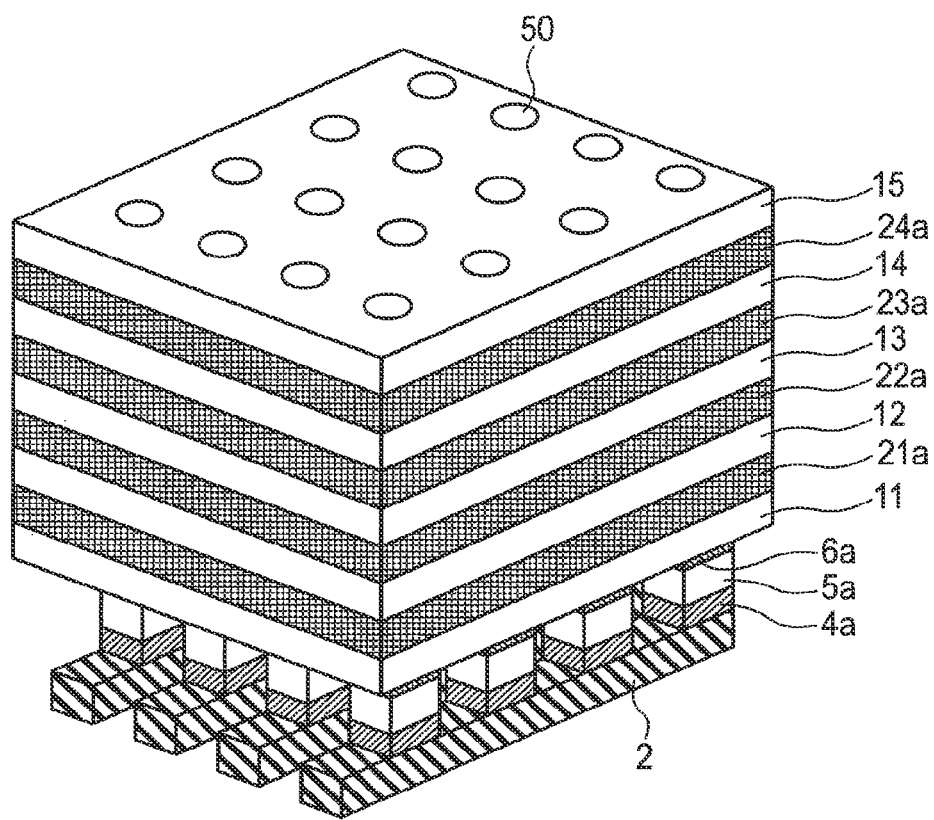
FIG. 14 is a partial three dimensional schematic view illustrating one example of the method for manufacturing the semiconductor storage device in the embodiment 1 of this invention.

Subsequently, as illustrated in FIG. 14, a hole 50 from the upper surface of the stacked film formed in FIG. 13 to the upper surface of 6a of the amorphous silicon pillar is formed.

At this time, the area of the upper surface part of the amorphous silicon layer 6a may be set to, almost same area of the lower surface part of the hole 50. However, the area of the upper surface part of the amorphous silicon layer 6a may be set larger by setting the width of the space of the amorphous silicon layer 6a smaller (or each width of the amorphous silicon layer 6a in the word line direction and the bit line direction may be set larger than each width of the hole 50 in the word line direction and the bit line direction). Thereby, even if positions of the lower surface of the hole 50 and the upper surface of the amorphous silicon layer 6a is misaligned, a margin to the misalignment can be ensured because the upper surface of the amorphous silicon layer 6a is larger. Variation of contact area to the channel polysilicon layer embedded in to the hole 50 can be reduced, and reduction in the current path between the channel polysilicon layer and the upper surface of the amorphous silicon layer 6a can be suppressed.

Although omitted in FIG. 14, as illustrated in FIG. 5 and FIG. 12, the insulator films 31, 32 are embedded around the circumference of the amorphous silicon layers 4a, 5a, 6a. When positions of the lower surface of the hole 50 and the upper surface of the amorphous silicon layer 6a are misaligned, not only the amorphous silicon layer but also the insulator film layers 31, 32 may be etched at the time of etching to form the hole 50. In such a case, it is better to use materials having different etching selectivity ratios between the insulator film layer 11 and the insulator film layers 31, 32. Thereby, at the time of forming the hole 50, mistaken etching of the insulator film layers 31, 32 from an adjacent area of the interface of the amorphous silicon layer 6a is reduced. Therefore, penetration of other materials into space generated by the etching is prevented, and thereby reliability of the memory operation can be enhanced. For example, the above-described effect can be obtained by using SiN for the insulator film layer 11 and $SiO_2$ for insulator film layers 31, 32 as examples of the materials having different etching selectivity ratios.

Figure 15:
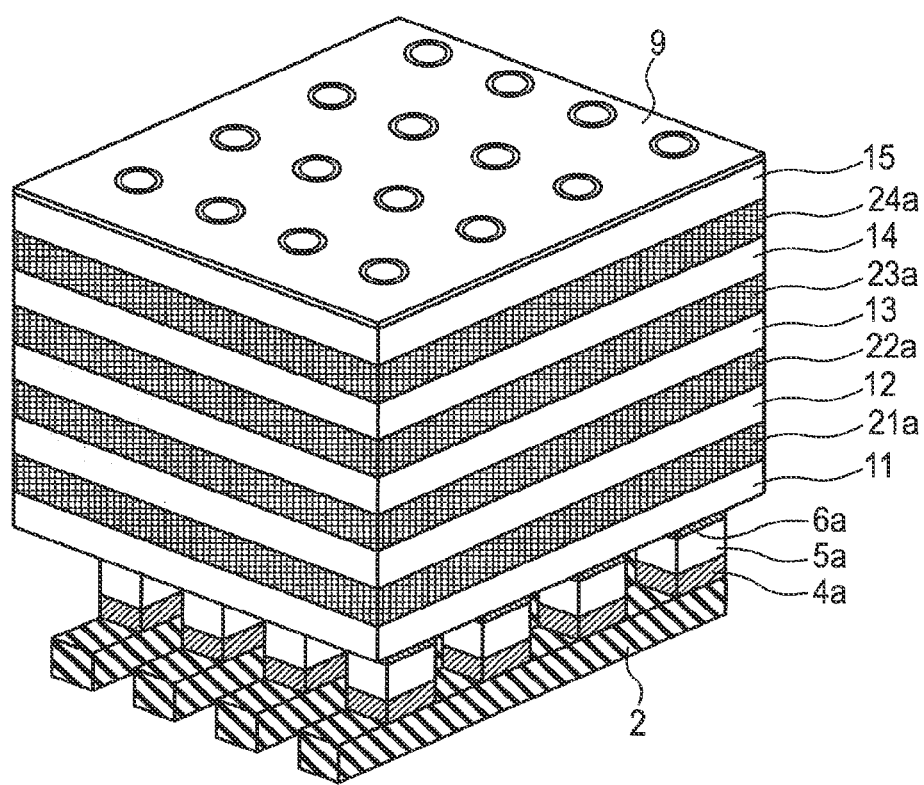
FIG. 15 is a partial three dimensional schematic view illustrating one example of the method for manufacturing the semiconductor storage device in the embodiment 1 of this invention.
Figure 16:
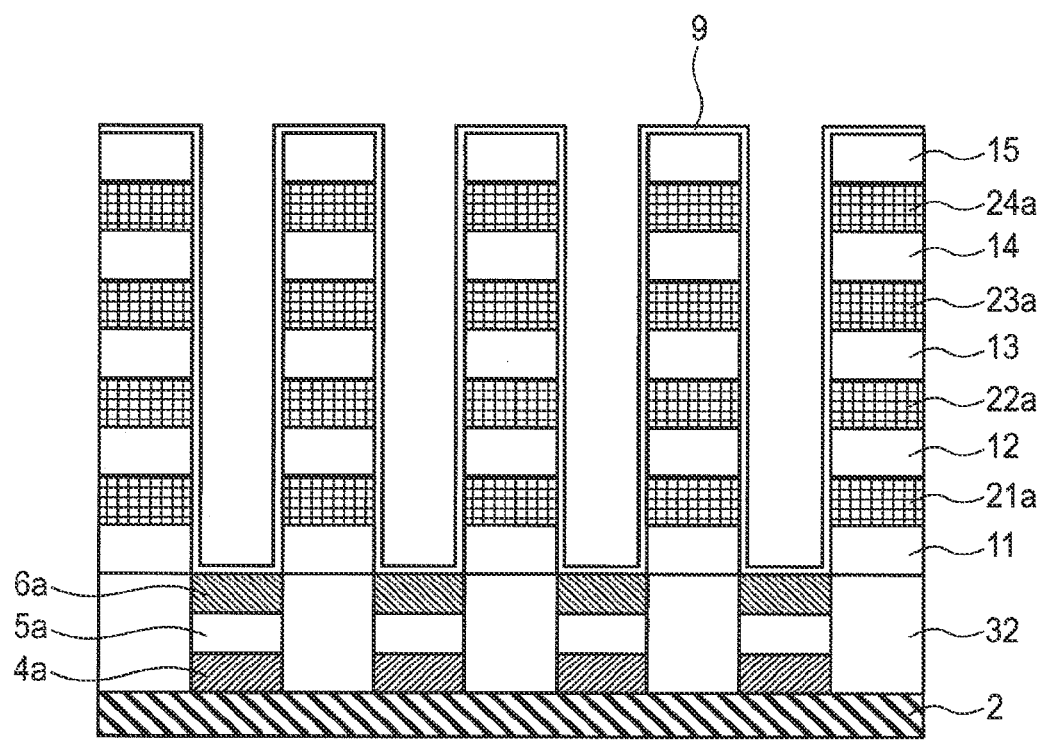
FIG. 16 is a partial cross-sectional view illustrating one example of the method for manufacturing the semiconductor storage device in the embodiment 1 of this invention.
Figure 17:
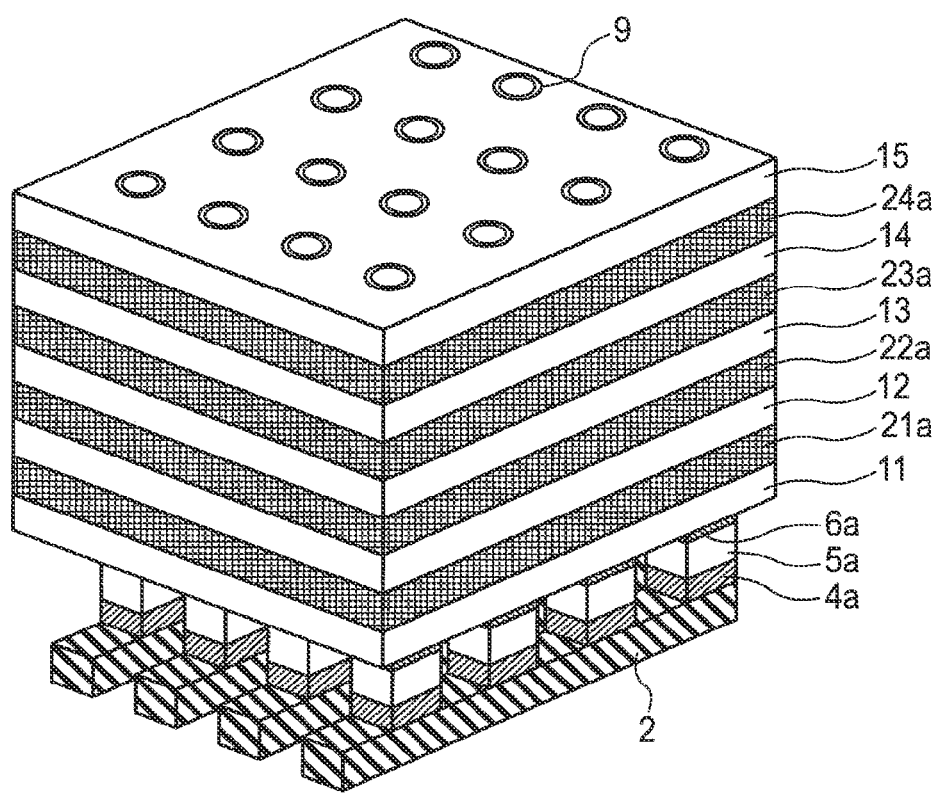
FIG. 17 is a partial three dimensional schematic view illustrating one example of the method for manufacturing the semiconductor storage device in the embodiment 1 of this invention.
Figure 18:
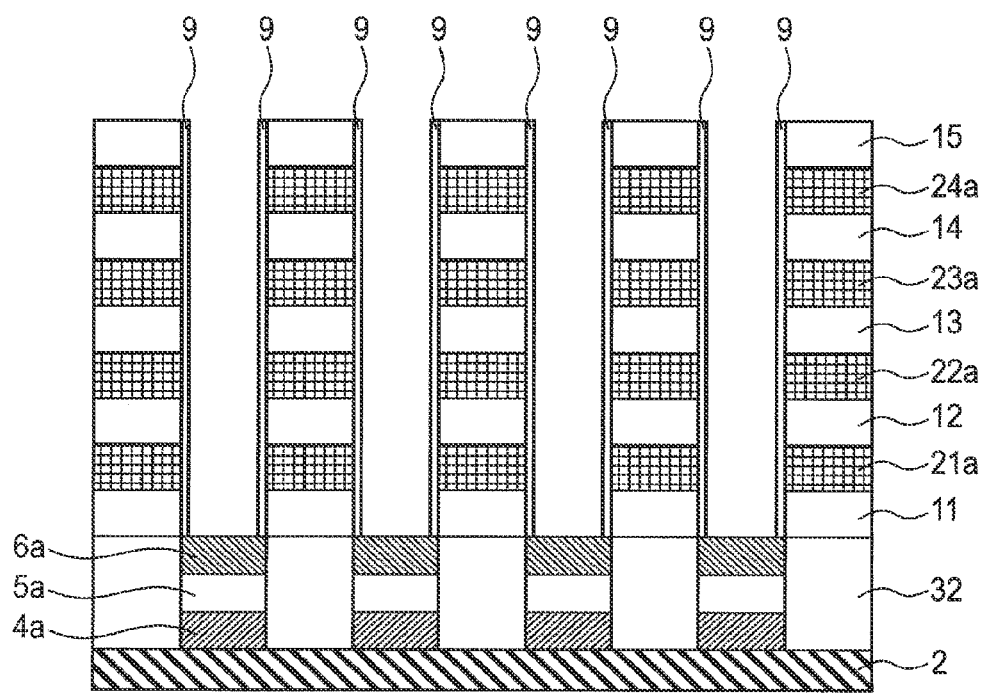
FIG. 18 is a partial cross-sectional view illustrating one example of the method for manufacturing the semiconductor storage device in the embodiment 1 of this invention.

Subsequently, as illustrated in FIG. 15, the insulator film 9 is formed so as not to completely plug the hole 50. The gate insulator film 9 turns into a gate insulator film. FIG. 16 is a cross-sectional view taken by a plane perpendicular to the semiconductor substrate along the word line 2 in FIG. 15. Subsequently, as illustrated in FIG. 17, the insulator film 9 above the insulator film 15 and a bottom part of the hole 50, that is, the insulator film 9 of the upper surface of the amorphous silicon 6a are removed by etch back. FIG. 18 is a cross-sectional view along the word lines 2 of the FIG. 17.

Figure 19:
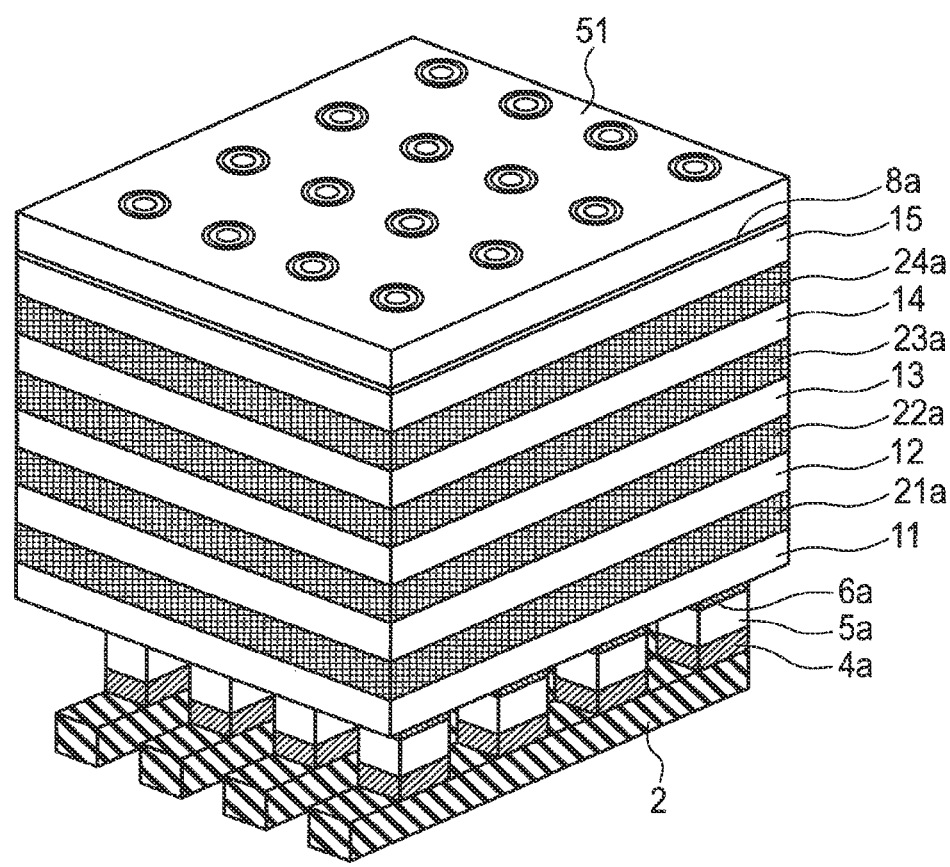
FIG. 19 is a partial three dimensional schematic view illustrating one example of methods for manufacturing the semiconductor storage device in the embodiment 1 of this invention.
Figure 20:
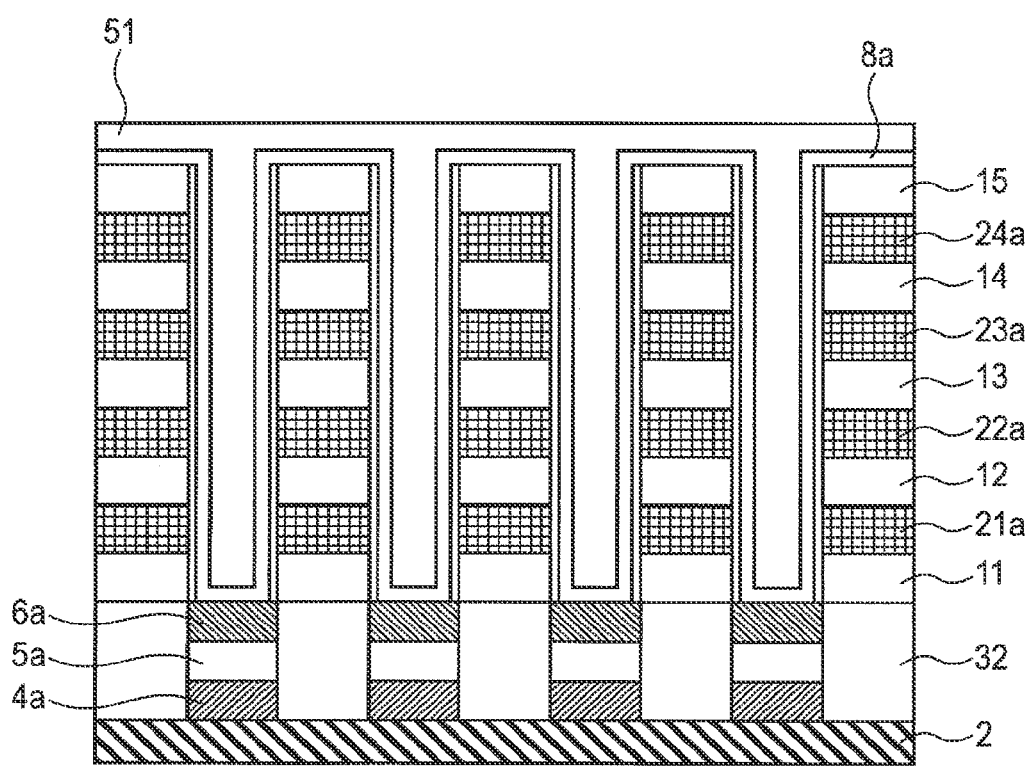
FIG. 20 is a partial cross-sectional view illustrating one example of the method for manufacturing the semiconductor storage device in the embodiment 1 of this invention.

Subsequently, an amorphous silicon layer 8a turning into the channel polysilicon layer 8p and an insulator film 51 are formed. As illustrated in FIG. 19, the amorphous silicon layer 8a is formed so as not to completely plug the hole 50, and the insulator film 51 is formed so as to completely plug the hole 50. FIG. 20 is a cross-sectional view taken by a plane perpendicular to the semiconductor substrate along the word line 2 in FIG. 19.

Figure 21:
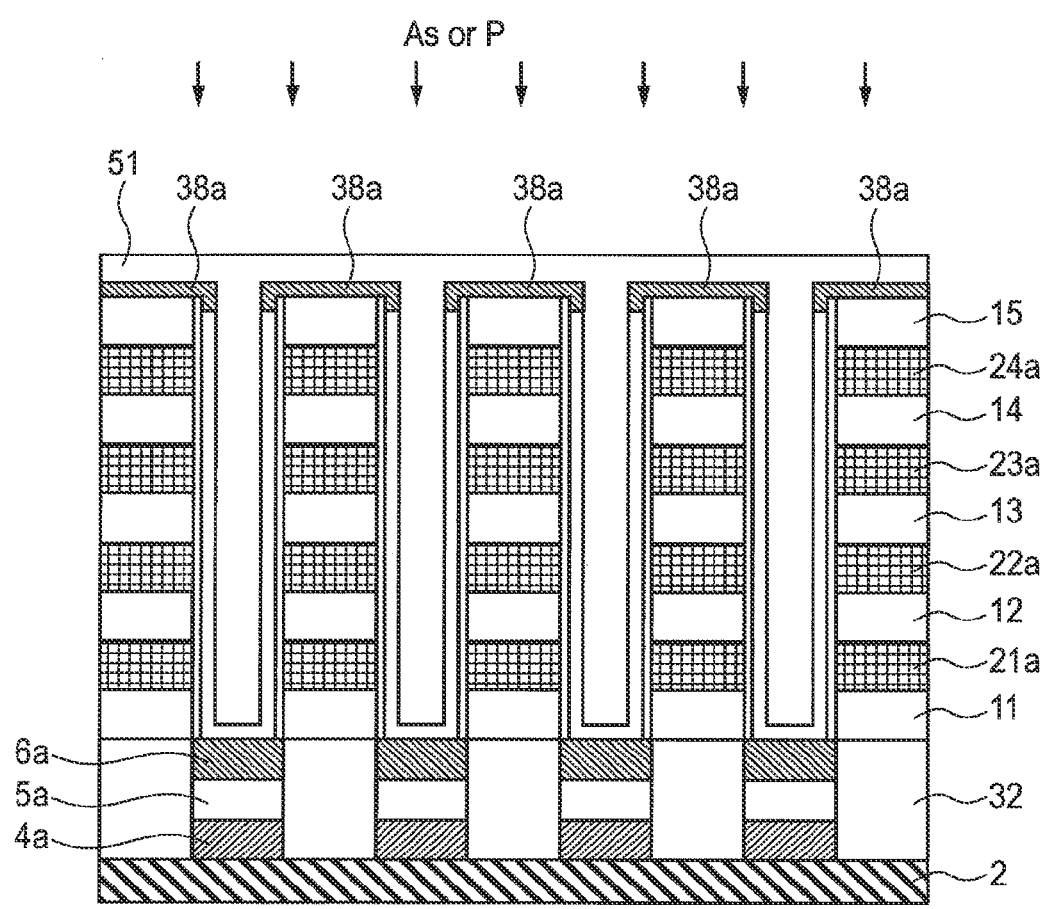
FIG. 21 is a partial cross-sectional view illustrating one example of the method for manufacturing the semiconductor storage device in the embodiment 1 of this invention.

Subsequently, as illustrated in FIG. 21, arsenic (As) or phosphorus (P) being an n-type impurity is implanted by ion implantation to dope into the amorphous silicon layer 8a on the upper surface. In the amorphous silicon layer 8a, an ion-doped part is defined as an amorphous silicon layer 38a. At this time, a doping depth of As or P is made to reach to not only the upper surface of the insulator film layer 15 but also a part of the side surface. The purpose of this process is to prevent increase in contact resistance to the bit line 3 described below. However, the doping is not performed down to the amorphous silicon layer 8a formed on the side surface part of the amorphous silicon layer 24a so as not to interfere with the gate operation of the amorphous silicon layer 24a.

Figure 22:
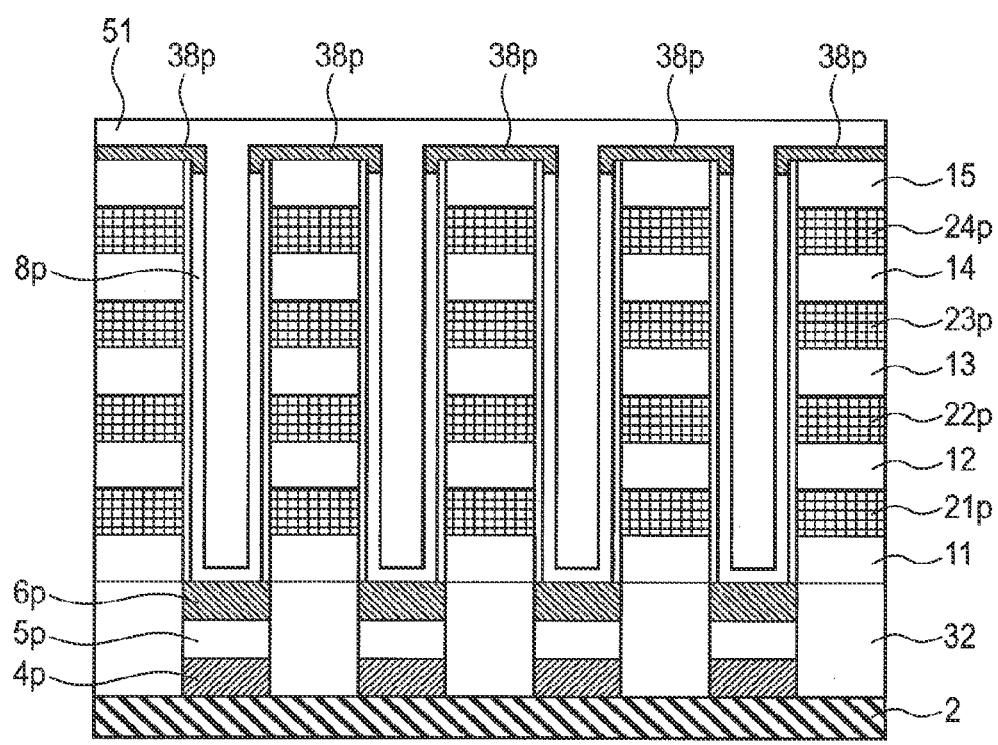
FIG. 22 is a partial cross-sectional view illustrating one example of the method for manufacturing the semiconductor storage device in the embodiment 1 of this invention.

Subsequently, crystallization of amorphous silicon layers 4a, 5a, 6a, 8a, 38a, 21a, 22a, 23a, 24a and activation of impurities included in the amorphous silicon layers are performed by annealing. As illustrated in FIG. 22, the amorphous silicon layers 4a, 5a, 6a, 8a, 38a, 21a, 22a, 23a, 24a turn into polysilicon layers 4p, 5p, 6p, 8p, 38p, 21p, 22p, 23p, 24p, respectively.

Figure 23:
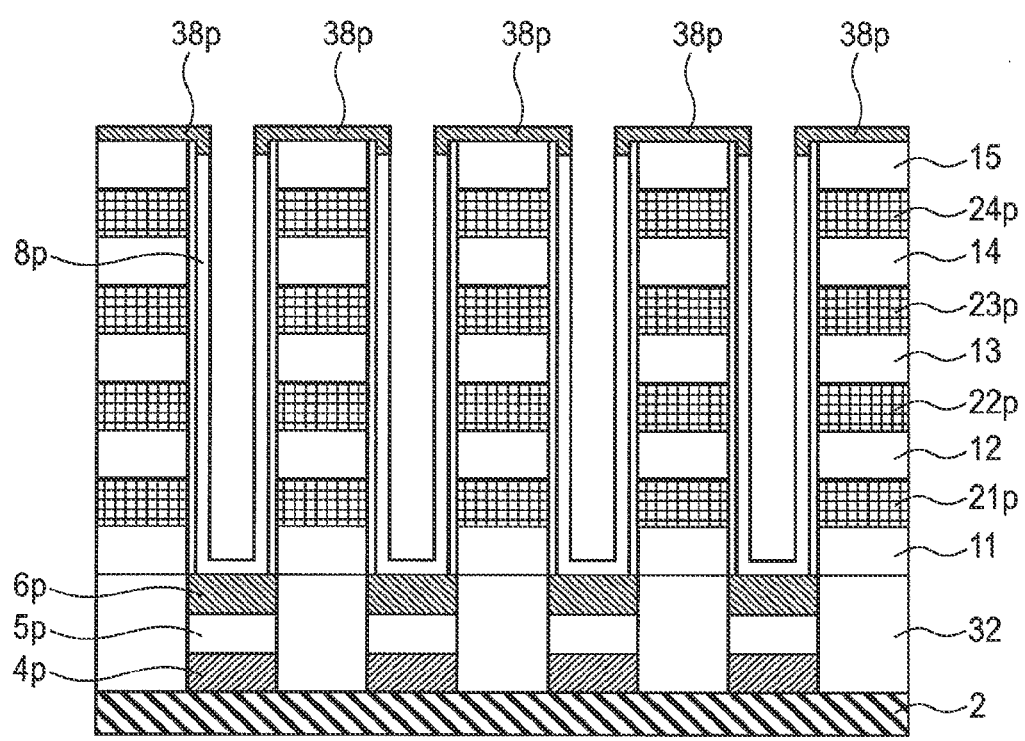
FIG. 23 is a partial cross-sectional view illustrating one example of the method for manufacturing the semiconductor storage device in the embodiment 1 of this invention.
Figure 24:
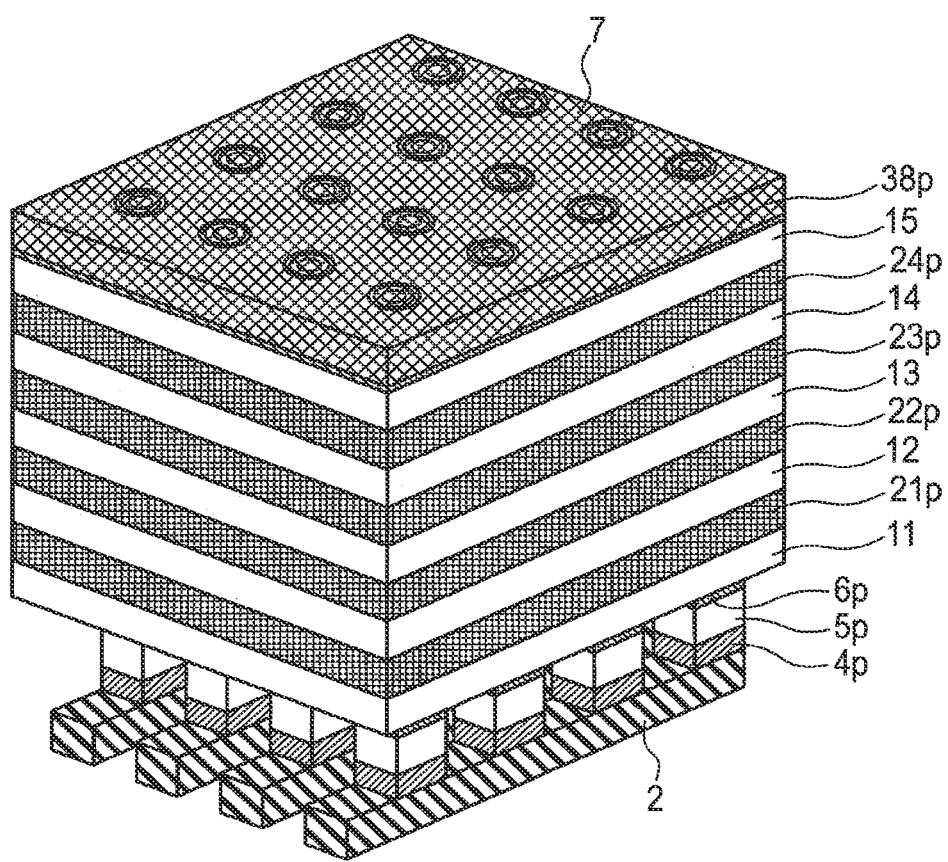
FIG. 24 is a partial three dimensional schematic view illustrating one example of the method for manufacturing the semiconductor storage device in the embodiment 1 of this invention.

Subsequently, as illustrated in FIG. 23, the insulator film 51 is removed to expose the polysilicon layer 8p, 38p. Subsequently, as illustrated in FIG. 24, a film of the phase change material 7 is formed so that the hole 50 is completely plugged.

Here, constitution having the insulating material contacted to the phase change material 7 at the center of the hole, formed in such a manner that the hole 50 is completely plugged by stopping the film formation of the phase change material 7 before the hole 50 is completely plugged with the phase change material 7 and further forming a film of the insulating material, is also possible. When the gate turns OFF at the time of the memory operation and current is flown through the phase change material 7, an insulating material is formed inside of the phase change material 7 and thereby the current is not flown through a part in which the insulating material is formed. Therefore, a region where resistivity variation occurs can be reduced by partially limiting paths of current flown through the phase change material 7. This generates an effect in which the memory operation can be performed by less current.

Figure 25:
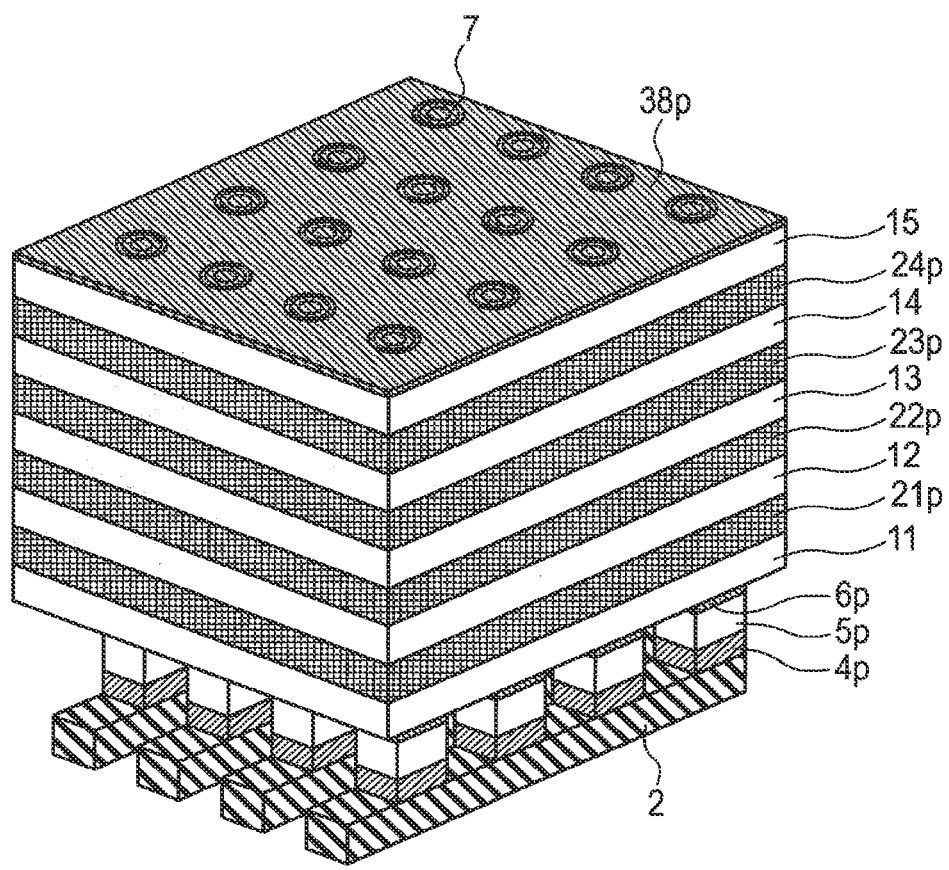
FIG. 25 is a partial three dimensional schematic view illustrating one example of the method for manufacturing the semiconductor storage device in the embodiment 1 of this invention.
Figure 26:
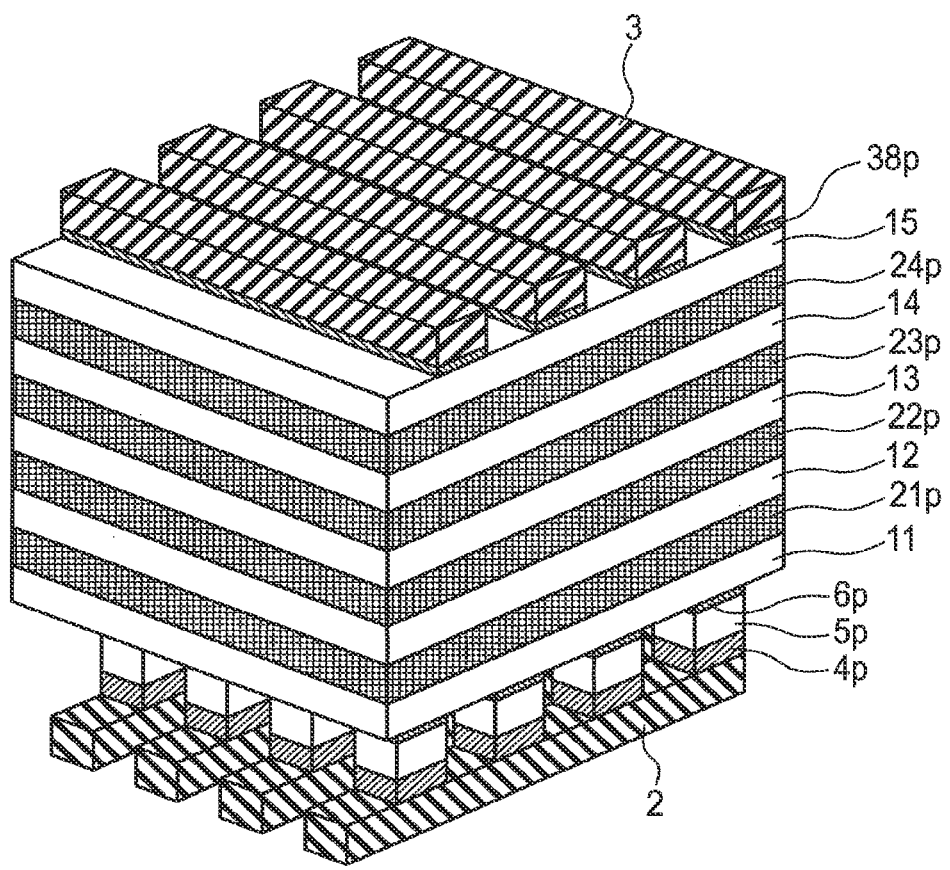
FIG. 26 is a partial three dimensional schematic view illustrating one example of the method for manufacturing the semiconductor storage device in the embodiment 1 of this invention.
Figure 27:
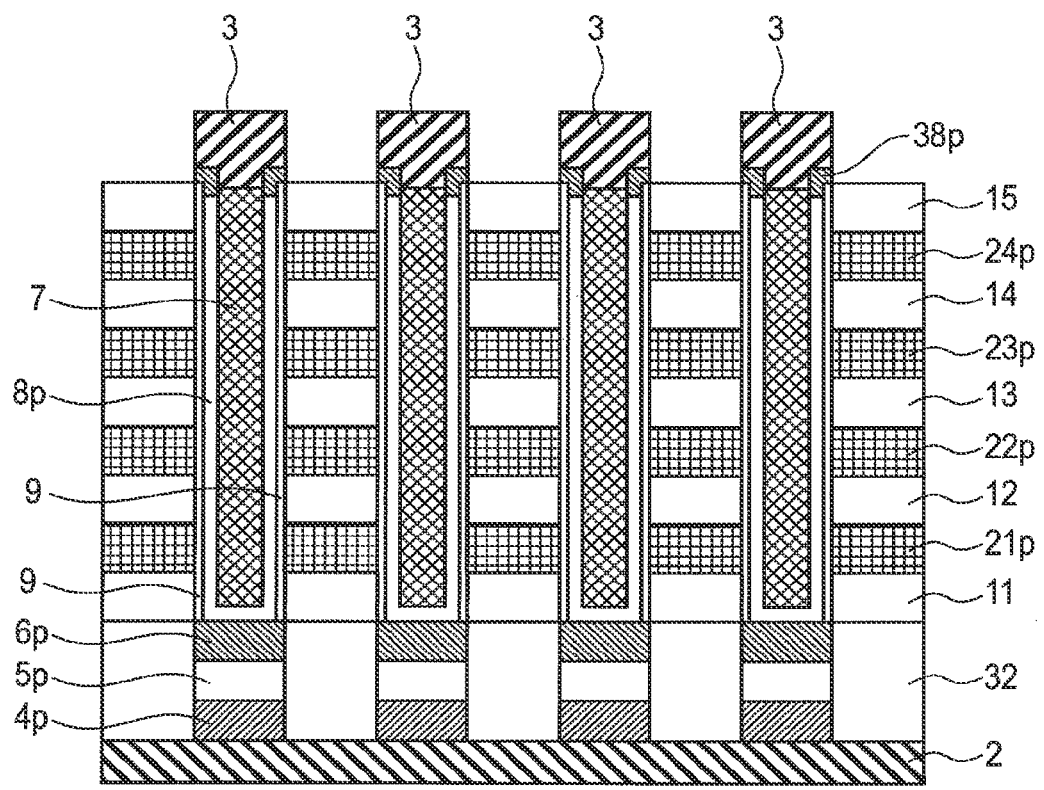
FIG. 27 is a partial cross-sectional view illustrating one example of the method for manufacturing the semiconductor storage device in the embodiment 1 of this invention.
Figure 28:
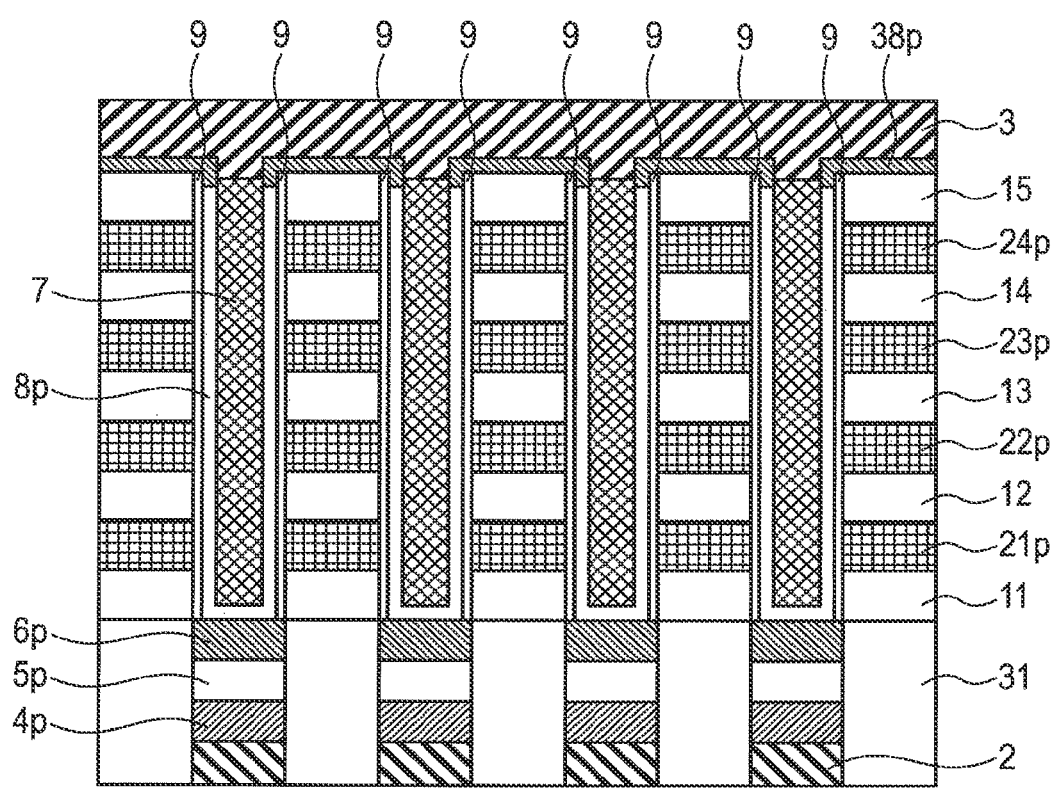
FIG. 28 is a partial cross-sectional view illustrating one example of the method for manufacturing the semiconductor storage device in the embodiment 1 of this invention.

Subsequently, as illustrated in FIG. 25, the phase change material 7 in the upper surface is removed by etch back. At this time, an altitude of the top surface of the phase change material 7 is set lower than that of the top surface of the insulator film 15. Thereafter, as illustrated in FIG. 26, BLC in FIG. 2, that is, the contact BLC that connects the bit line 3 and peripheral circuit previously formed above the semiconductor substrate is formed. Subsequently, a film of a material that is patterned to the bit line 3 later is formed. The material patterned to the bit line 3 later and the n-type polysilicon layer 38p are patterned in a stripe shape extending in a direction perpendicular to the word line 2 to expose the top surface of the insulator film layer 15, and thereby the bit line 3 is constituted as illustrated in FIG. 3. FIG. 27 is a cross-sectional view along the word line 2 illustrated in FIG. 26. A part of the bit line 3 illustrated in FIG. 27 is embedded into the hole 50, because the altitude of the top surface of the phase change material 7 is set lower than that of the top surface of the insulator film 15. FIG. 28 is a cross-sectional view along the bit line 3 illustrated in FIG. 26.

Figure 29:
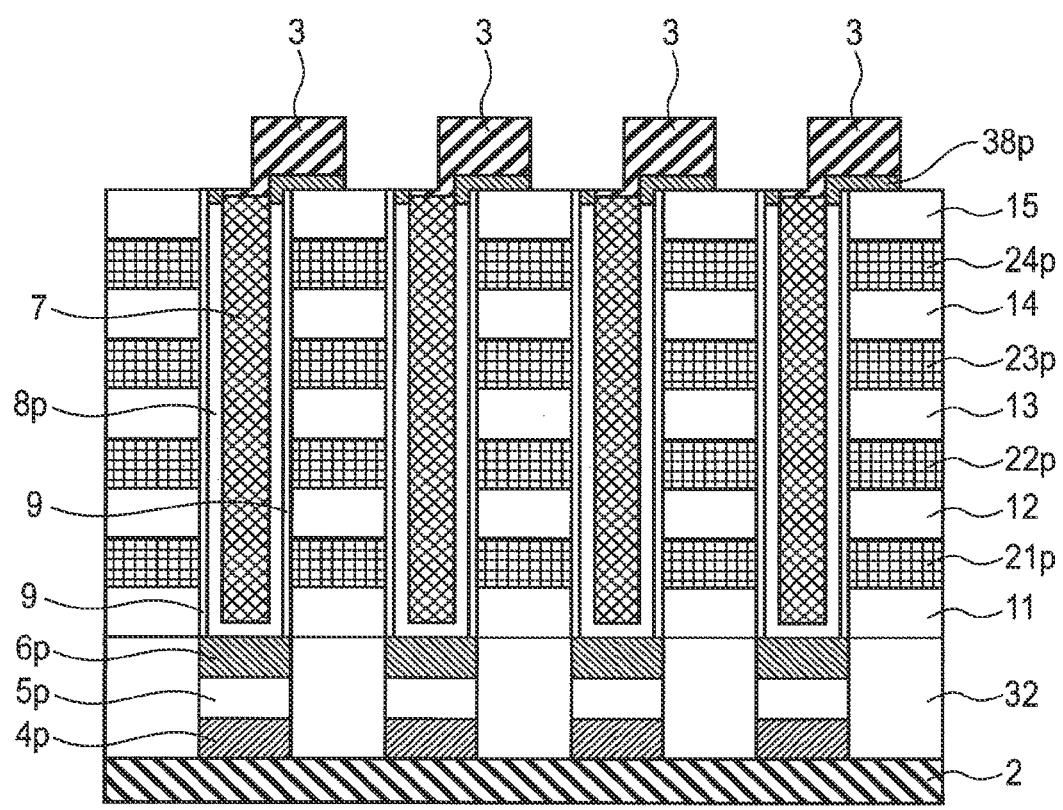
FIG. 29 is a partial cross-sectional view illustrating one example of the method for manufacturing the semiconductor storage device in the embodiment 1 of this invention.

As illustrated in FIG. 29, even if alignment of the bit line 3 and the hole 50 is misaligned and the upper part of the hole 50 is etched, etching of the inside of the hole 50 can be prevented by stopping the patterning of the bit line 3 and the n-type polysilicon layer 38p at the time of exposition of the insulator film layer 15.

As described in the description of FIG. 25, the constitution in which a height of the top surface of the phase change material 7 is set higher than that of the top surface of the insulator film 15 and set lower than that of the upper surface of the insulator film 15, and a part of the material of the bit line 3 is formed so as to be in contact with the upper surface of the phase change material 7 can be formed. By this constitution, the area with which the bit line 3 contacting to the upper surface of the phase change material 7 is in contact is not changed, even if misalignment of the stacked layer between the bit line 3 and the phase change material 7 is generated. Therefore, this process has an effect in which increase in resistivity caused by reduction in the contact area can be suppressed. Thereafter, the gate polysilicon layers at the end of the memory array are patterned so as to form contacts for each layer as illustrated in FIG. 2 and the whole part is embedded with the interpoly dielectric film. The contacts GC1, GC2, GC3, GC4 reaching to the gate polysilicon layers 21p, 22p, 23p, 24p, the gate signal lines GL1, GL2, GL3, GL4, and contacts GLC1, GLC2, GLC3, GLC4 connecting the gate signal lines and the peripheral circuit are formed.

In the views, the example in which the four-layer stacked gate polysilicon is illustrated. However, the number of the stacked layers is not limited to four, and any number of the stacked layers can be determined.

Figure 30:
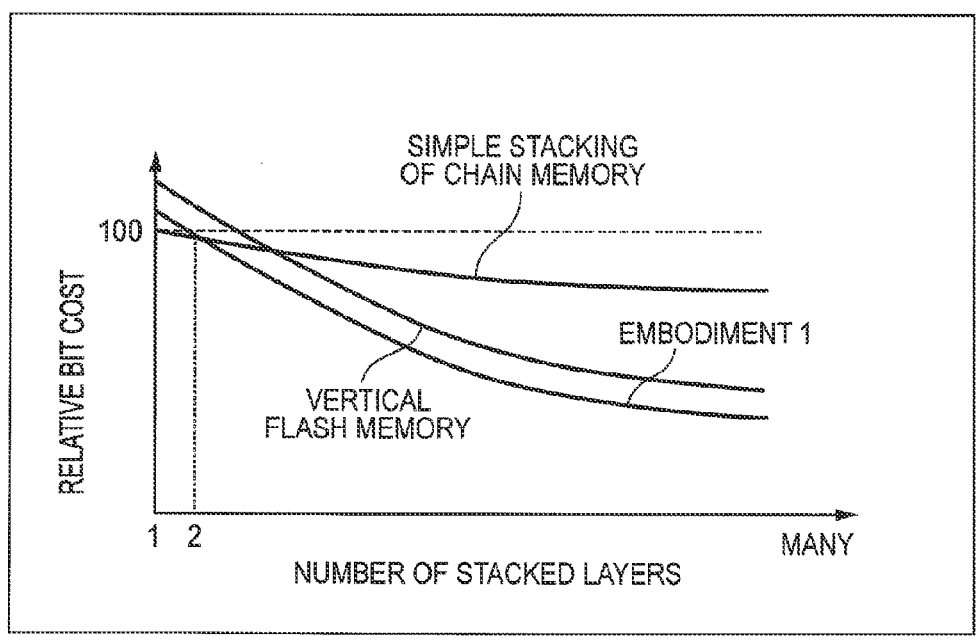
FIG. 30 is a view illustrating an effect of the embodiment 1 of this invention.

The effect of the embodiment 1 is illustrated in FIG. 30. Patterning processes per unit memory cell can be reduced and the number of the steps can be reduced because the gate insulator films and the phase change material layers can be formed at the same time even when the number of the stacked layers is increased. As a result, the bit cost by stacking can be effectively reduced.

By using, for the memory cell, the variable resistance material that varies the resistivity by current, the bit cost of this memory can be reduced compared with a bit cost of a flash memory when the number of the stacked layers is the same. This is because reduction of this memory cell size is easy, because a low voltage operation is possible.

In addition, the bit cost can be reduced by increasing the degree of integration because the diode PD is used as a selection element to select the vertical type chain.

Embodiment 2

In the embodiment 2, an example of the semiconductor storage device in which gate polysilicon layers 21p, 22p, 23p, 24p, 61p, and the insulator film layer 11 formed between the polysilicon diode PD and the gate polysilicon, the insulator film layers 12, 13, 14, 15 between the gate polysilicon layers, and an insulator film 7 between the gate polysilicon and the bit line 3, which are components of the memory array of the vertical type chain memory, are patterned in a stripe shape in parallel to the word line 2 is illustrated.

Figure 31:
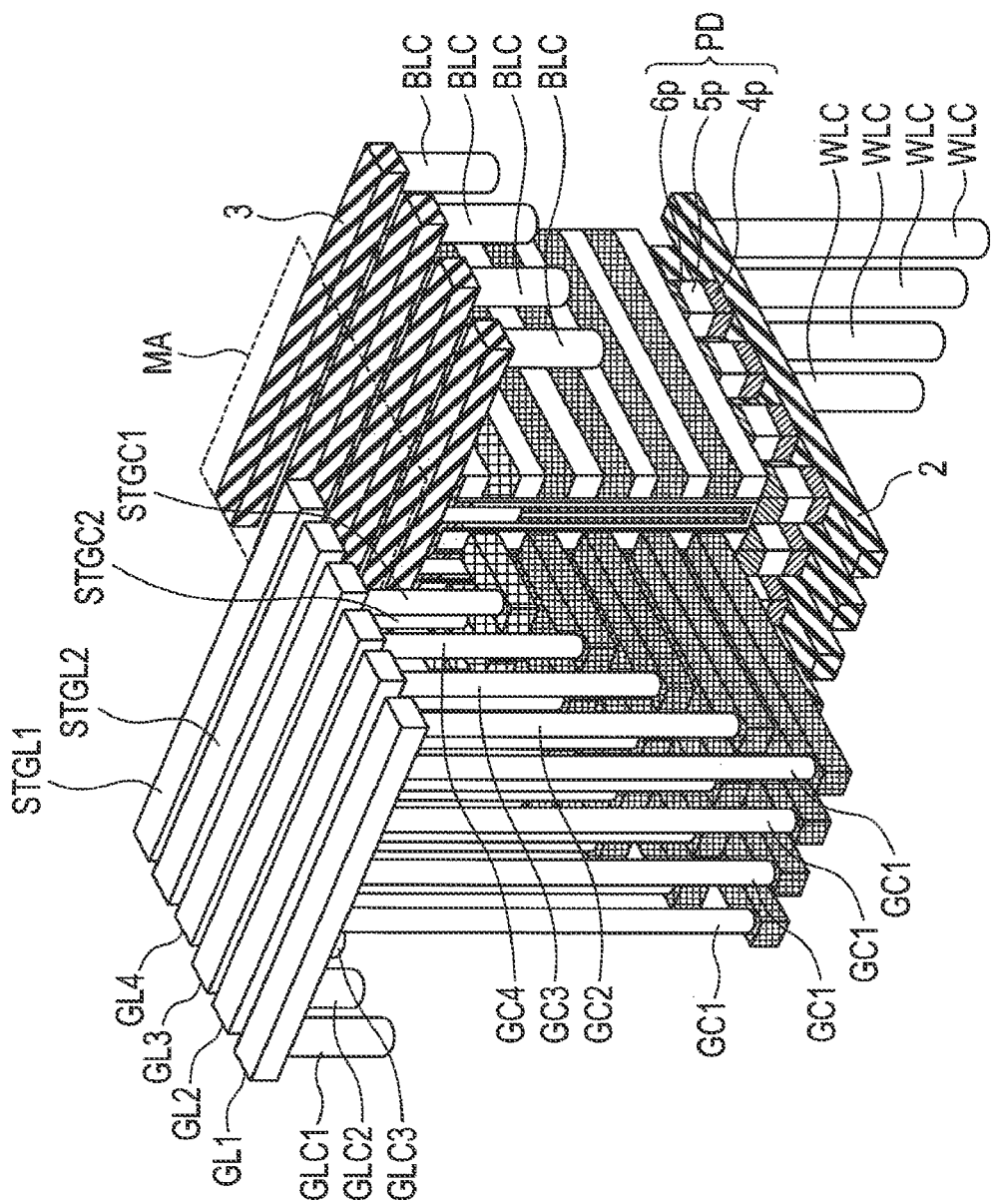
FIG. 31 is a partial three dimensional schematic view of a semiconductor storage device in an embodiment 2 of this invention.

FIG. 31 is a partial three dimensional schematic view of the semiconductor storage device in the embodiment 2. The view illustrates a part of the memory cell array, wires and contacts. The part constituted by the word line 2 made of a metal wire; the contact hole WLC connecting the word line 2 and the line selector illustrated in FIG. 1; the polysilicon diode PD made of a polysilicon layer 4p in which a p-type impurity is doped, a polysilicon layer 5p in which a low concentration impurity is doped and a polysilicon layer 6p in which an n-type impurity is doped; the gate polysilicon layers 21p, 22p, 23p, 24p of a memory cell, the gate polysilicon layer 61p of a select transistor; the metal wires GL1, GL2, GL3, GL4 for supplying electricity to the gate polysilicon layers of the memory cells; metal wires STGL1, STGL2 for supplying electricity to the gate polysilicon layer 61p of the select transistor; the contacts GC1, GC2, GC3, GC4 for connecting the gate polysilicon layers 21p, 22p, 23p, 24p and the metal wires GL1, GL2, GL3, GL4, respectively; contacts STGC1, STGC2 for connecting the gate polysilicon layer 61p of the select transistor and the wires STGL1, STGL2; contacts GLC1, GLC2, GLC3, GLC4 for connecting the metal wires GL, GL2, GL3, GL4 and the line selector, respectively; STGLC1 and STGLC2 for connecting the wires STGL1, STGL2 and the line selector; the bit line 3 made of a metal wire; the contact hole BLC for connecting the bit line 3 and the line selector illustrated in FIG. 1; the insulator film layer 11 between the polysilicon diode PD and the gate polysilicon layer 21; the insulator film layers 12, 13, 14, 15 between the gate polysilicon layers; and an insulator film 71 between the gate polysilicon layer 61p and the bit line 3 is illustrated in FIG. 31. Although a part of the constituents, that is, GLC4, STGLC1 and STGLC2 are not illustrated because GLC4, STGLC1 and STGLC2 are hidden by the wires GL1, GL2 and the like, GLC4, STGLC1 and STGLC2 are connected to the lower part of GL4, STGL1 and STGL2, respectively, similar to GLC1, GLC2, GLC3 being connected to the lower part of GL1, GL2 and GL3, respectively.

In the gate polysilicon layer 21p in the memory cell, all adjacent stripe patterns are connected to the same wire GL1. The gate polysilicon layers 22p, 23p, 24p have similar structures. The gate polysilicon layer 61p of the select transistor is connected to the two wires STGL1 and STGL2 which are insulated each other in every one stripe, and voltage can be independently biased.

Figure 32:
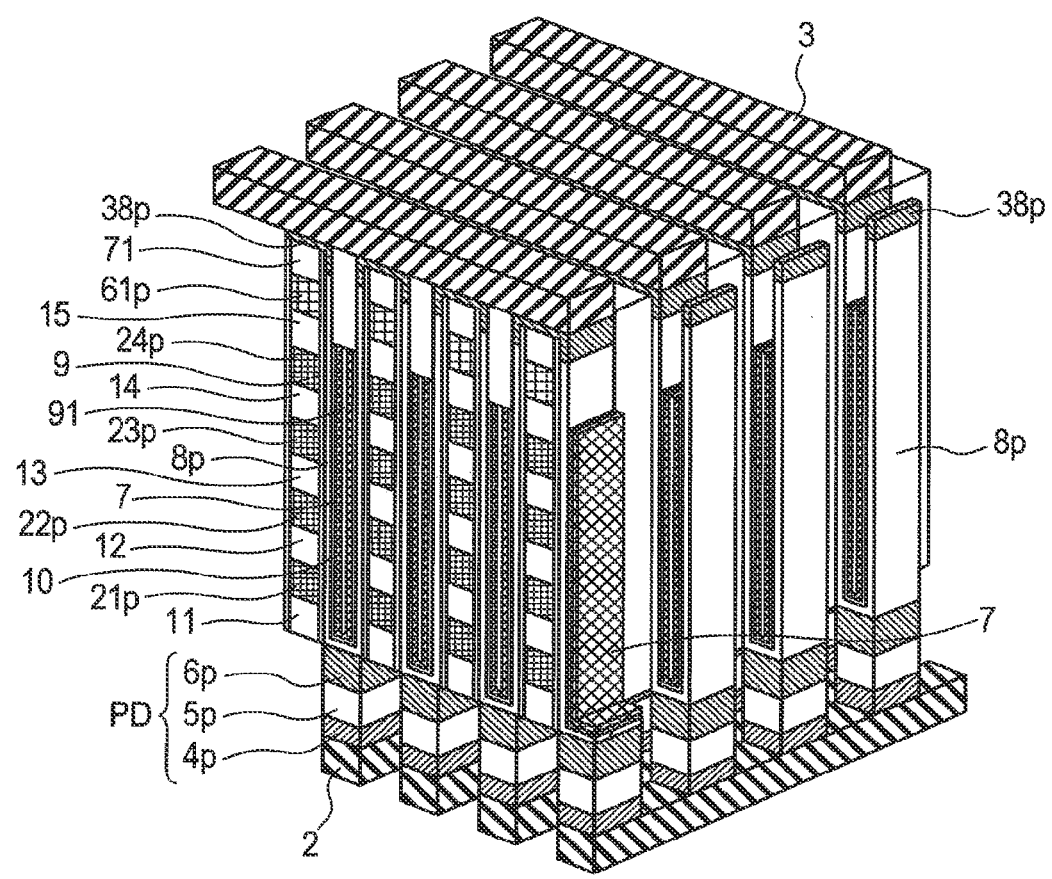
FIG. 32 is a three dimensional schematic view of a memory cell array in the embodiment 2 of this invention.

FIG. 32 is a view particularly illustrating a part of the memory array MA extracted from FIG. 31. Above a plurality of word lines 2, polysilicon diodes PD are periodically formed in an extending direction of the word lines 2. A stacked film made of the gate polysilicon layers 21p, 22p, 23p, 24p, 61p and the insulator film layers 11, 12, 13, 14, 15, 71 is patterned in a stripe shape in a direction parallel to the word line 2. The line parts of the stripes of the stacked film made of the gate polysilicon layers 21p, 22p, 23p, 24p, 61p and the insulator film layers 11, 12, 13, 14, 15, 71 are arranged just above the spaces between the word lines, and the space parts of the stripes of the insulator film layers of the gate polysilicon layers 21p, 22p, 23p, 24p, 61p and the insulator film layers 11, 12, 13, 14, 15, 71 are arranged just above the word lines. The bit lines 3 are the stripe shape extending in the direction perpendicular to the word lines 2, and are arranged above the insulator film 71 through the n-type polysilicon 38p.

In the lower part of the bit lines 3 in the space parts of the stacked film made of the gate polysilicon layers 21p, 22p, 23p, 24p, 61p and the insulator film layers 11, 12, 13, 14, 15, 71, the gate insulator film 9, the channel polysilicon layer 8p, an insulator film layer 10, and the phase change material layer 7 are stacked in this order in the lower part of the sidewalls of the gate polysilicon layers 21p, 22p, 23p, 24p, the sidewalls of the insulator film layers 11, 12, 13, 14 and the sidewall of the insulator film 15. The insulator film layer 10 is a layer to prevent diffusion between the phase change material layer 7 and the channel polysilicon layer 8p. An insulator film layer 91 is embedded between the both side surfaces of the phase change material layers 7. The gate insulator film layer 9 and the channel polysilicon layer 8p are stacked at the upper part of the sidewall of the insulator film layer 15 and the lower parts of the gate polysilicon layer 61p and the insulator film layer 71. An insulator film layer 92 is embedded between the both side surfaces of the channel polysilicon layers 8p, and the gate insulator film layer 9 and the channel polysilicon layer 38p are stacked at the upper part of the insulator film layer 71. The insulator film layer 92 is embedded between the both side surfaces of the channel polysilicon layers 8p. At the bottom part of the lower part of the bit line 3 in the space of the stacked film made of the gate polysilicon layers 21p, 22p, 23p, 24p, 61p and the insulator film layers 11, 12, 13, 14, 15, 71, the upper surface of the polysilicon layer 6p and the channel polysilicon layer 8p are contacted. The bit line 3 and the polysilicon diode PD communicate each other at the side surfaces of the both sides of the stacked film made of the gate polysilicon layers 21p, 22p, 23p, 24p, 61p and the insulator film layers 11, 12, 13, 14, 15, 71 through the polysilicon layer 38p, the channel polysilicon layer 8p and the polysilicon diode PD.

In the space part of the stacked film made of the gate polysilicon layers 21p, 22p, 23p, 24p, 61p and the insulator film layers 11, 12, 13, 14, 15, 71 and the lower part of the space part of the bit lines 3, the channel polysilicon layers 8p, 38p, the phase change material layer 7 and the insulator film layer 10 are removed to form a space part for the polysilicon diode PD above the word line 2. In this space part, an insulator film 33 is embedded. More specifically, the channel polysilicon layer 8p, 38p, the phase change material layer 7, and the insulating layer 10 are formed in a region surrounded by the stacked film made of the gate polysilicon layers 21p, 22p, 23p, 24p, 61p and the insulator film layers 11, 12, 13, 14, 15, 71 and the insulating layer 33 (hereinafter referred to as a "connection hole" in the specification).

Figure 33:
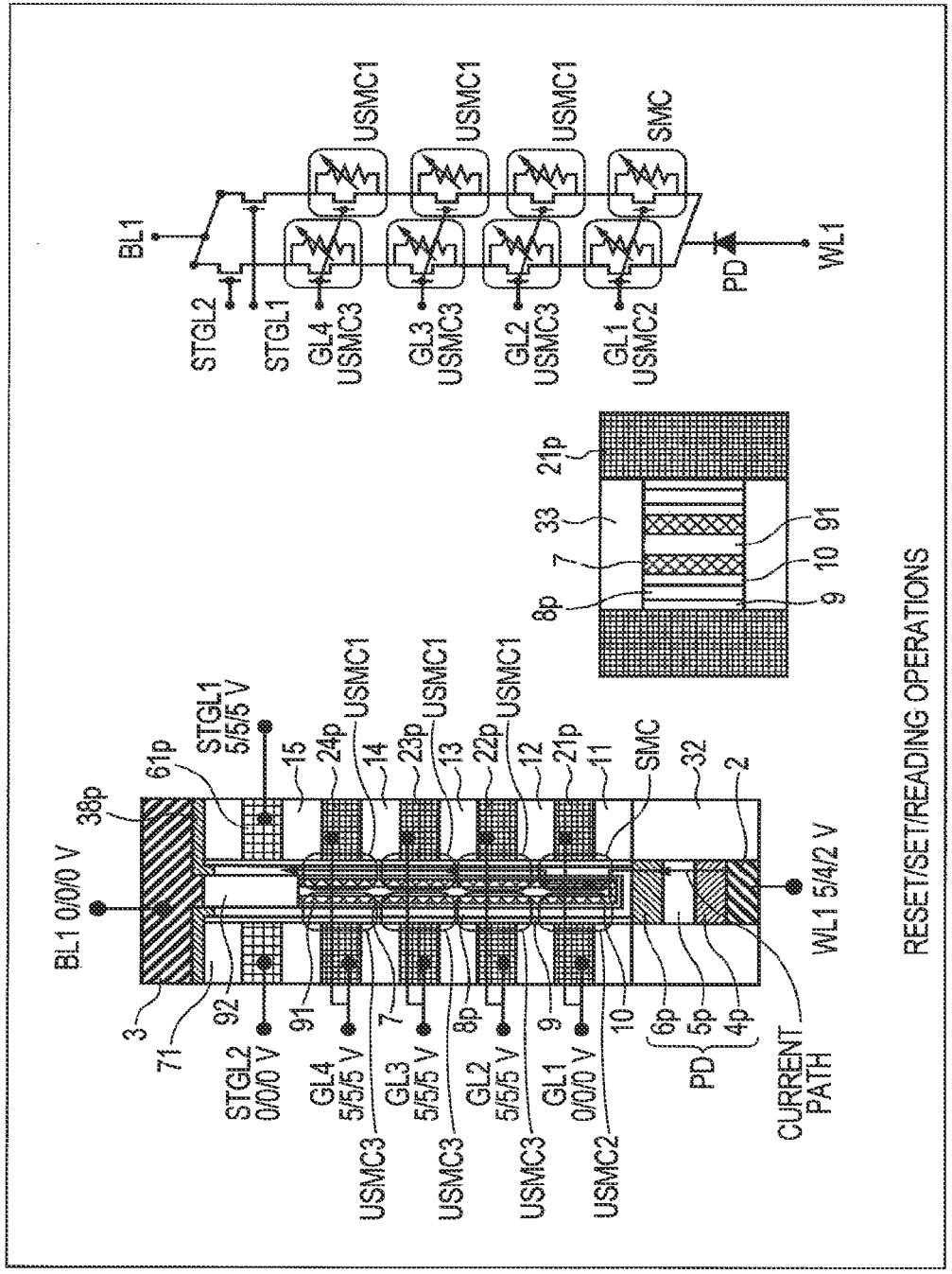
FIG. 33 is a view illustrating the reset operation, the set operation and the read operation of the memory cell array in the embodiment 2 of this invention.

In FIG. 33, a part extracted from the memory cell array MA in the embodiment 2 is illustrated. The extracted view is illustrated with a top view of one gate polysilicon layer 21p and an equivalent circuit diagram. Although the insulator film layer 32 is omitted in FIG. 31 and FIG. 32 because of understandability, the insulator film 32 is an insulator film embedded in the space between PDs. An operation of the memory cell is performed as follows. Zero volts are biased to a gate line GL1 connected to the selected cell SMC, and a transistor determining the channel polysilicon layer 8p as a channel is set to the OFF state. Five volt is biased to a gate lines GL2, GL3, GL4 not connected to the selected cell SMC, and a transistor is set to the ON state. Zero volts are biased to a bit line BL1, and 5, 4 and 2 V are biased to a word line WL1 at the time of the reset operation, the set operation and the read operation, respectively. In the gate polysilicon of the select transistor, 5 V is biased to a gate in which SMC is connected, that is, STGL1, and the transistor is set to the ON state. Zero volts are biased to the gate in which SMC is not connected, that is, STGL2, and the transistor is set to the OFF state.

In the unselected cell USMC1, in which the transistor is in the ON state, the channel has low resistance. The channel polysilicon layer 8p of STGL1, which is in the ON state, also has low resistance. Almost same current can be flown not depending on the state of the phase change material layer 7 in the USMC1 part. In SMC, current flows through the phase change material layer 7 because the transistor is in the OFF state. At the time of the reset operation and the set operation, the operations are performed by changing the resistivity of the phase change material 7 because of current flown through the phase change material layer 7 using SMC. At the time of the read operation, the operation is performed by determining a current value flown through the phase change material layer 7 using SMC. The transistor of USMC2 is in the OFF state and the transistor in USMC3 is in the ON state, because the transistors of the unselected cell USMC2 and unselected cell USMC3 have common gate voltage with the transistors of SMC and USMC1, respectively. Current passing through USMC2 and USMC3 is not flown, because the select transistor in which STGL2 is connected to the gate polysilicon layer 61p is in the OFF state. Therefore, only in SMC, current flows through the phase change material layer 7, and selective operation is possible.

Figure 34:
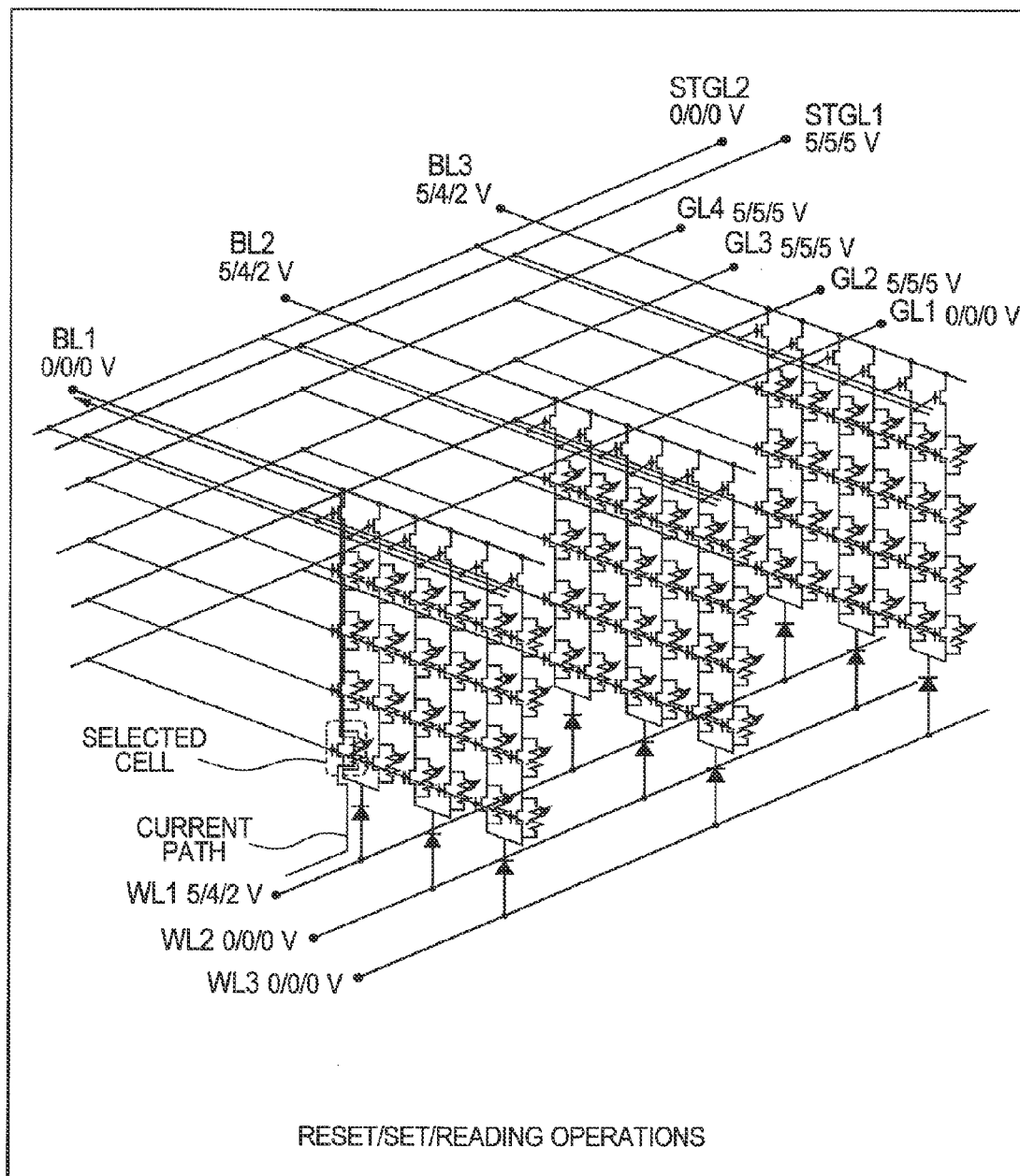
FIG. 34 is a circuit diagram illustrating the reset operation, the set operation and the read operation of the memory cell array in the embodiment 2 of this invention.
Figure 35:
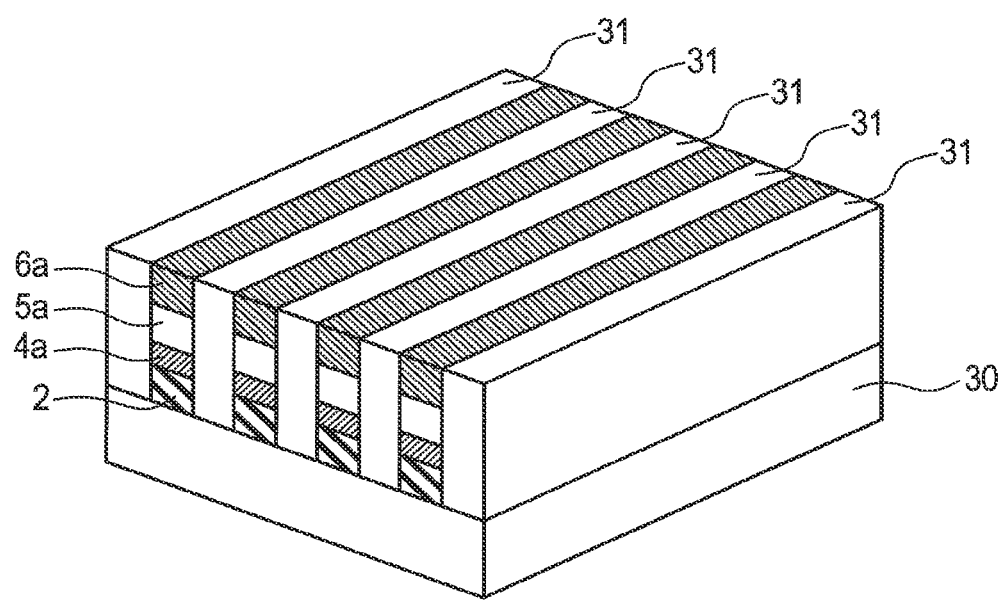
FIG. 35 is a partial three dimensional schematic view illustrating one example of a method for manufacturing the semiconductor storage device in the embodiment 2 of this invention.

The memory cell array in the embodiment 2 is constituted by a plurality of bit lines, word lines, vertical type chain memories and polysilicon diodes PD. In FIG. 34, relations of voltages among the bit lines BL1, BL2, BL3, BL4, the word lines WL1, WL2, WL3, WL4, the gate signal lines GL1, GL2, GL3, GL4, and the gate signal lines STGL1, STGL2 at the time of performing the reset operation, the set operation and the read operation are illustrated.

Similar to FIG. 33, voltages of WL1, that is, 5/4/2 V, are voltages at the time of the reset operation, the set operation and the read operation, respectively. Similarly, notations of voltages of other terminals in FIG. 34 represent voltages at the time of the reset operation, at the time of the set operation and at the time of the read operation in this order. In the vertical type chain memory in which the bit line side is connected to BL2, BL3, or BL4 and the word line side is connected to WL1, both voltages of the bit line and the word line are 5 V at the time of the reset operation, 4 V at the time of the set operation, and 2 V at the time of the read operation. As a result, current does not flow because the bit line and the word line have no voltage difference. In the vertical type chain memory in which the bit line side is connected to BL1 and the word line side is connected to WL2 or WL3, both voltages of the bit line and the word line are 0 V at the time of the reset operation, at the time of the set operation, and at the time of the read operation. As a result, current does not flow because the bit line and the word line have no voltage difference. In the vertical type chain memory in which the bit line side is connected to BL2, BL3 or BL4 and the word line side is connected to WL2 or WL3, 0 V and 5 V are biased to the word line and the bit line respectively at the time of the reset operation; 0 V and 4 V are biased to the word line and the bit line respectively at the time of the set operation; and 0 V and 2 V are biased to the word line and the bit line respectively at the time of the read operation. Voltages are biased in a reverse bias direction of the polysilicon diode PD that selects the vertical type chain memory. Withstand voltage of PD can be formed so as to be higher than 5 V, and thereby, it is possible that current does not flow.

Only the vertical type chain memory in which the bit line side is connected to BL1 and the word line side is connected to WL1 can bias the forward bias to PD to flow current. As a result, SMC in the memory array can be selected and operated because SMC in the vertical type chain can selected and operated by the method described in FIG. 33.

In order to describe a shape of the phase change element viewing from the upper aspect, a cross-sectional view of the vertical type chain memory taken along the horizontal surface is illustrated in FIG. 33.

As one of the characteristics of this structure, the phase change material layer 7 is isolated by the insulating layer 91 formed inside of the connection hole into a first region and a second region which are in contact with the surface of the other channel polysilicon layer 8p facing each other. Further, the constitution in which switches that turn on and off the current flown through the two channel polysilicon layers 8p are arranged above each current path, and each current applied to the right and left phase change material layers is independently controlled is formed. By this constitution, when the channel polysilicon layer 8p formed on one surface turns off by the gate operation, current is flown through the first region of the phase change material layer 7, and current is not flown through the second region which is in contact with the surface of the other channel polysilicon layer 8p facing each other. Therefore, the memory cell in the embodiment 2 has an effect which can store two-bit information and can store double amount of information in one connection hole compared to the memory cell in the embodiment 1 and thereby the bit cost can be reduced. Constitution in which each of right and left gate signal lines GL1, GL2, GL3, and GL4 is independently controlled may be employed. In this case, the bit cost can also be reduced because the right and left current paths formed in one connection hole can be independently controlled. However, more driving circuits are required for independently controlling the right and left gate signal lines. Therefore, it is desirable from the viewpoint of peripheral circuit reduction that the right and left channel polysilicon layers are controlled by the same driving circuit as described in the embodiment 2.

As clear from the circuit diagram, the constitution in which two vertical type chain memories are connected to one diode PD is formed. The diode PD acts as a selection element which selects the connected vertical type chain memory depending on the voltage relationship between the word line 2 and the bit line 3. Therefore, it also can be said that the constitution in which two vertical type chain memories share one diode is formed in this embodiment. By this constitution, the number of bits to one diode PD can be increased. This leads to reduction in the bit cost.

Another characteristic of this structure is in that each layer formed in the connection hole is in contact with insulating layers isolating the connection hole. More specifically, the phase change material layer 7 and other layers are formed on the side surface of the polysilicon layer 24p, and films formed thereafter are formed in a direction in which a gap of two facing surfaces is embedded because the direction in which film thickness is increased by crystal growth is a direction in which the two surface are facing each other. By this constitution, a film is not formed in a direction in which the holes are embedded to the center of the hole from all directions, such as the memory cell described in Patent Literature 1 and the embodiment 1. Therefore, the direction in which the film thickness is increased by the crystal growth is only the direction in which two surfaces are facing each other, and thereby design and patterning of the width is not required with consideration of formed film thickness in a direction orthogonal to the direction in which two surfaces are facing each other. Therefore, the memory cell can be formed, not depending on the film thickness in the perpendicular direction, in the minimum feature size. Consequently, this constitution has an effect which increases cell density per unit area, and thereby the bit cost can be reduced. Considering this characteristic, the phase change region is not required to be isolated into the right side and the left side by the insulating layer 91. If the phase change material layer 7 is formed as one region, the feature size in the word line direction can be maintained in the minimum feature size. As a result, this constitution can obtain the effect to increase the cell density compared to the embodiment 1.

Hereinafter, one example of a method for manufacturing the semiconductor storage device in the embodiment 2 is described by using FIG. 35 to FIG. 52. In the process similar to FIG. 7 to FIG. 9, the interpoly dielectric film 30, the tungsten film layer 2 turning into the word line, the amorphous silicon layer 4a in which a p-type impurity is doped, the amorphous silicon layer 5a in which a low concentration impurity is doped, the amorphous silicon layer 6a in which an n-type impurity is doped are formed in this order above the semiconductor substrate 1 in which peripheral circuit and a word line contact WLC are formed. Thereafter, the formed film is patterned in a stripe-shaped pattern which extends in a word line direction and the space of the pattern is embedded by the insulator film 31. This patterning is collectively performed from the amorphous silicon layers 4a, 5a, and 6a to the word line in a self-aligned manner at the same time. Therefore, stack misalignment between the word line and each layer of an amorphous silicon pillar is not generated in the word line direction, and thereby the reliability for the memory programming/erasing operation can be enhanced. Subsequently, the upper part of the insulator film 31 is removed by the CMP method to planarize, and the upper surface of the amorphous silicon layer 6a is exposed.

Figure 36:
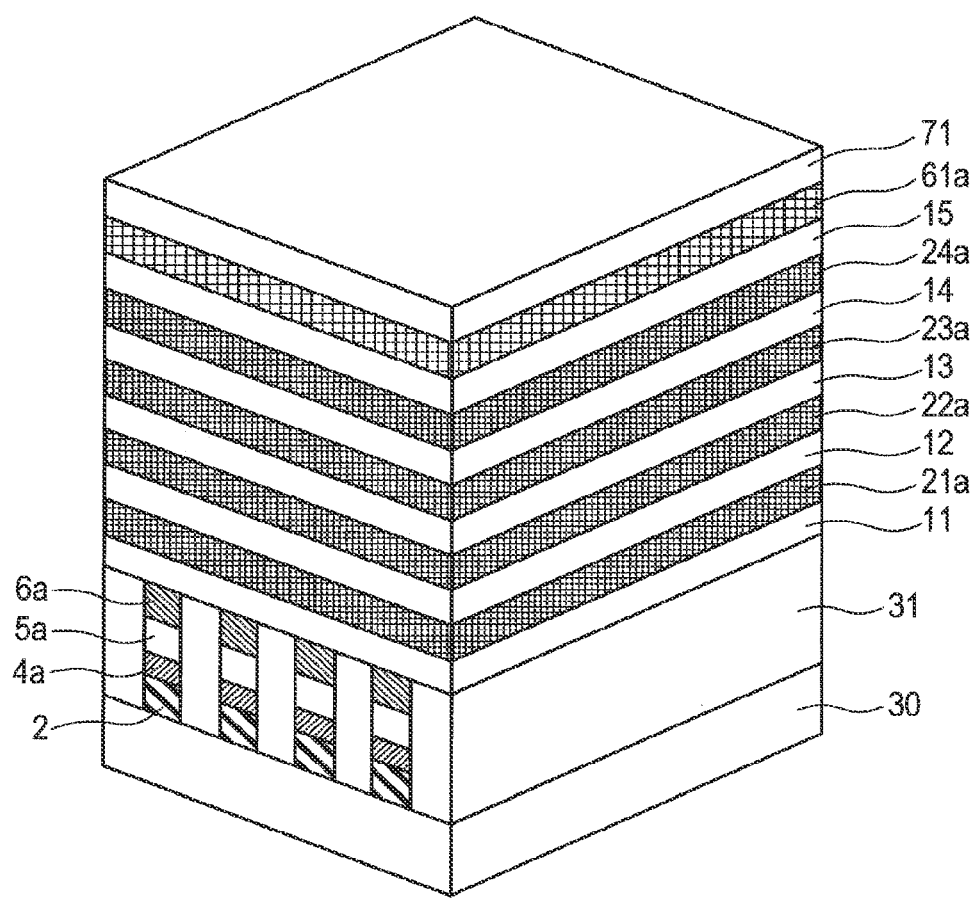
FIG. 36 is a partial three dimensional schematic view illustrating one example of the method for manufacturing the semiconductor storage device in the embodiment 2 of this invention.
Figure 37:
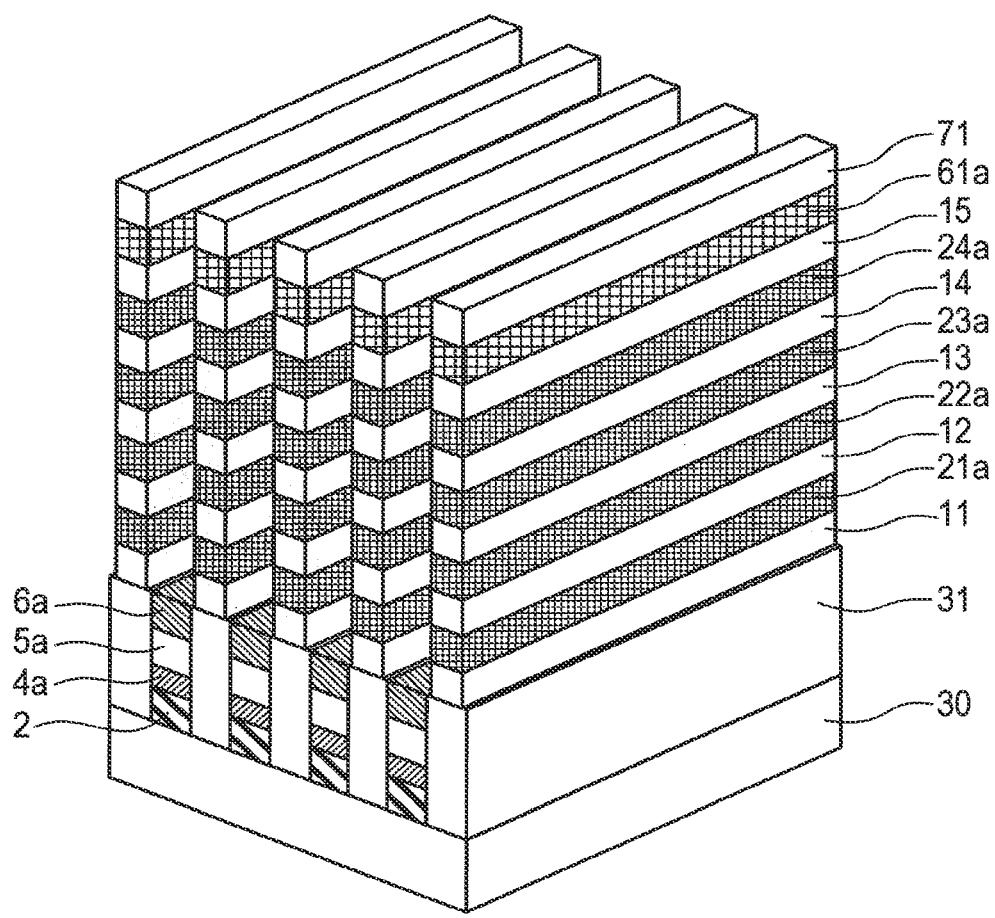
FIG. 37 is a partial three dimensional schematic view illustrating one example of the method for manufacturing the semiconductor storage device in the embodiment 2 of this invention.

Subsequently, as illustrated in FIG. 36, the insulator film layer 11, the amorphous silicon layer 21a, the insulator film layer 12, the amorphous silicon layer 22a, the insulator film layer 13, the amorphous silicon layer 23a, the insulator film layer 14, the amorphous silicon layer 24a, the insulator film layer 15, the amorphous silicon layer 61a, and the insulator film layer 71 are formed in this order. Subsequently, as illustrated in FIG. 37, the stacked film formed in FIG. 36 is patterned in a stripe-shaped pattern parallel to the extending direction of the word line 2. At this time, the stacked film made of the insulator film 11, the amorphous silicon layer 21a, the insulator film layer 12, the amorphous silicon layer 22a, the insulator film layer 13, the amorphous silicon layer 23a, the insulator film layer 14, the amorphous silicon layer 24a, the insulator film layer 15, the amorphous silicon layer 61a, and the insulator film layer 71 is patterned so as to arrange the space part of the stripe just above the word line 2.

At this time, the stacked film made of the insulator film 11, the amorphous silicon layer 21a, the insulator film layer 12, the amorphous silicon layer 22a, the insulator film layer 13, the amorphous silicon layer 23a, the insulator film layer 14, the amorphous silicon layer 24a, the insulator film layer 15, the amorphous silicon layer 61a, and the insulator film layer 71 may be formed narrower than the insulating material 31. This constitution provides an effect in which, when the insulator film 9 described below is formed, the space part of the stripe of the stacked film can be set not shorter than the amorphous silicon layers 4a, 5a, 6a, and thereafter, when the stacked film is patterned in a stripe shape in the direction of the bit line, a part of the amorphous silicon layers 4a, 5a, 6a can be prevented from being removed and remaining, and reliability of the memory operation can be enhanced.

Figure 38:
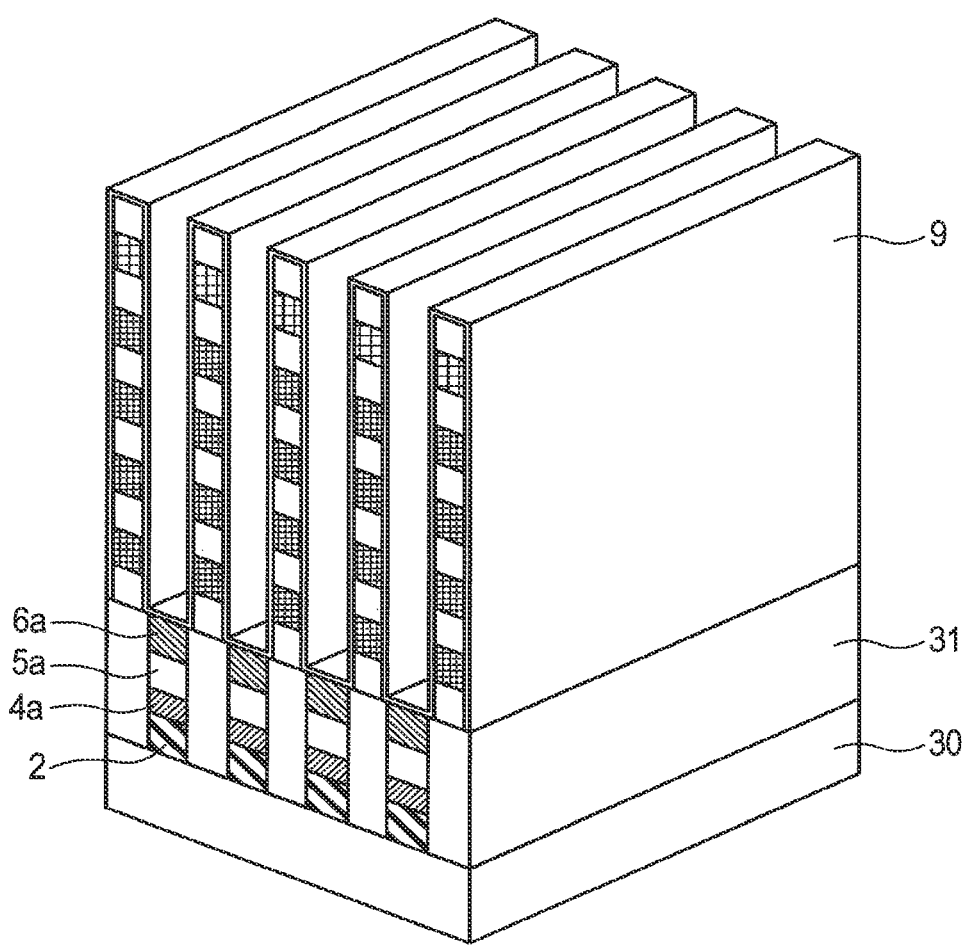
FIG. 38 is a partial three dimensional schematic view illustrating one example of the method for manufacturing the semiconductor storage device in the embodiment 2 of this invention.
Figure 39:
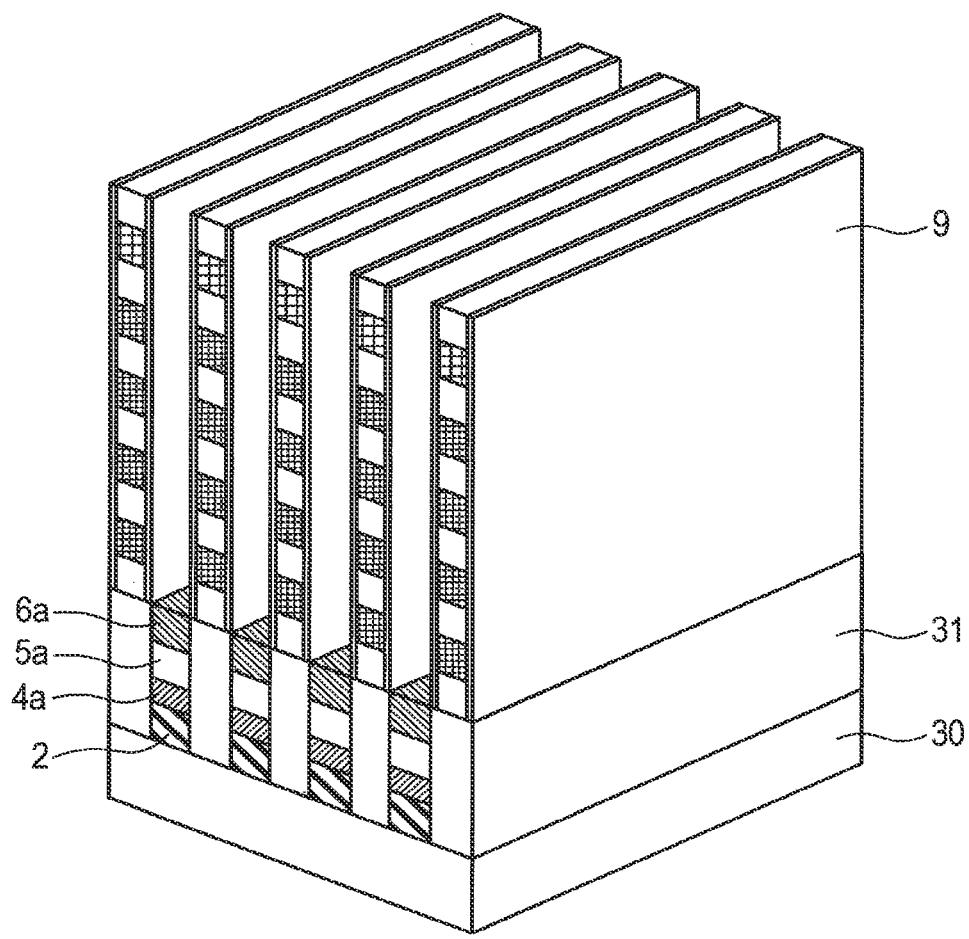
FIG. 39 is a partial three dimensional schematic view illustrating one example of the method for manufacturing the semiconductor storage device in the embodiment 2 of this invention.

Subsequently, as illustrated in FIG. 38, an insulator film 9 is formed so as not to completely plug the space patterned in FIG. 37. Thereafter, as illustrated in FIG. 39, the insulator film 9 above the insulator film 71 and the insulator film 9 on the upper surface of the amorphous silicon 6a are removed by etch back.

Figure 40:
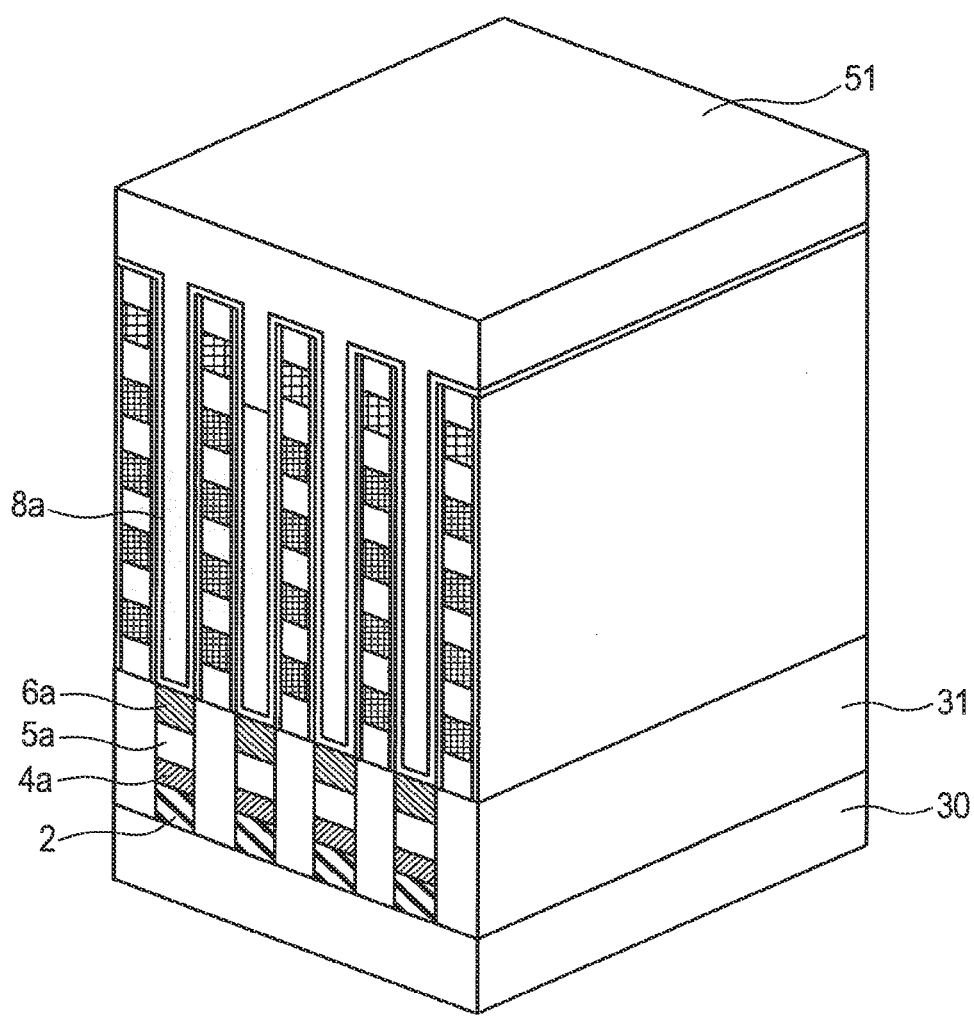
FIG. 40 is a partial three dimensional schematic view illustrating one example of the method for manufacturing the semiconductor storage device in the embodiment 2 of this invention.

Subsequently, an amorphous silicon layer 8a turning into the channel polysilicon layer 8p and the insulator film layer 51 are formed. As illustrated in FIG. 40, the amorphous silicon layer 8a is formed so as not to completely plug the space, and the insulator film layer 51 is formed so as to completely plug the space.

Figure 41:
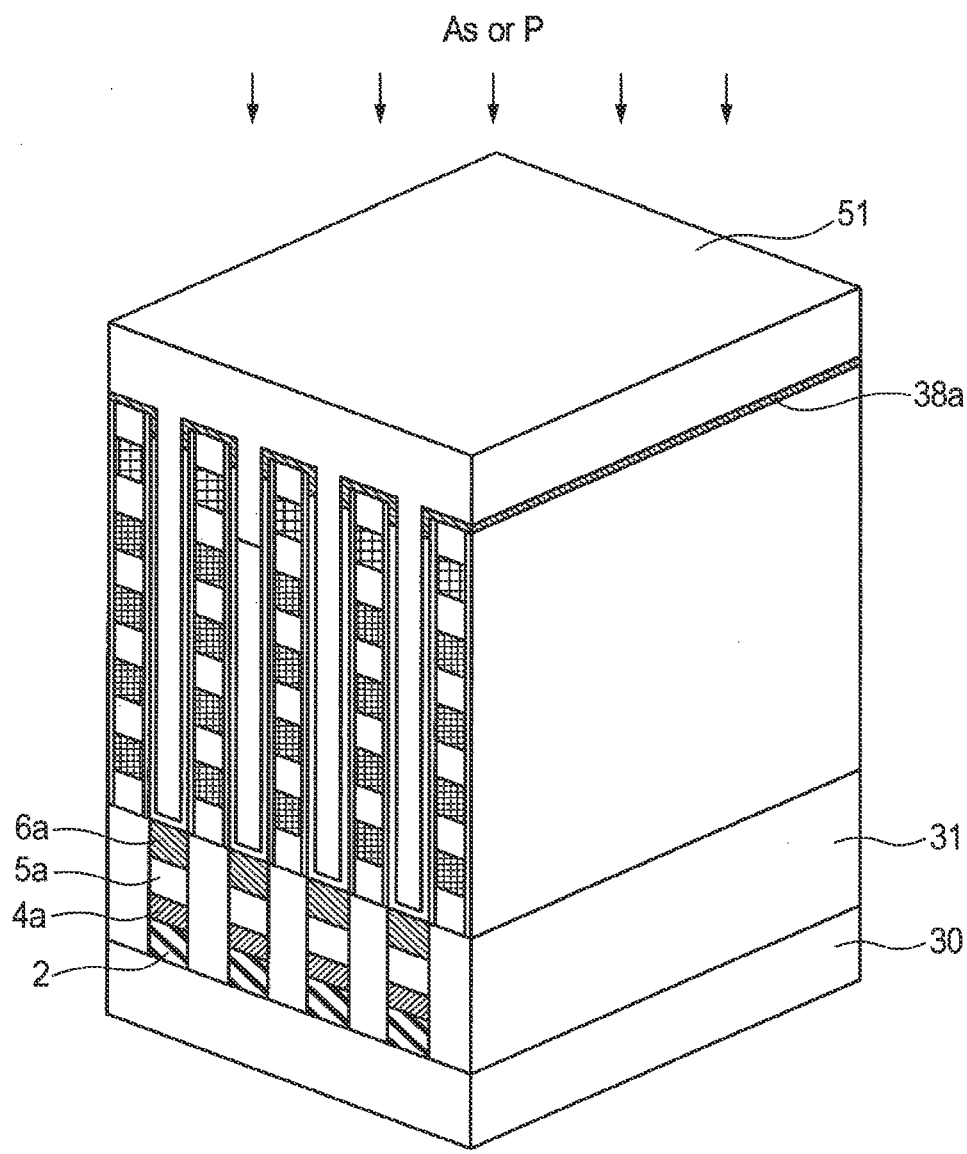
FIG. 41 is a partial three dimensional schematic view illustrating one example of the method for manufacturing the semiconductor storage device in the embodiment 2 of this invention.

Subsequently, as illustrated in FIG. 41, arsenic (As) or phosphorus (P) being an n-type impurity is implanted by ion implantation to dope into the amorphous silicon layer 8a on the upper surface. The doped amorphous silicon layer is determined as amorphous silicon 38a. The doping of As or P is performed so as not to be spread in a part lower than the upper surface of the amorphous silicon layer 61.

Figure 42:
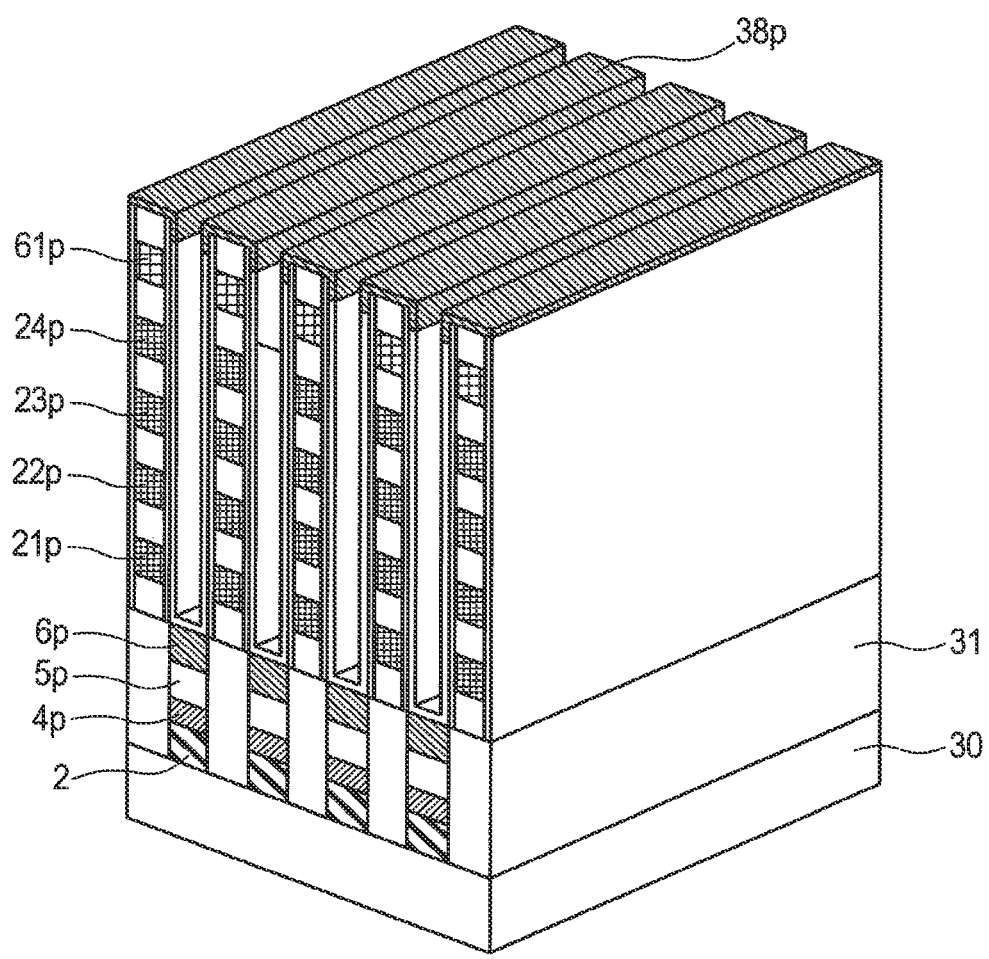
FIG. 42 is a partial three dimensional schematic view illustrating one example of the method for manufacturing the semiconductor storage device in the embodiment 2 of this invention.

Subsequently, crystallization of amorphous silicon layers 4a, 5a, 6a, 8a, 38a, 21a, 22a, 23a, 24a and activation of impurities included in the amorphous silicon layers are performed by annealing, and then the insulator film 51 is removed. As illustrated in FIG. 42, the amorphous silicon layers 4a, 5a, 6a, 8a, 38a, 21a, 22a, 23a, 24a turn into polysilicon layers 4p, 5p, 6p, 8p, 38p, 21p, 22p, 23p, 24p by the annealing, respectively.

Figure 43:
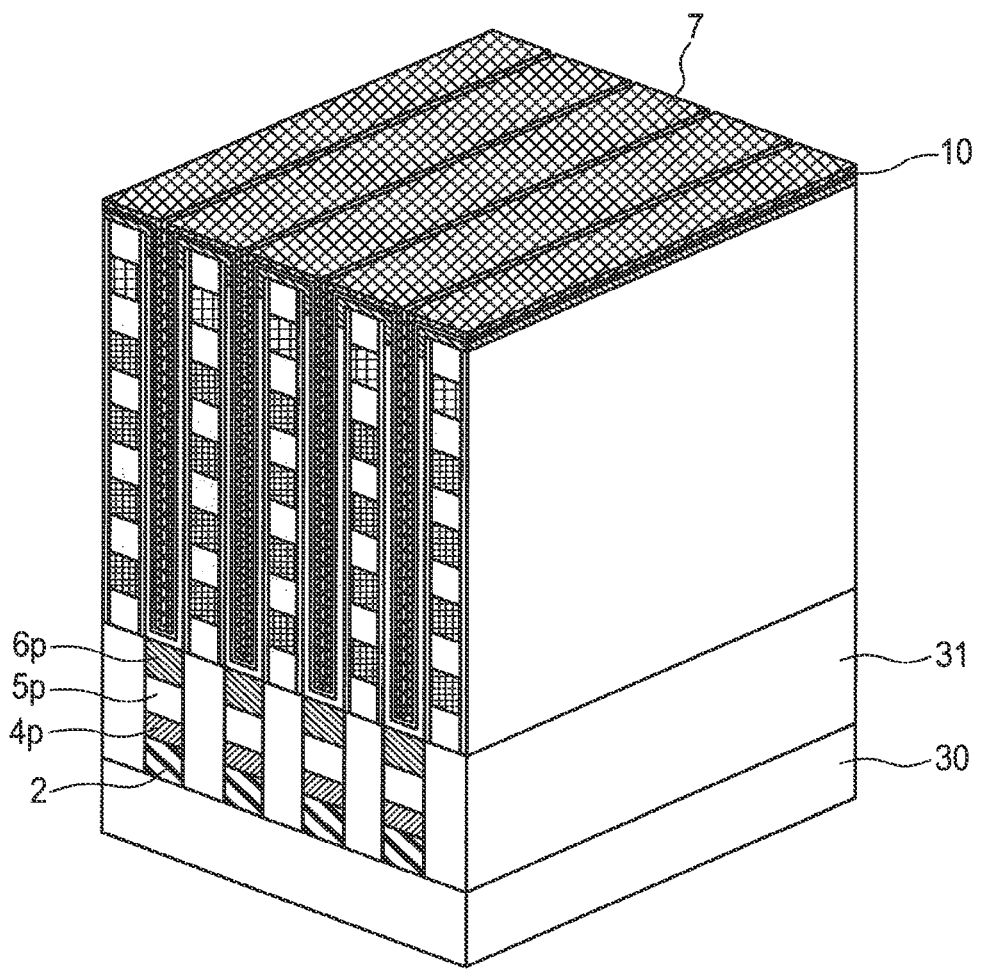
FIG. 43 is a partial three dimensional schematic view illustrating one example of the method for manufacturing the semiconductor storage device in the embodiment 2 of this invention.
Figure 44:
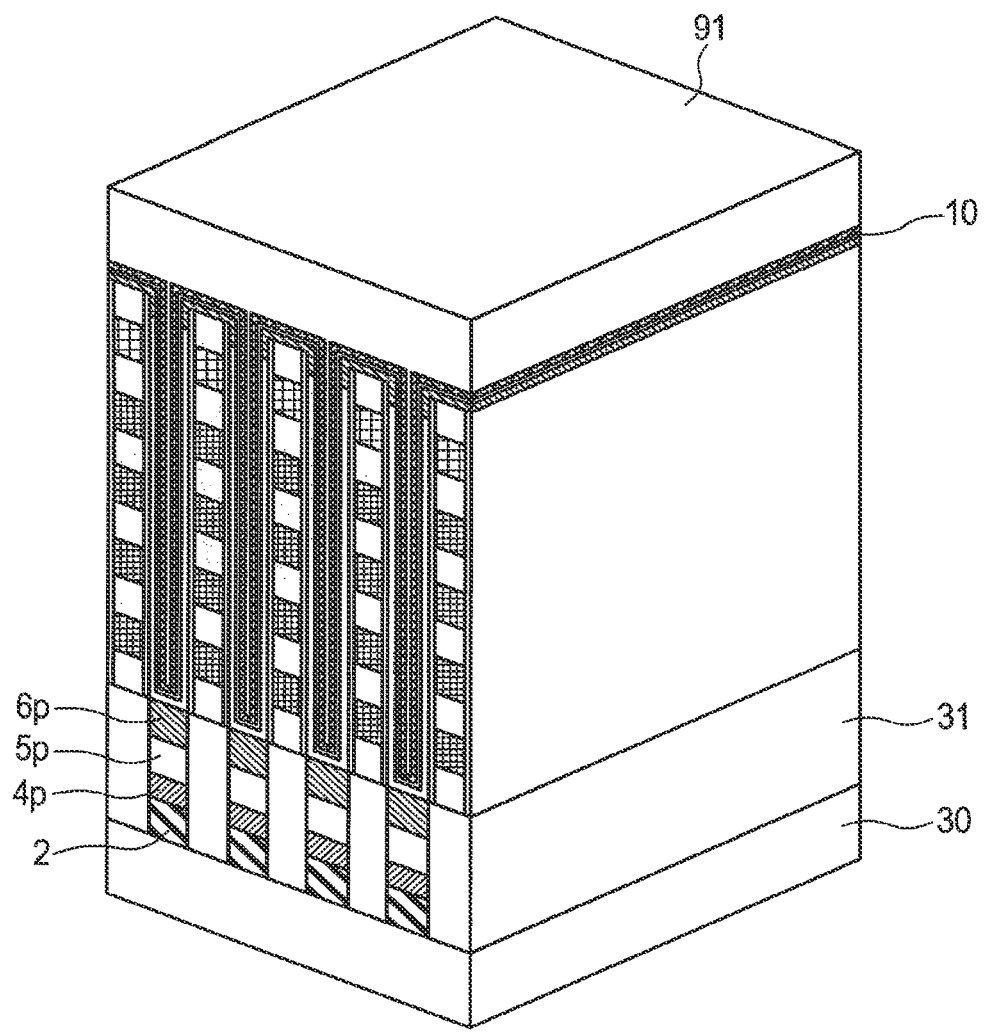
FIG. 44 is a partial three dimensional schematic view illustrating one example of the method for manufacturing the semiconductor storage device in the embodiment 2 of this invention.

Subsequently, as illustrated in FIG. 43, the insulator film layer 10 and the phase change material layer 7 are formed so as not to completely plug the space. Subsequently, as illustrated in FIG. 44, the insulator film layer 91 is formed so as to completely plug the space.

Figure 45:
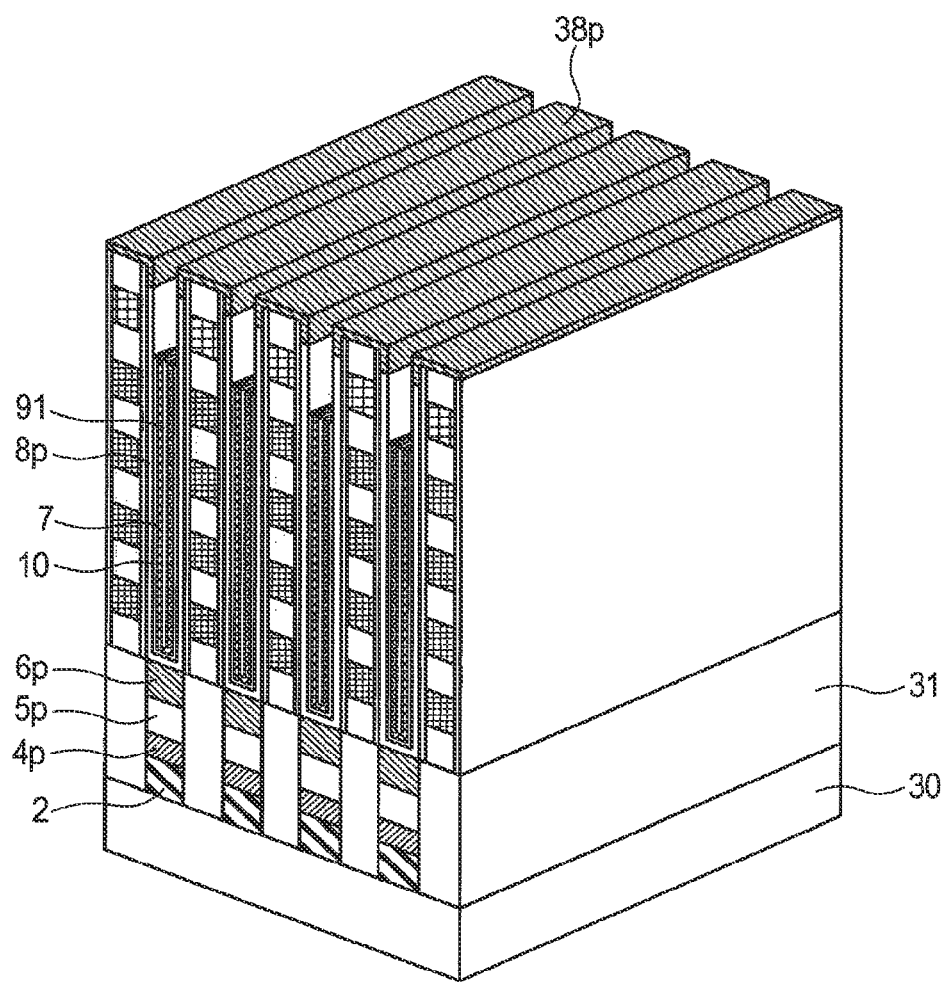
FIG. 45 is a partial three dimensional schematic view illustrating one example of the method for manufacturing the semiconductor storage device in the embodiment 2 of this invention.
Figure 46:
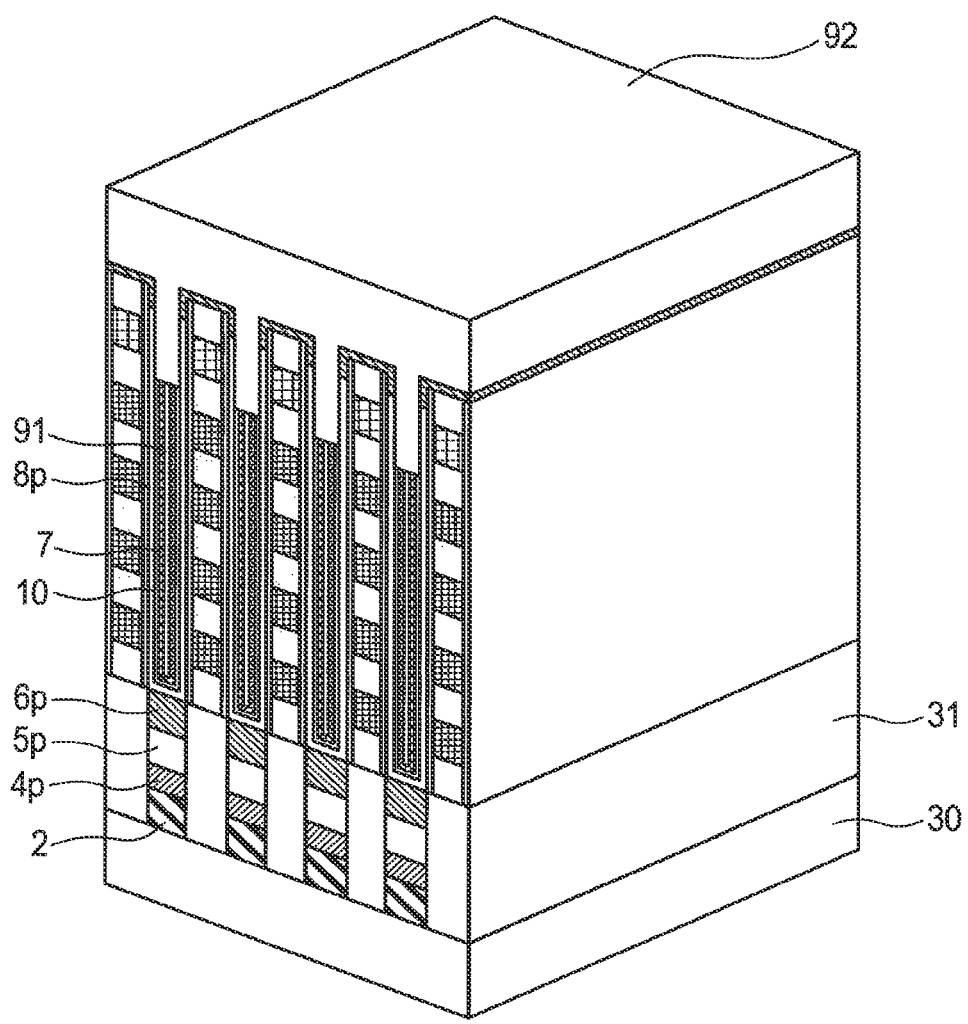
FIG. 46 is a partial three dimensional schematic view illustrating one example of the method for manufacturing the semiconductor storage device in the embodiment 2 of this invention.
Figure 47:
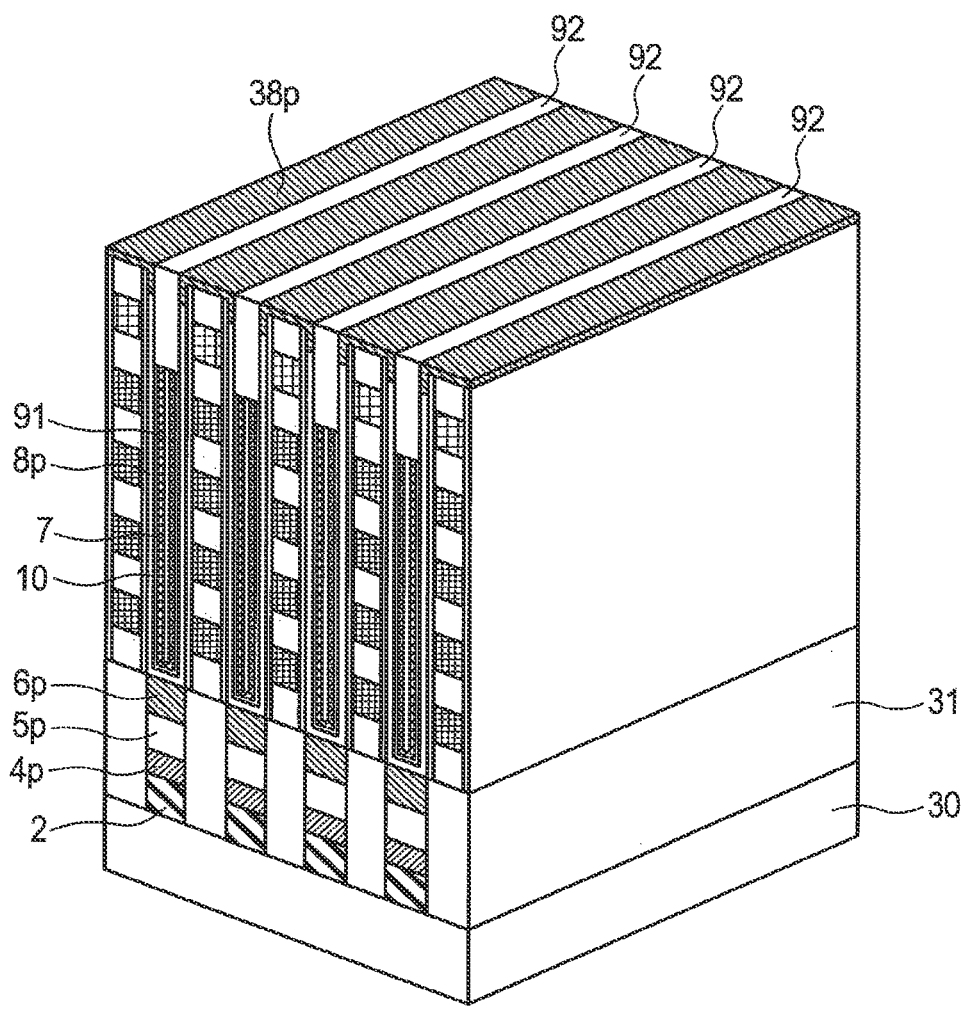
FIG. 47 is a partial three dimensional schematic view illustrating one example of the method for manufacturing the semiconductor storage device in the embodiment 2 of this invention.

Subsequently, as illustrated in FIG. 45, an altitude of the top surface of the phase change material layer 7 is set lower than that of the top surface of the insulator film layer 15 and set higher than that of the lowest layer of the insulator film layer 15 by the etch back. In order to prevent current flow to the source and drain through the phase change material layer 7 when the gate of the gate polysilicon layer 61p is in OFF state, the altitude of the top surface of the phase change material 7 is set lower than that of the top surface of the insulator film layer 15. In order to flow current to the source and drain through the phase change material layer 7 when the gate of polysilicon 24p formed just below the insulator film layer 15 is in OFF state, the altitude of the top surface of the phase change material 7 is set higher than that of the lowest surface of the insulator film 15. A part of the insulator film layer 91 is also removed at the same time. Subsequently, as illustrated in FIG. 46, the insulator film layer 92 is embedded, and as illustrated in FIG. 47, the top surface of the polysilicon layer 38p is exposed by etch back.

Figure 48:
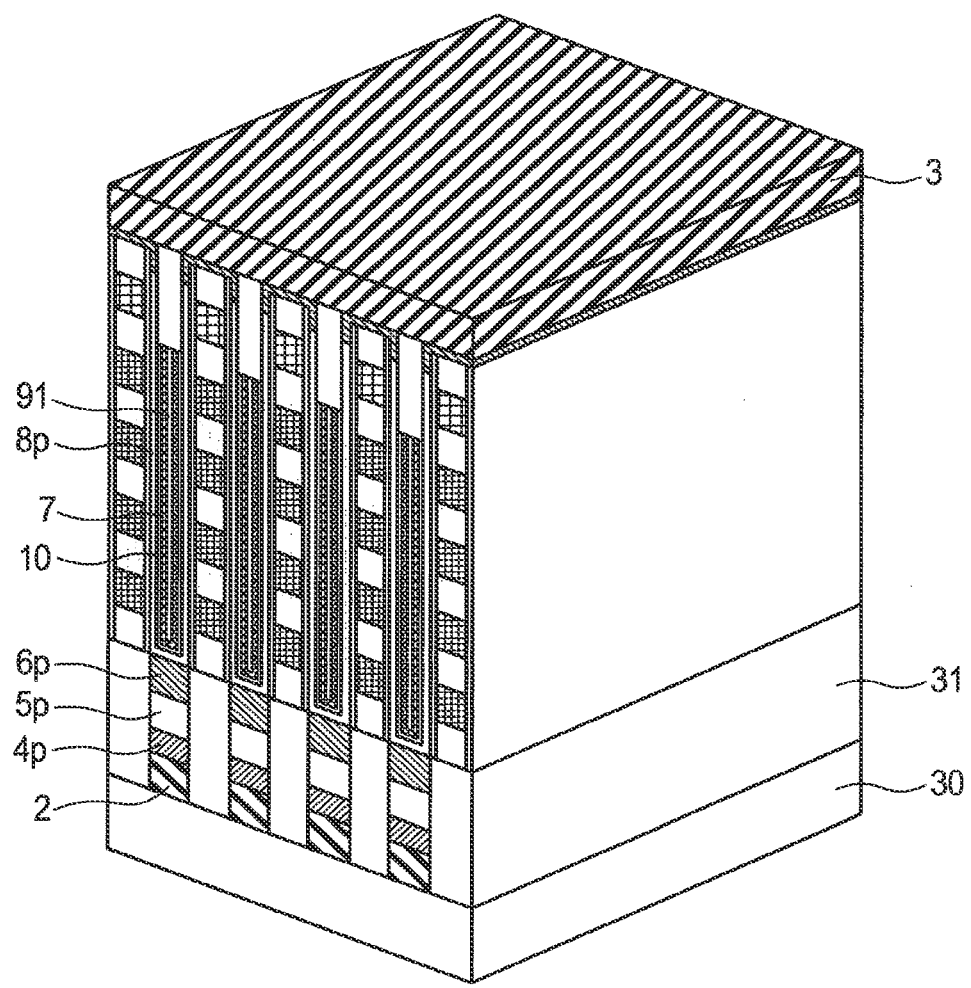
FIG. 48 is a partial three dimensional schematic view illustrating one example of the method for manufacturing the semiconductor storage device in the embodiment. 2 of this invention.

Thereafter, BCL in FIG. 31, that is, a contact BLC which connects the bit line 3 and the peripheral circuit previously formed above the semiconductor substrate is formed. Thereafter, as illustrated in FIG. 48, a film of a material which is patterned to the bit line 3 later is formed.

Figure 49:
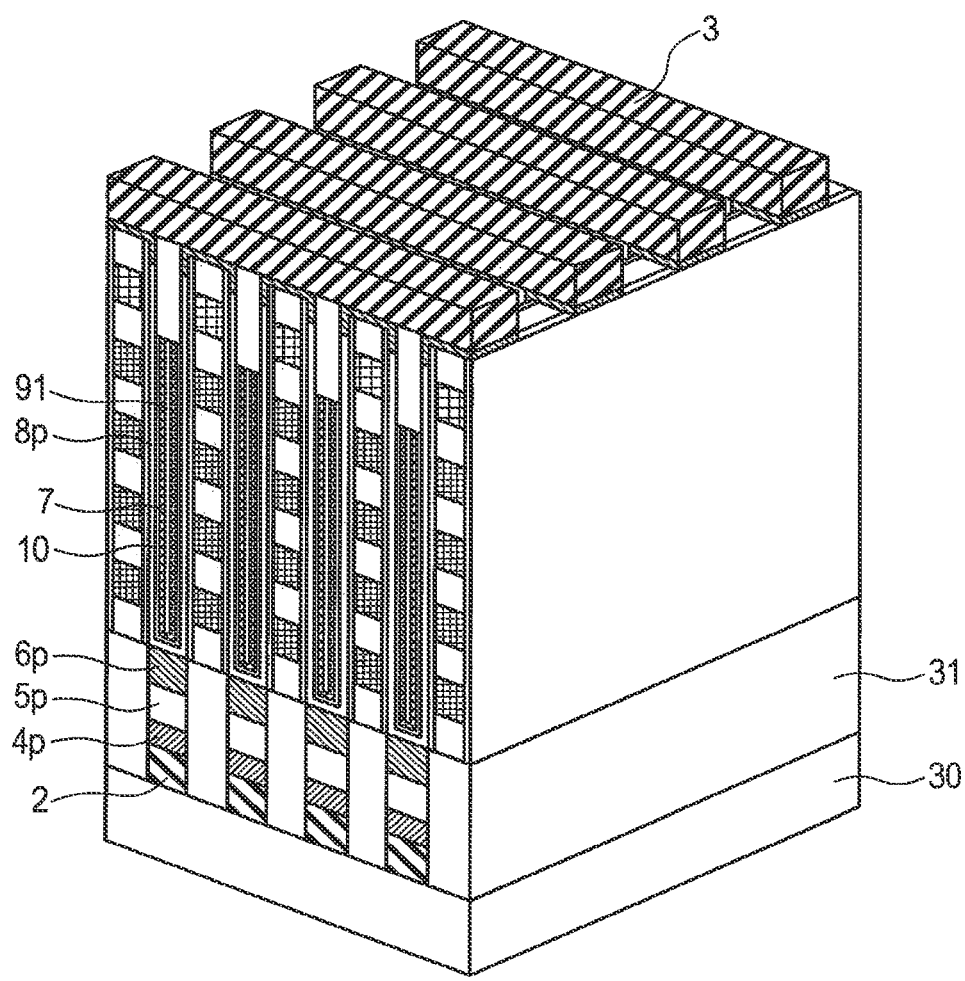
FIG. 49 is a partial three dimensional schematic view illustrating one example of the method for manufacturing the semiconductor storage device in the embodiment 2 of this invention.
Figure 50A:
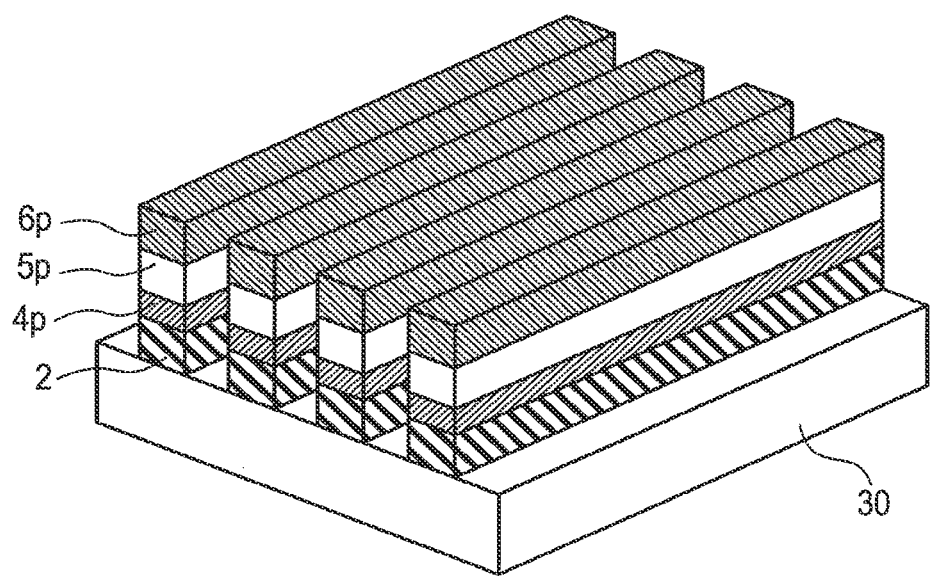
FIG. 50a is a partial three dimensional schematic view illustrating one example of the method for manufacturing the semiconductor storage device in the embodiment 2 of this invention and FIG. 50b is a partial three dimensional schematic view illustrating one example of the method for manufacturing the semiconductor storage device in the embodiment 2 of this invention.
Figure 50B:
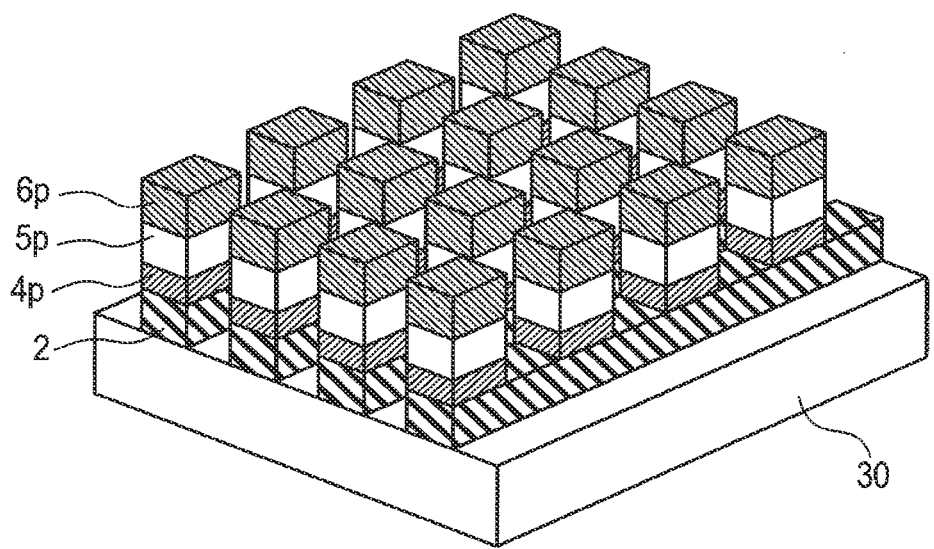

Subsequently, as illustrated in FIG. 49, the material which is patterned to the bit line 3 later and the n-type polysilicon layer 38p, the insulator film layer 92, the channel polysilicon layer 8p, the insulator film layer 10, the phase change material layer 7, the insulator film layer 91, the polysilicon layers 6p, 5p, 4p are patterned in a stripe shape extending in the direction perpendicular to the word line 2. When the bit line 3 is patterned in the stripe shape, the patterned parts of the stacked film made of the gate polysilicon layers 21p, 22p, 23p, 24p, 61p and the insulator film layers 11, 12, 13, 14, 15, 71 and the gate insulator film layer 9 remain without patterning. However, the patterned parts of the channel polysilicon layer 8p, 38p, the phase change material layer 7 and the insulator film layer 10 are removed. The polysilicon diode PD above the word line 2 is collectively removed at the same time with the above-described patterning in the stripe shape, and turn into a space part. At this time, shapes of the polysilicon layers 6p, 5p, 4p become shapes as illustrated from FIG. 50(a) to FIG. 50(b).

Figure 51:
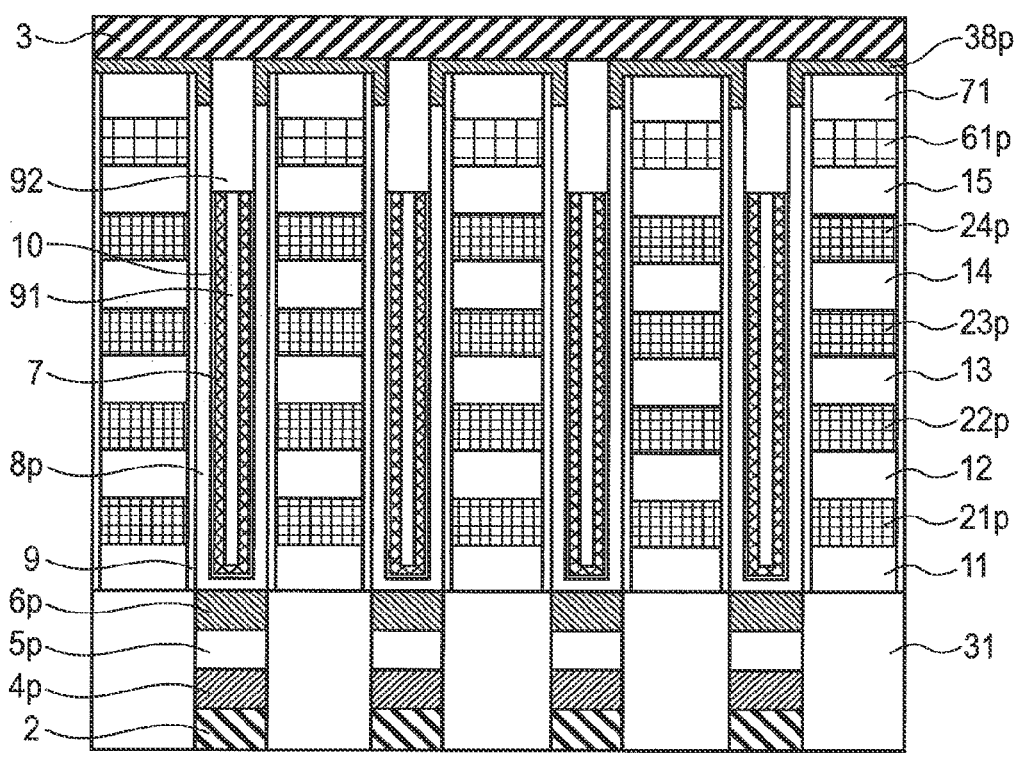
FIG. 51 is a partial cross-sectional view illustrating one example of the method for manufacturing the semiconductor storage device in the embodiment 2 of this invention.
Figure 52:
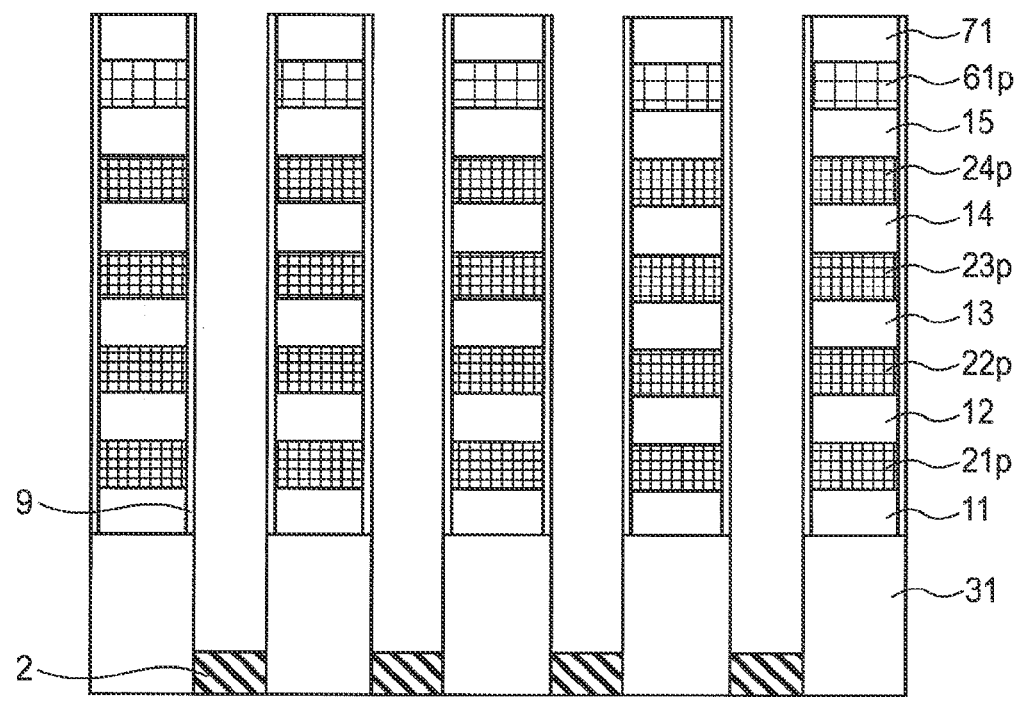
FIG. 52 is a partial cross-sectional view illustrating one example of the method for manufacturing the semiconductor storage device in the embodiment 2 of this invention.
Figure 53:
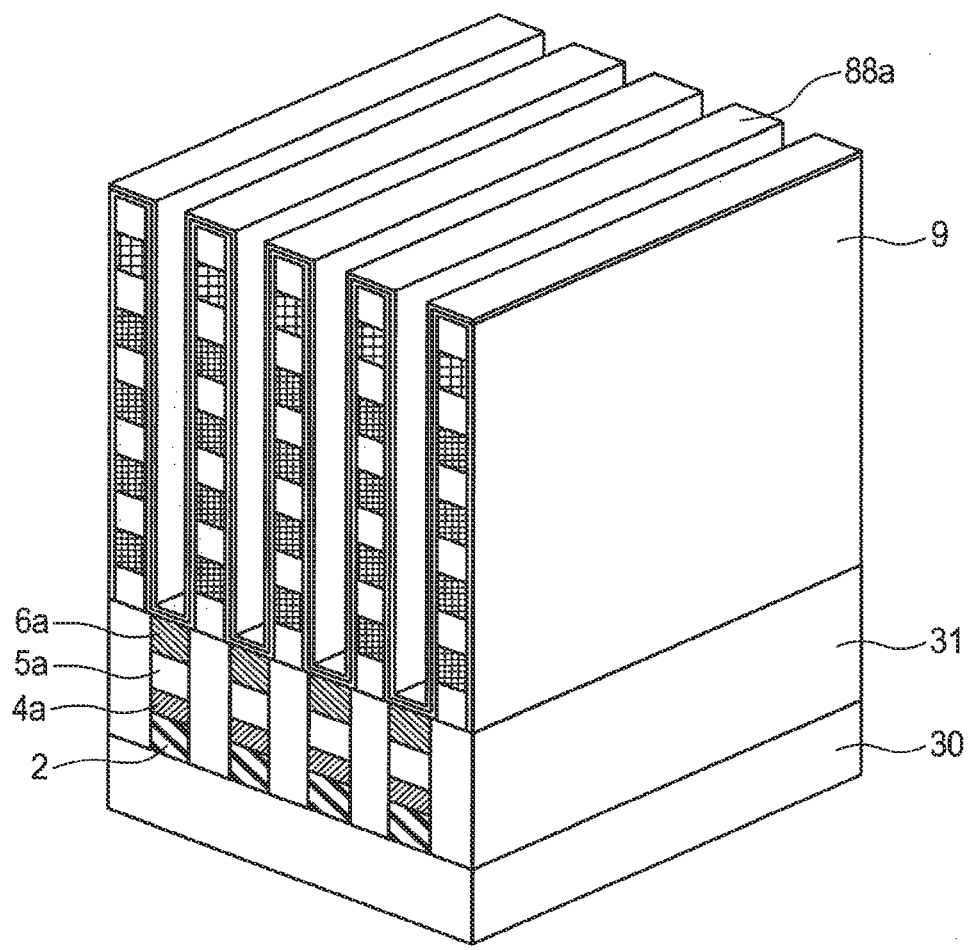
FIG. 53 is a partial three dimensional schematic view illustrating one example of the method for manufacturing the semiconductor storage device in the embodiment 2 of this invention.

A section seen from the extending direction of the word line 2 in FIG. 49 is FIG. 51, and a section along the space of the word line 2 is FIG. 52. The polysilicon diode PD is formed in a self-aligned manner to both of the word line 2 and the bit line 3.

Patterns of the channel polysilicon layer 8p, the phase change material layer 7 and the insulator film layer in the vertical type chain memory are formed in a self-aligned manner to the bit line 3. This process can prevent misalignment at the time of stack compared to a process in which layers having specific shape are sequentially formed, and has an effect which enhances reliability of the memory programming/erasing process. Further, by collectively patterning from the bit line 3 to the upper surface of the word line 2 at the same time, this part can be formed in a self-aligned manner to the bit line 3 together with the polysilicon diode PD. Therefore, this process has an effect which can reduce the manufacturing cost, because the number of masks for patterning process can be reduced.

Thereafter, the gate polysilicons at the end of the memory array are patterned so as to form contacts for each layer as illustrated in FIG. 2 and the whole part including a part patterned in the stripe shape is embedded with the interpoly dielectric film. The contacts GC1, GC2, GC3, GC4 reaching to the gate polysilicon layers 21p, 22p, 23p, 24p, the contacts STGC1, STGC2 reaching to the gate polysilicon layer 61p, the gate signal lines GL1, GL2, GL3, GL4, STGL1, STGL2, and contacts GLC1, GLC2, GLC3, GLC4, STGLC1, STGLC2 connecting the gate signal lines and the peripheral circuit are formed and the semiconductor storage device is constituted.

In the above description, constitution in which the amorphous silicon layer 61a is arranged in a higher layer than the amorphous silicon layers 21a, 22a, 23a, 24a is described. However, when the amorphous silicon layer 61a is arranged in a lower layer than the amorphous silicon layers 21a, 22a, 23a, 24a, the right and left channel polysilicon layers 9 in FIG. 33 can be controlled. However, as in this embodiment, arrangement of the amorphous silicon layer 61 in the higher layer has an effect which reduces processes of embedding an insulating material into the connection hole and patterning in a stripe shape.

Figure 54:
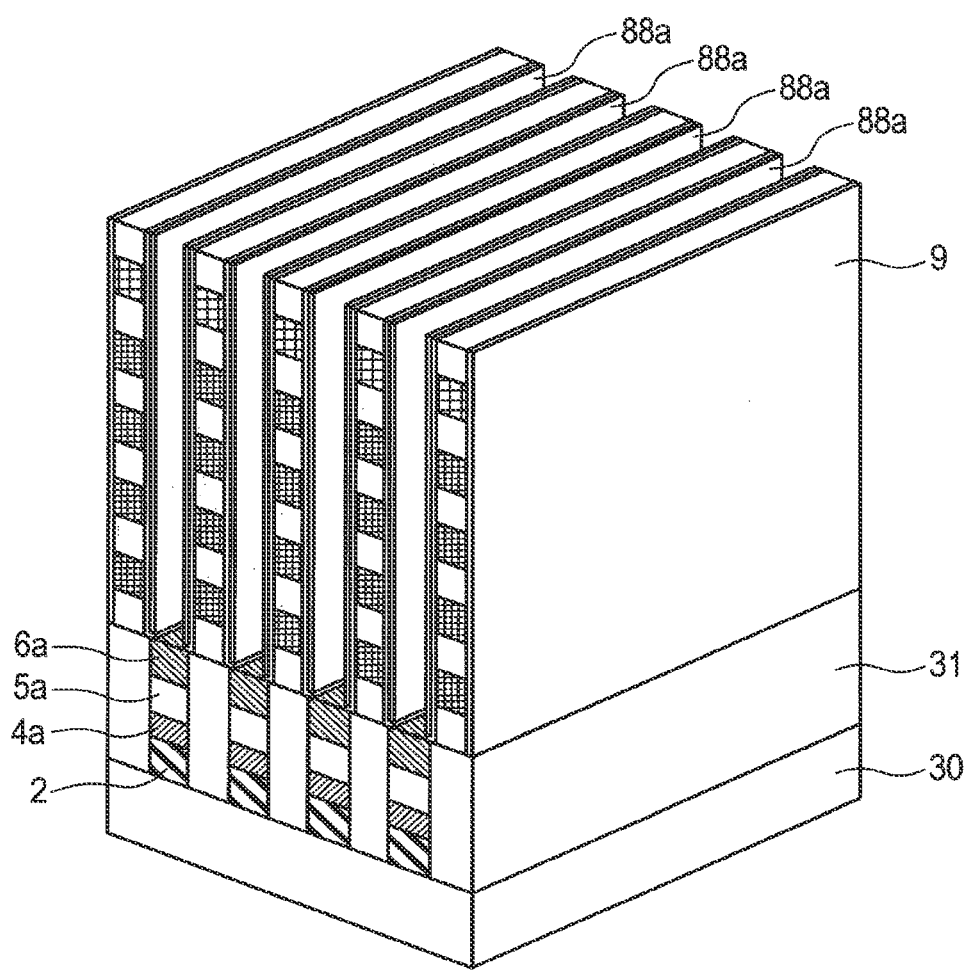
FIG. 54 is a partial three dimensional schematic view illustrating one example of the method for manufacturing the semiconductor storage device in the embodiment 2 of this invention.
Figure 55:
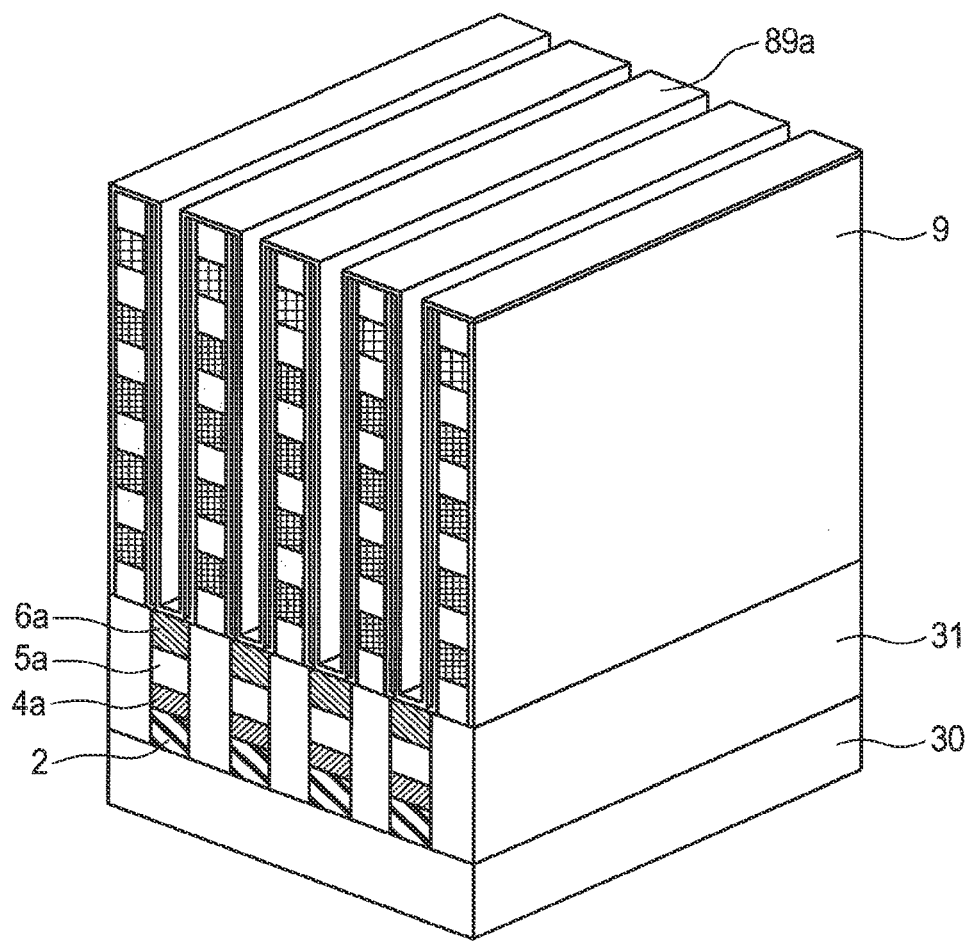
FIG. 55 is a partial three dimensional schematic view illustrating one example of the method for manufacturing the semiconductor storage device in the embodiment 2 of this invention.

In FIG. 35 to FIG. 52, the amorphous silicon layers turning into the channel polysilicon layers are formed in one process. However, the amorphous silicon layers can be formed in two processes or more. After the process of FIG. 38, an amorphous silicon layer 88a is formed before removing the insulator film layer 9. Subsequently, as illustrated in FIG. 54, the amorphous silicon layer 88a and the insulator film layer 9 above the insulator film layer 71 and on the upper surface of the amorphous silicon layer 6a are removed by the etch back. At this time, the process is performed so as not to remove the insulator film layer 9 and the amorphous silicon layer 88a on the sidewall of the space. Subsequently, an amorphous silicon layer 89a is formed so as not to completely plug the space. Thereafter, the nonvolatile semiconductor storage device is constituted by performing processes similar to FIG. 40 to FIG. 53.

Figure 56:
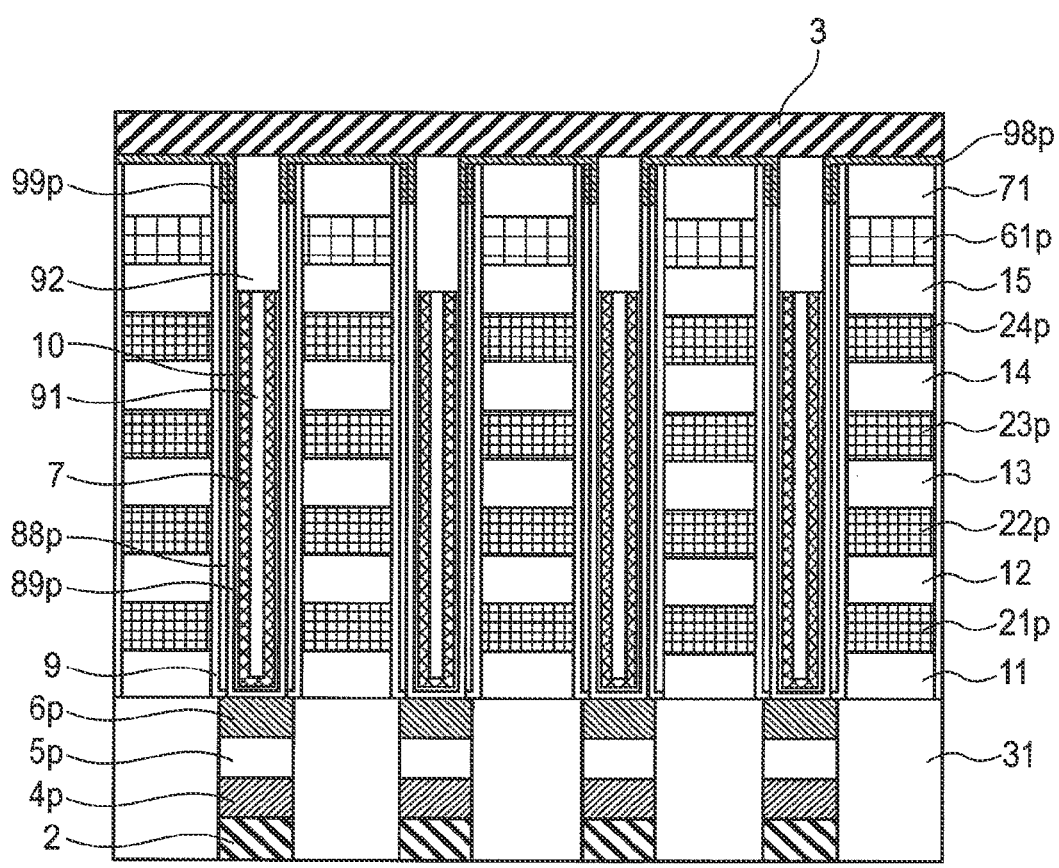
FIG. 56 is a partial cross-sectional view illustrating one example of the method for manufacturing the semiconductor storage device in the embodiment 2 of this invention.
Figure 57A:
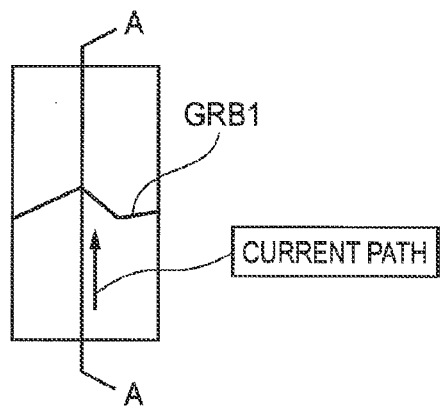
FIG. 57a is a plan view illustrating a polysilicon grain boundary and a current path.
Figure 57B:
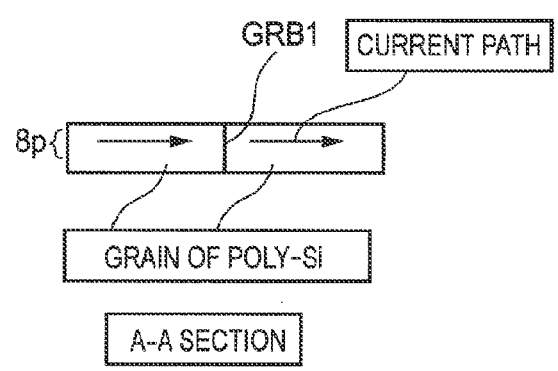
FIG. 57b is a cross-sectional view illustrating the polysilicon grain boundary and the current path.

FIG. 56 is a cross-sectional view along the bit line 3 when the amorphous silicon layer turning into the channel polysilicon layer is formed in two processes or more. When the channel polysilicon is formed by crystallizing one layer of the amorphous silicon layer, polysilicon grains may be formed as illustrated in FIGS. 57(a) and 57(b). In this case, channel resistance becomes extremely high because the path of channel current when the transistor is in ON state is completely shielded by the grain boundary GRB1. When the channel resistance is high, high voltage bias is required in order to apply current which is sufficient for the set operation and the reset operation of the phase change material layer 7.

Figure 57C:
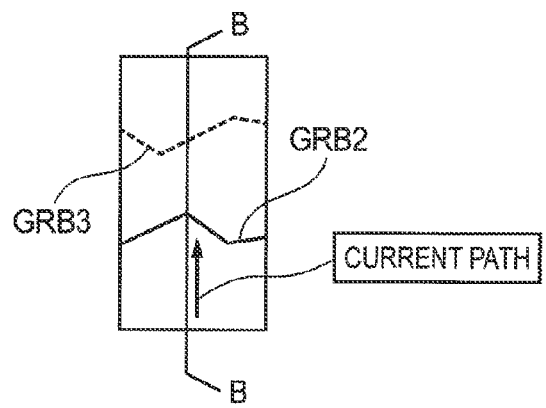
FIG. 57c a plan view illustrating polysilicon grain boundaries and current path.
Figure 57D:
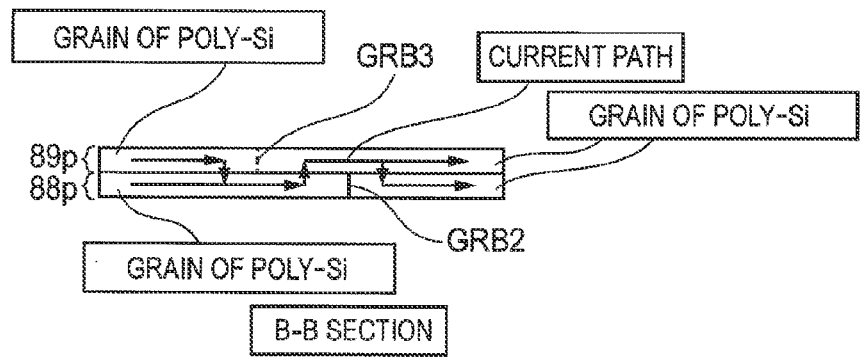
FIG. 57d is a cross-sectional view illustrating the polysilicon grain boundaries and the current paths.

On the other hand, when a channel polysilicon is crystallized after the channel polysilicon is formed by the two layers of amorphous silicon layers 88a, 89a, crystals almost independently grow because an extremely thin layer containing oxygen is formed between the two layers 88a, 89a. Consequently, the polysilicon grain boundaries are formed in different parts in the two layers such as GRB2 and GRB3 illustrated in FIGS. 57(c) and 57(d). From this, the low voltage operation is possible because channel current of the path can flow by bypassing the grain boundaries GBR2, GRB3 and thereby increase in the channel resistance by the grain boundaries is small. Each film formation of the amorphous silicon layers 88a, 89a is further separately formed in several times.

The method for separately forming the amorphous silicon layer turning into the channel polysilicon layer in two processes or more has further preferable point. When the amorphous silicon layer 88a is formed before removing the insulator film layer 9 and thereafter the insulator film layer on the upper surface of the amorphous silicon layer 6a is removed by the etch back, the amorphous silicon layer 88a acts as a protection film for the insulator film layer 9 because the amorphous silicon layer 88a is formed at the surface of the insulator film layer 9 formed on the sidewall part. Thereby, damage of the insulator film layer 9 acting as a gate insulator film can be reduced and reliability of the gate operation can be enhanced. When the amorphous silicon layer 88a is used as the protection film for the insulator film layer 9, the amorphous silicon layer 88a formed on the upper surface of the amorphous silicon layer 6a is removed together with the insulator film layer 9. Therefore, only the amorphous silicon layer 89a formed thereafter remains on the upper surface of the amorphous silicon layer 6a, and as a result, only this part is formed as a single layer. On the other hand, when the amorphous silicon layer 89a is used as a bypass of the grain boundaries, the effect can also be obtained even when the amorphous silicon layers 88a, 89a are formed after removing the insulator film layer 9. Therefore, constitution in which two layers of channel layers are formed on the upper surface of the amorphous silicon layer 6a may be formed.

Figure 58:
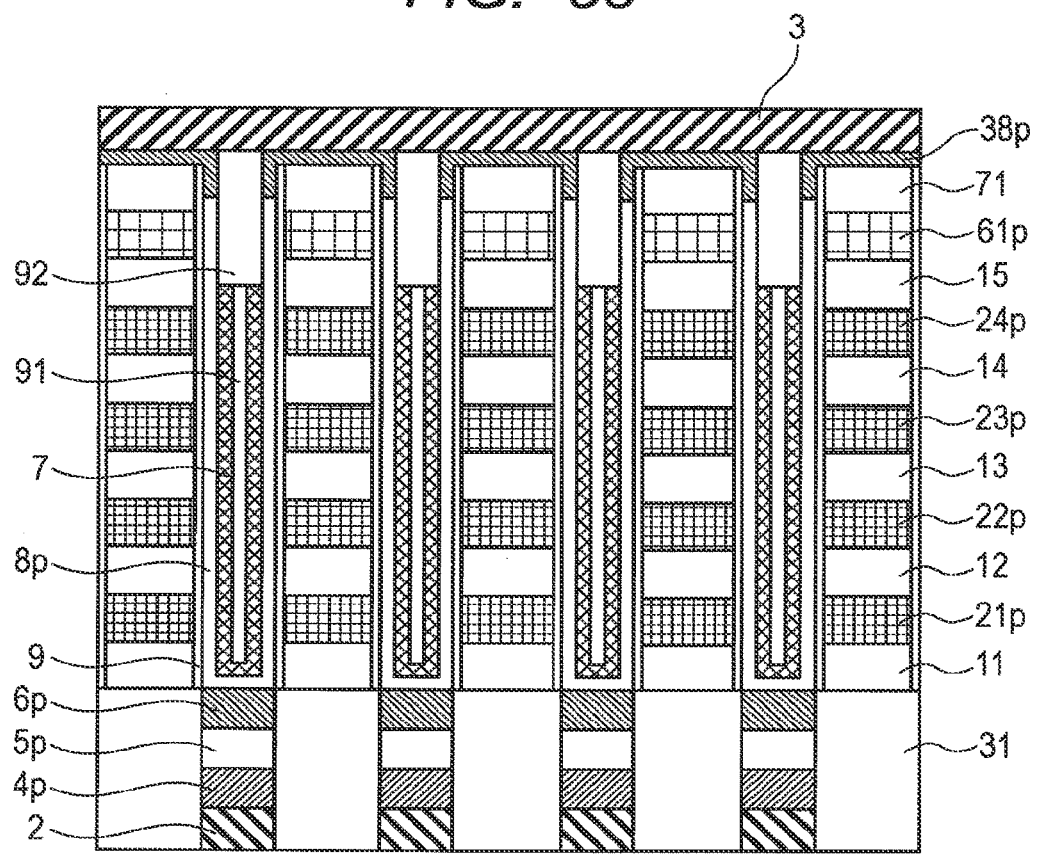
FIG. 58 is a partial cross-sectional view illustrating one example of the method for manufacturing the semiconductor storage device in the embodiment 2 of this invention.

In the example in FIG. 35 to FIG. 52, and the example in FIG. 53 to FIG. 57, the constitution in which the insulator film layer 9, the channel polysilicon (8p, or 88p and 89p), the insulator film layer 10, the phase change material layer 7 and the insulator film layer 91, 92 are embedded into a space part of the stacked film made of the insulator film layer 11, the amorphous silicon layer 21a, the insulator film layer 12, the amorphous silicon layer 22a, the insulator film layer 13, the amorphous silicon layer 23a, the insulator film layer 14, the amorphous silicon layer 24a, the insulator film layer 15, the amorphous silicon layer 61a, and the insulator film layer 71 is formed. However, the constitution can be manufactured by eliminating the insulator film layer 10 as illustrated in FIG. 58. This is realized by not forming the insulator film layer 10 in the process in FIG. 43.

Diffusion between the channel polysilicon 8p and the phase change material layer 7 can be prevented by the presence of the insulator film layer 10. However, memory operation can be performed, even if the insulator film layer 10 is not used. The process of forming the insulator film layer 10 can be omitted by this constitution. Therefore, this constitution has an effect which can reduce the bit cost compared to the constitution having the insulator film layer 10.

Figure 59:
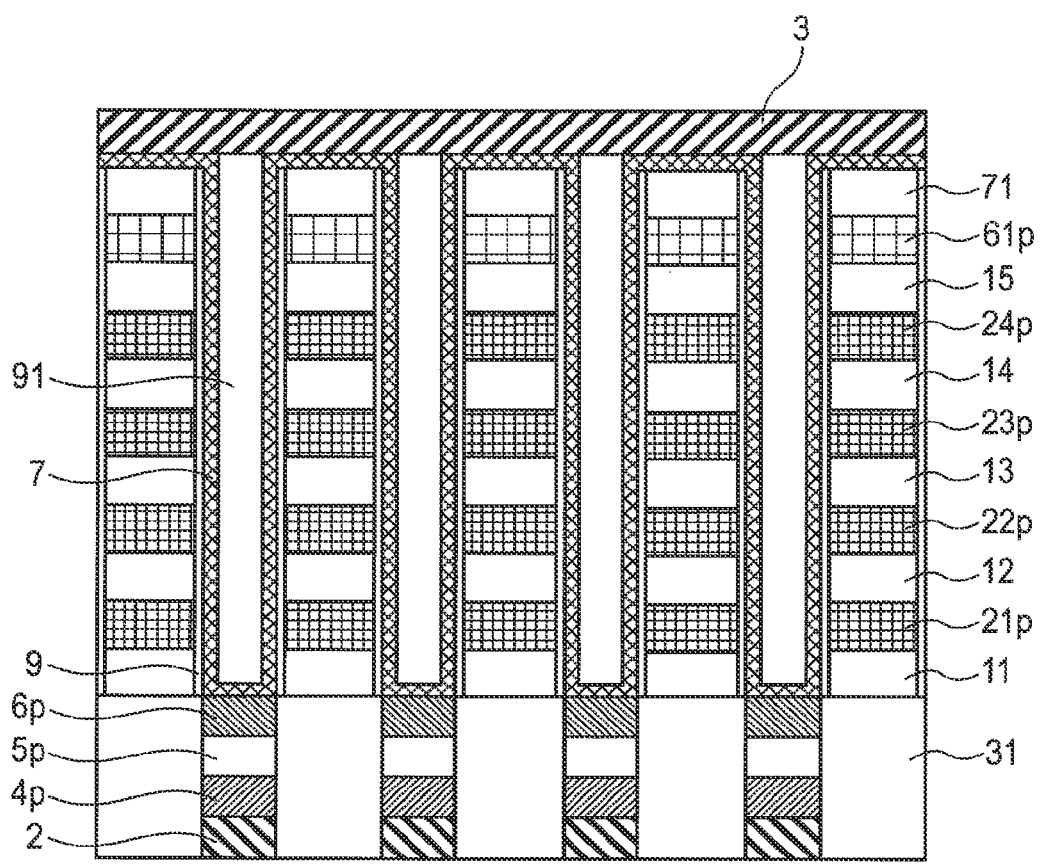
FIG. 59 is a partial cross-sectional view illustrating one example of the method for manufacturing the semiconductor storage device in the embodiment 2 of this invention.

Further, as shown in FIG. 59, it is possible that the channel polysilicon layer is not formed in the space part of the stacked film made of the insulator film layer 11, the amorphous silicon layer 21a, the insulator film layer 12, the amorphous silicon layer 22a, the insulator film layer 13, the amorphous silicon layer 23a, the insulator film layer 14, the amorphous silicon layer 24a, the insulator film layer 15, the amorphous silicon layer 61a, and the insulator film layer 71. This is realized by forming the phase change material layer 7 so as not to completely plug the space after the process of FIG. 39.

This specification is described by using the constitution in which the channel polysilicon layer 8p is formed between the gate insulator film layer 9 and the phase change material layer 7 when the pass of the source and the drain is formed. However, the channel polysilicon layer 8p may not be provided and a part of the phase change material layer 7 may be used for the channel path. In this case, the part of the phase change material layer 7 functions as a channel layer other than the storage area. By this constitution, the process for forming the channel polysilicon layer 8p can be omitted. Therefore, this constitution has an effect which can reduce the bit cost compared to the constitution in which a channel operation is performed by using the channel polysilicon layer 8p.

In the example from FIG. 35 to 52, the example from FIG. 53 to FIG. 57, the example of FIG. 58 and the example of FIG. 59, the phase change material layer 7 is connected each other between the memory cells adjacent in a direction perpendicular to the substrate. One example of the method for manufacturing the semiconductor storage device in which the phase change material layer 7 is divided in each memory cell is illustrated from FIG. 60 to FIG. 76

Figure 60:
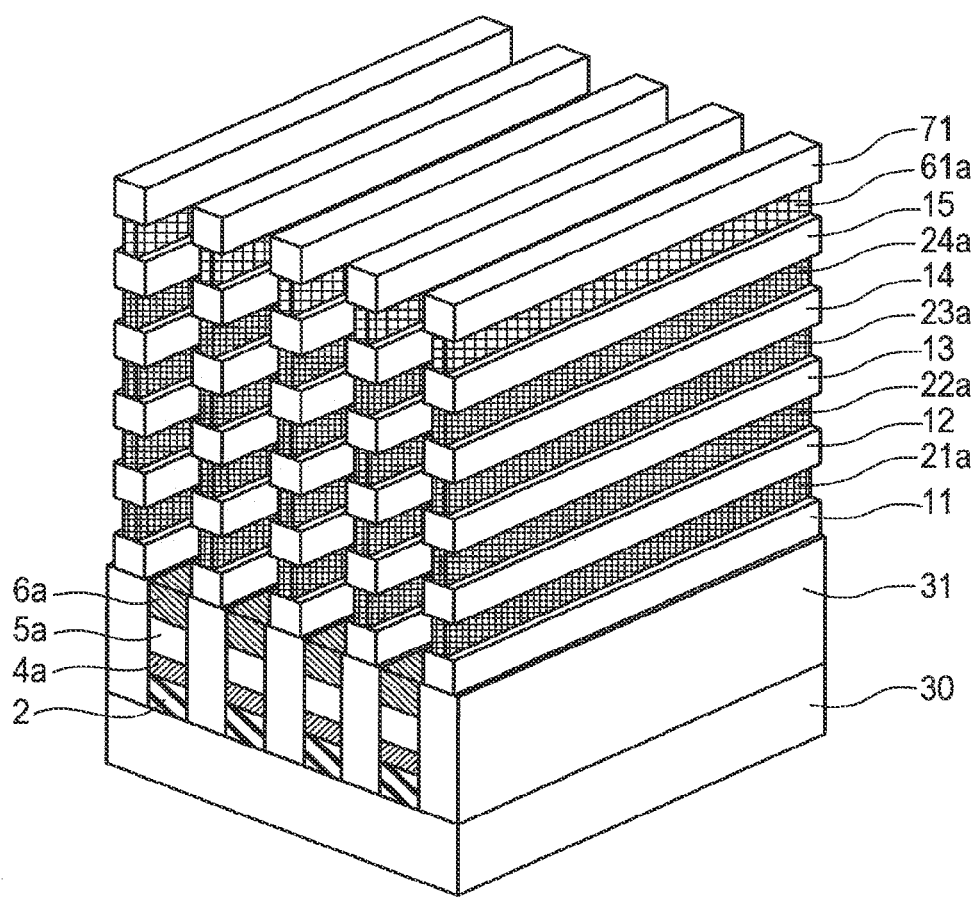
FIG. 60 is a partial three dimensional schematic view illustrating one example of the method for manufacturing the semiconductor storage device in the embodiment 2 of this invention.
Figure 61:
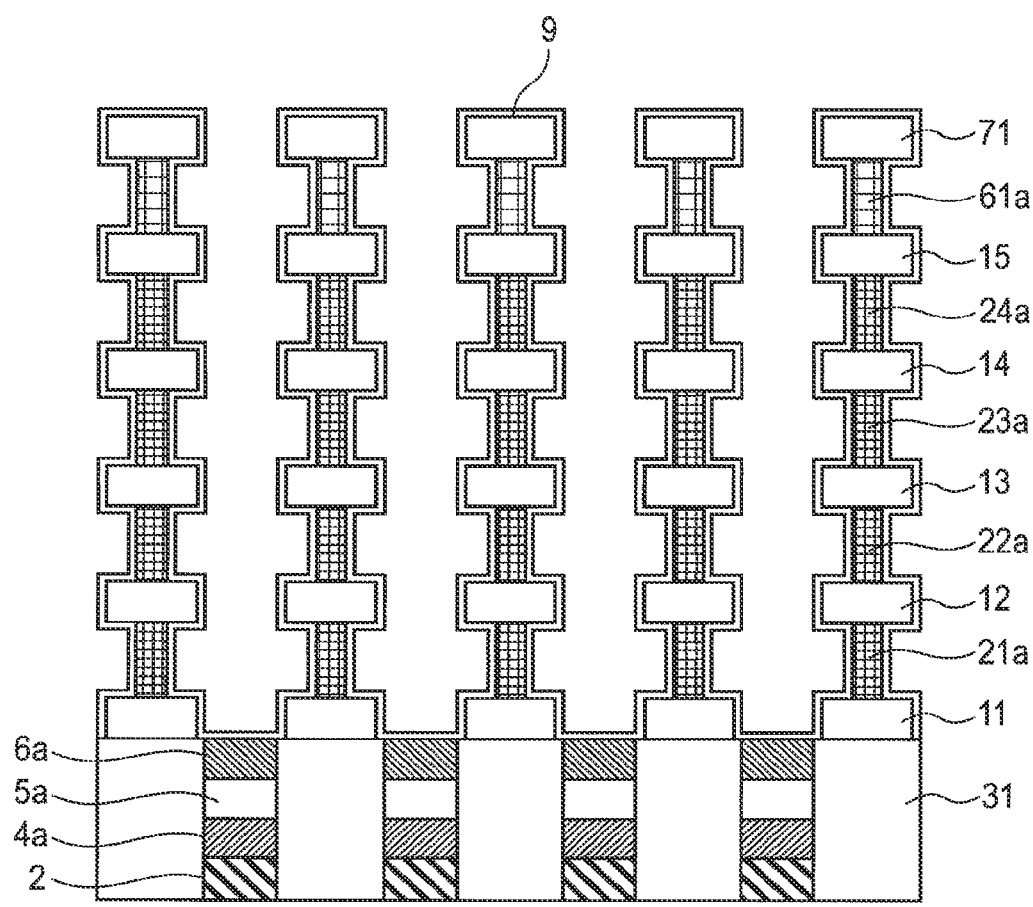
FIG. 61 is a partial three dimensional schematic view illustrating one example of the method for manufacturing the semiconductor storage device in the embodiment 2 of this invention.
Figure 62:
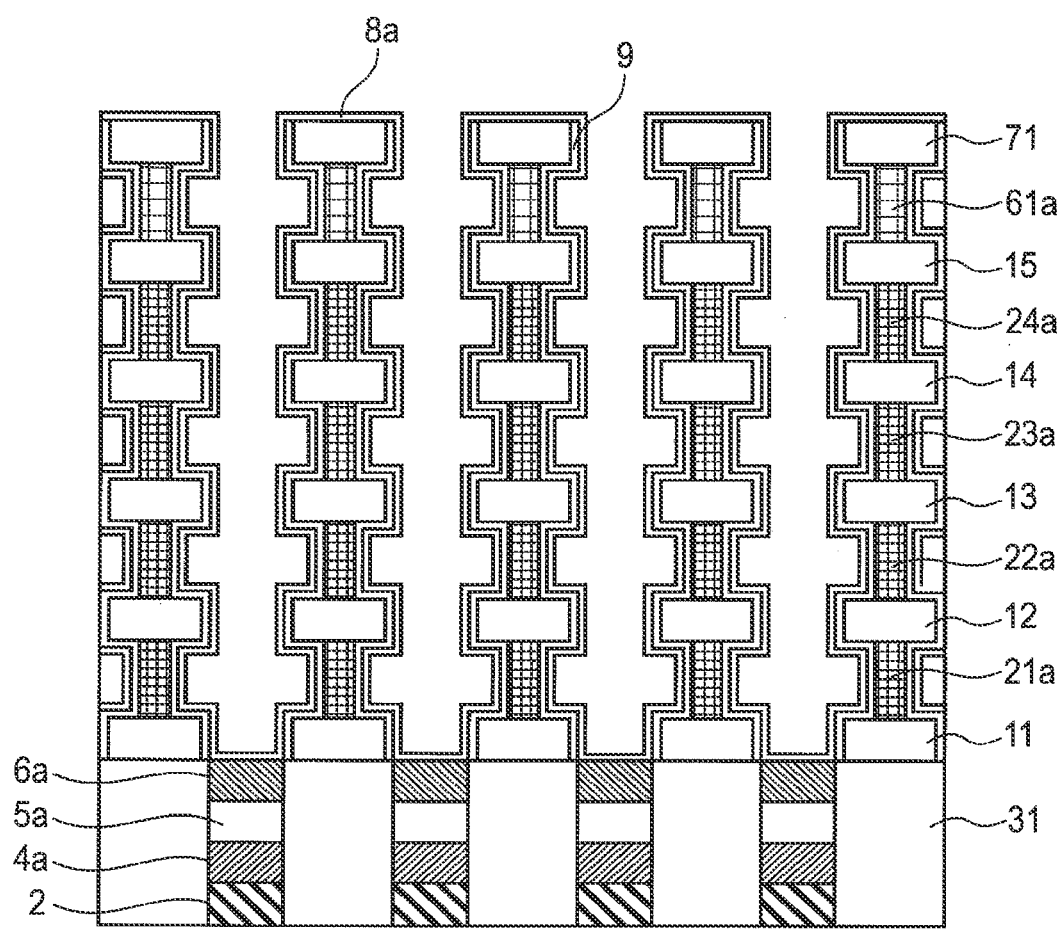
FIG. 62 is a partial three dimensional schematic view illustrating one example of the method for manufacturing the semiconductor storage device in the embodiment 2 of this invention.

After the process in FIG. 36, when the stacked film layer made of the insulator film layer 11, the amorphous silicon layer 21a, the insulator film layer 12, the amorphous silicon layer 22a, the insulator film layer 13, the amorphous silicon layer 23a, the insulator film layer 14, the amorphous silicon layer 24a, the insulator film layer 15, the amorphous silicon layer 61 and the insulator film layer 71 is patterned in a stripe shape, the amorphous silicon is isotropically etched as illustrated in FIG. 60 to form constriction of the amorphous silicon 21a, 22a, 23a, 24a, 61a. As illustrated in FIG. 61, the insulator film layer 9 is formed so as not to completely plug the space. Thereafter, as illustrated in FIG. 62, the insulator film 9 above the insulator film 71 and the insulator film 9 on the upper surface of the amorphous silicon 6a are removed by the etch back, and the amorphous silicon layer 8a turning into the channel polysilicon layer 8p is formed.

Figure 63:
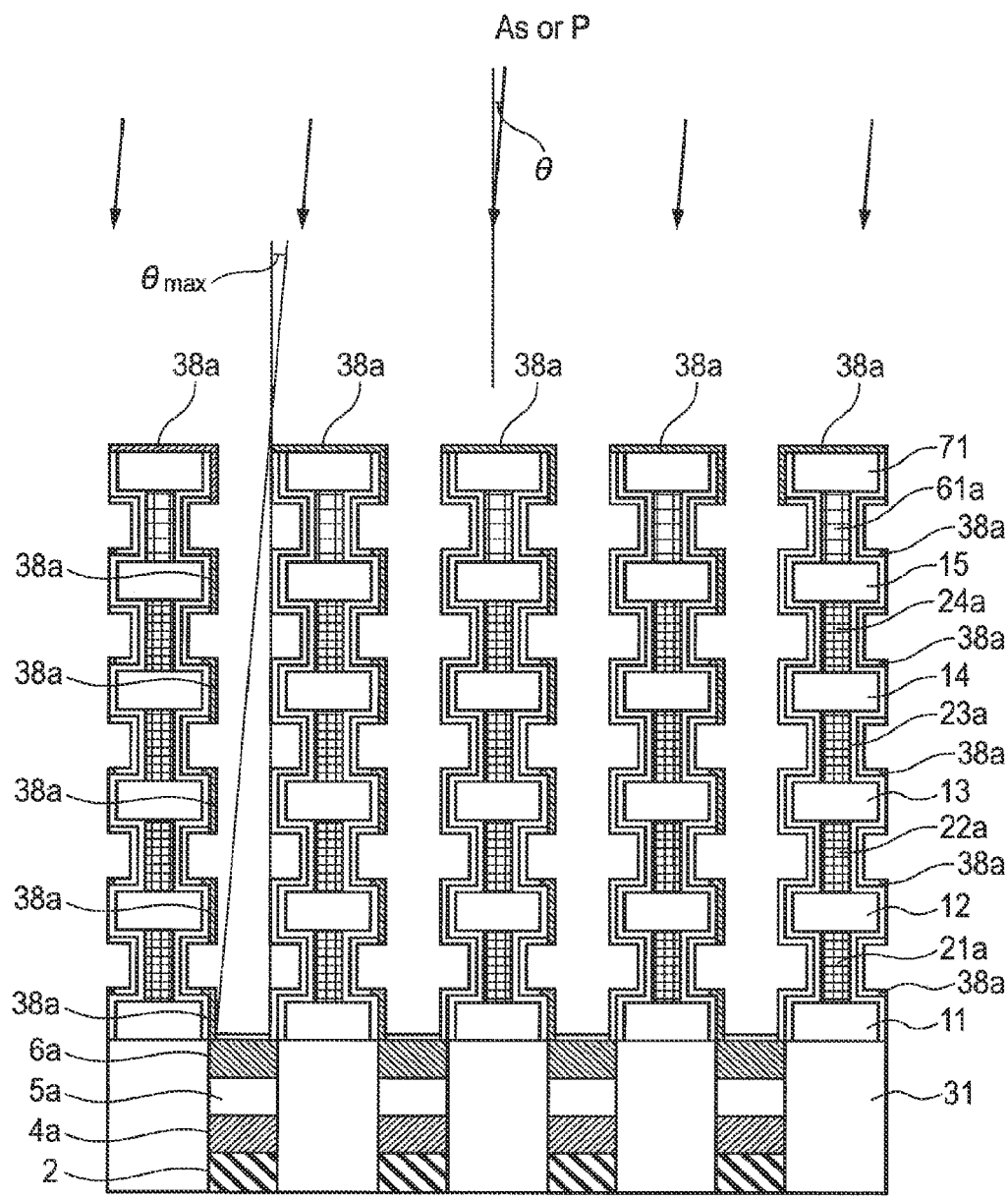
FIG. 63 is a partial three dimensional schematic view illustrating one example of the method for manufacturing the semiconductor storage device in the embodiment 2 of this invention.
Figure 64:
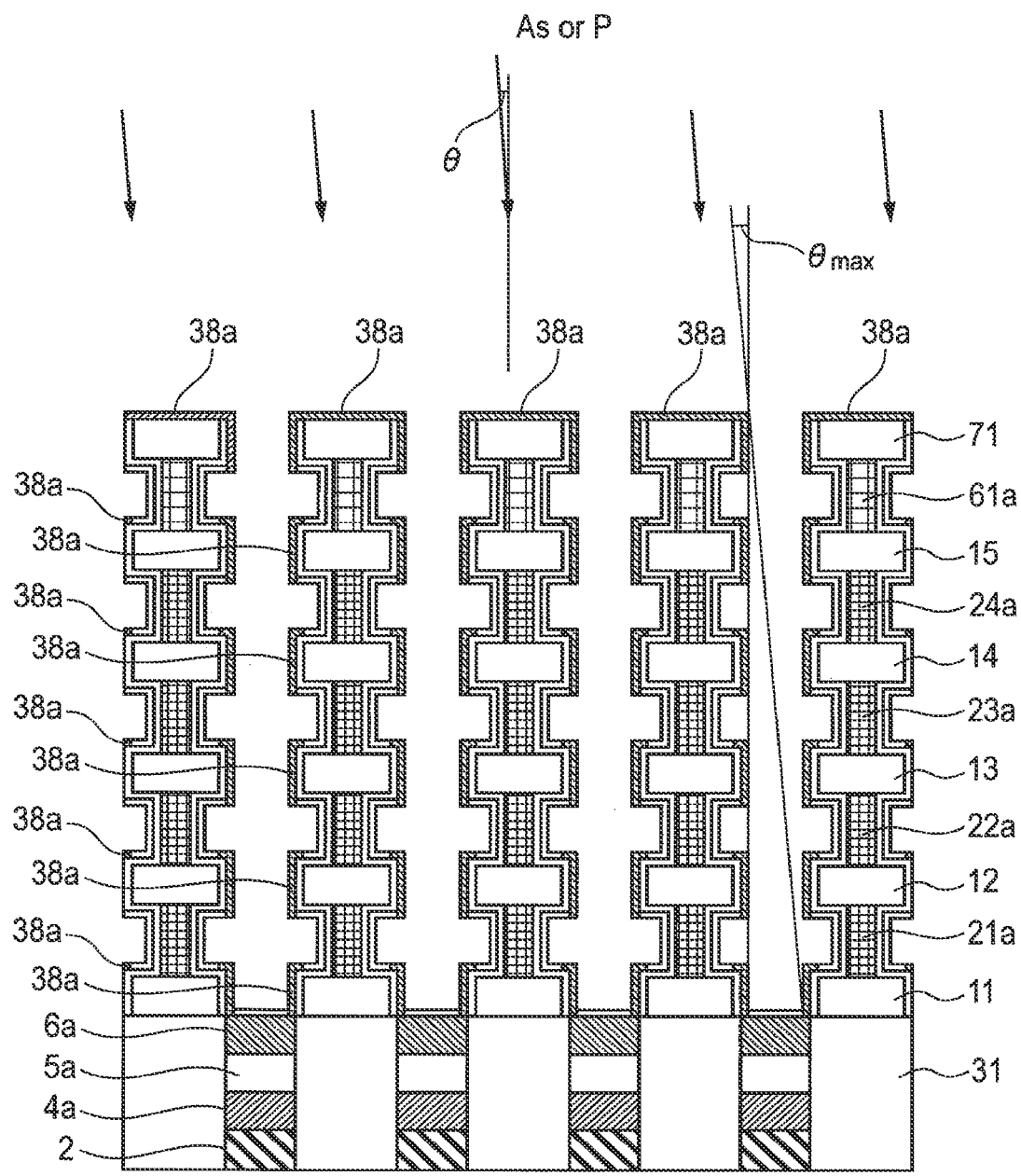
FIG. 64 is a partial three dimensional schematic view illustrating one example of the method for manufacturing the semiconductor storage device in the embodiment 2 of this invention.
Figure 65:
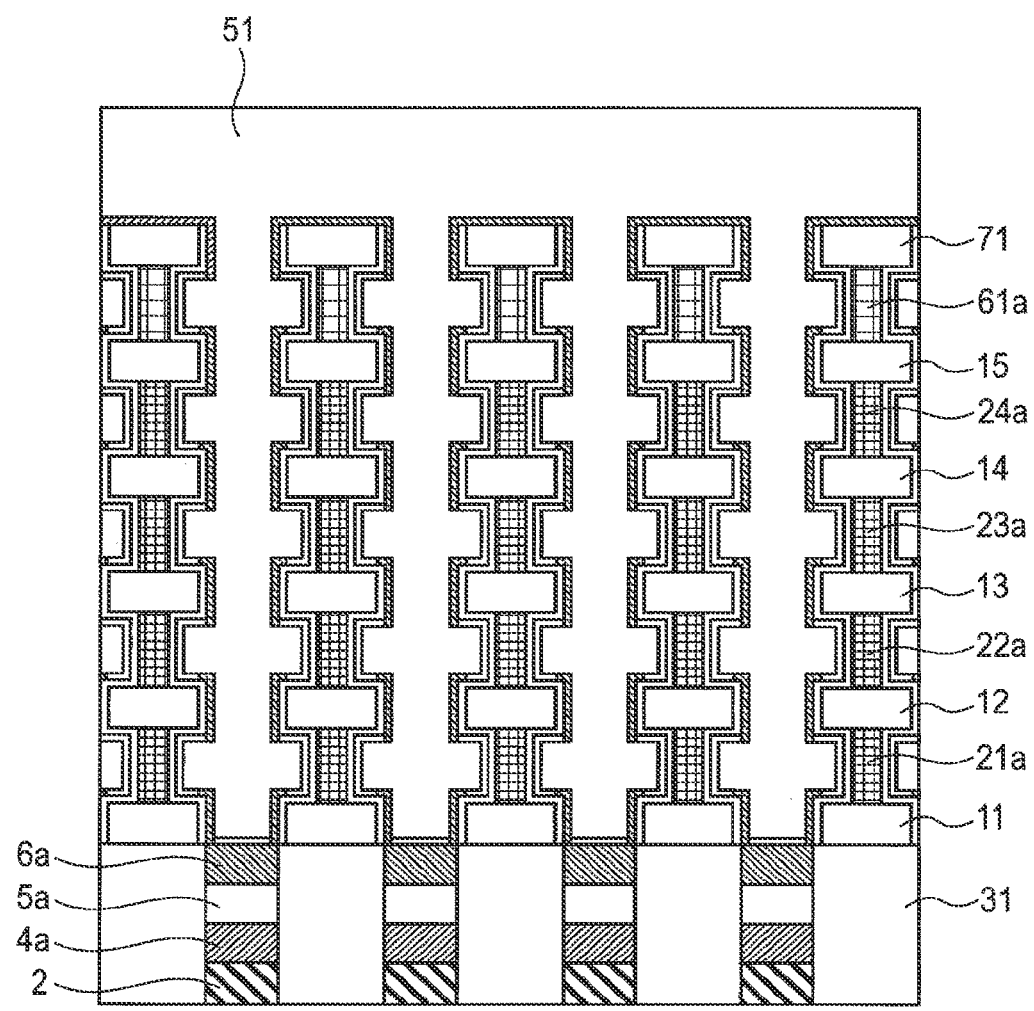
FIG. 65 is a partial three dimensional schematic view illustrating one example of the method for manufacturing the semiconductor storage device in the embodiment 2 of this invention.

Subsequently, as illustrated in FIG. 63, tilted ion implantation of As or P is performed at an angle θ from the direction perpendicular to the silicon substrate which has smaller slope than the angle θMAX. As or P, which is an n-type impurity, is doped to the amorphous silicon layer 8a on the right sidewalls of the insulator film layers 11, 12, 13, 14, 15, 71 and the amorphous silicon layer 8a at the upper surface of the insulator film layer 71. This is performed for reducing the resistance of the n-type polysilicon layer 38p on the right sidewalls and facilitating the flow of current flowing through the n-type polysilicon layer 38p. Subsequently, as illustrated in FIG. 64, the tilted ion implantation of As or P is performed in the reverse direction to FIG. 63. As or P, which is an n-type impurity, is doped to the amorphous silicon layer 8a at the left sidewalls of the insulator film layers 11, 12, 13, 14, 15, 71 and the amorphous silicon layer 8a on the upper surface of the insulator film layer 71. Subsequently, as illustrated in FIG. 65, the insulator film layer 51 is formed so as to completely plug the space.

Figure 66:
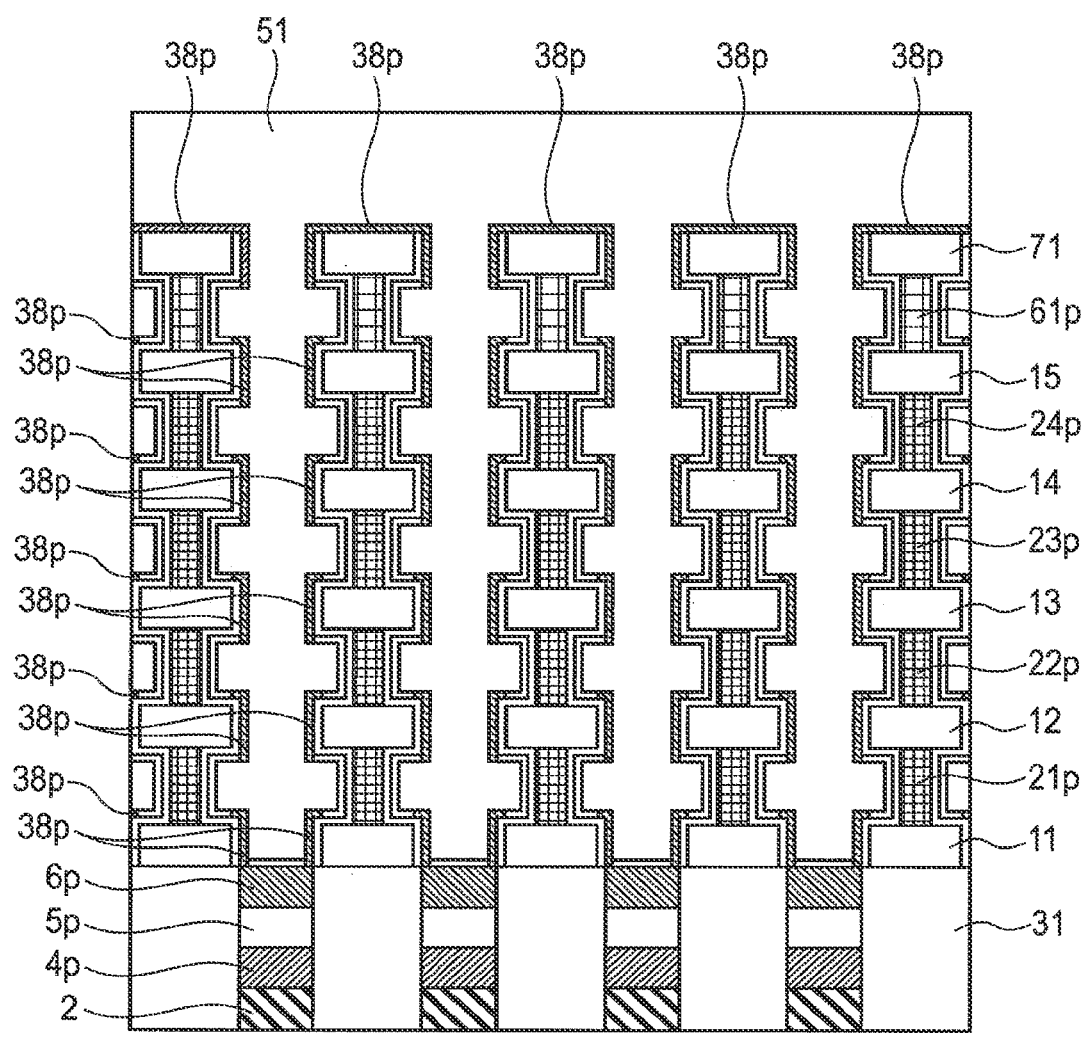
FIG. 66 is a partial three dimensional schematic view illustrating one example of the method for manufacturing the semiconductor storage device in the embodiment 2 of this invention.

Subsequently, crystallization of amorphous silicon layers 4a, 5a, 6a, 8a, 38a, 21a, 22a, 23a, 24a and activation of impurities included in the amorphous silicon layers are performed by annealing, and then the insulator film 51 is removed. As illustrated in FIG. 66, the amorphous silicon layers 4a, 5a, 6a, 8a, 38a, 21a, 22a, 23a, 24a turn into polysilicon layers 4p, 5p, 6p, 8p, 38p, 21p, 22p, 23p, 24p, respectively.

Figure 67:
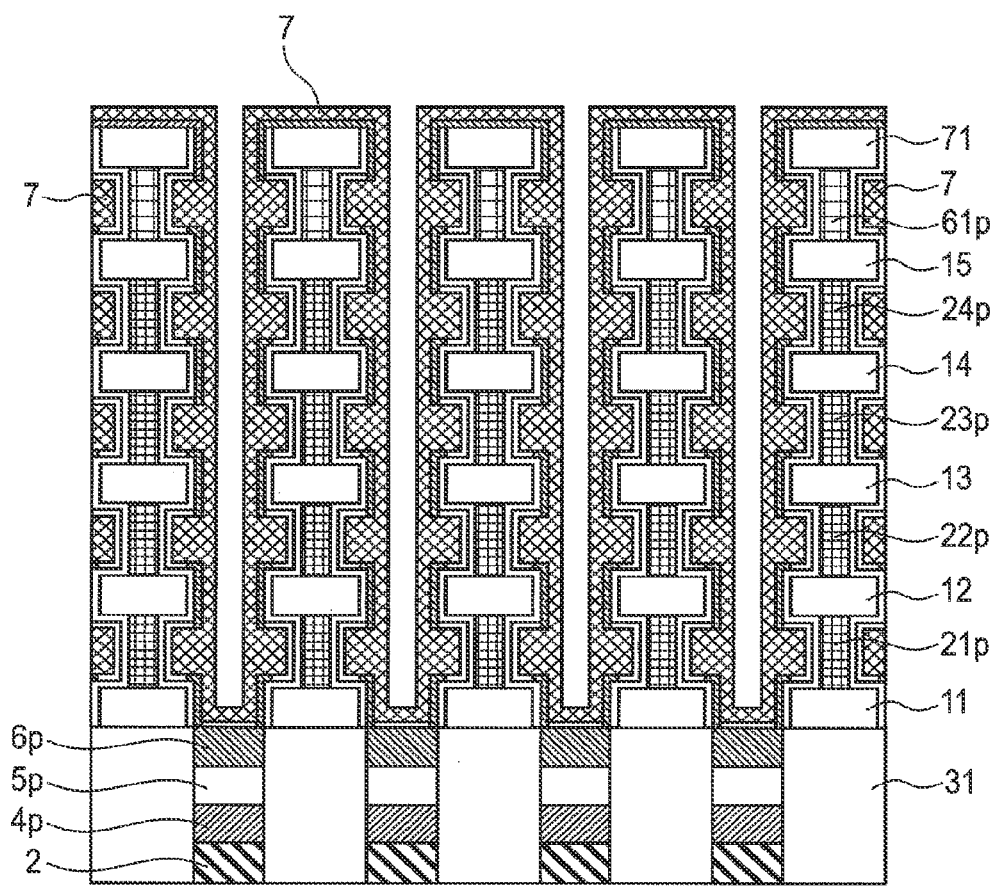
FIG. 67 is a partial three dimensional schematic view illustrating one example of the method for manufacturing the semiconductor storage device in the embodiment 2 of this invention.
Figure 68:
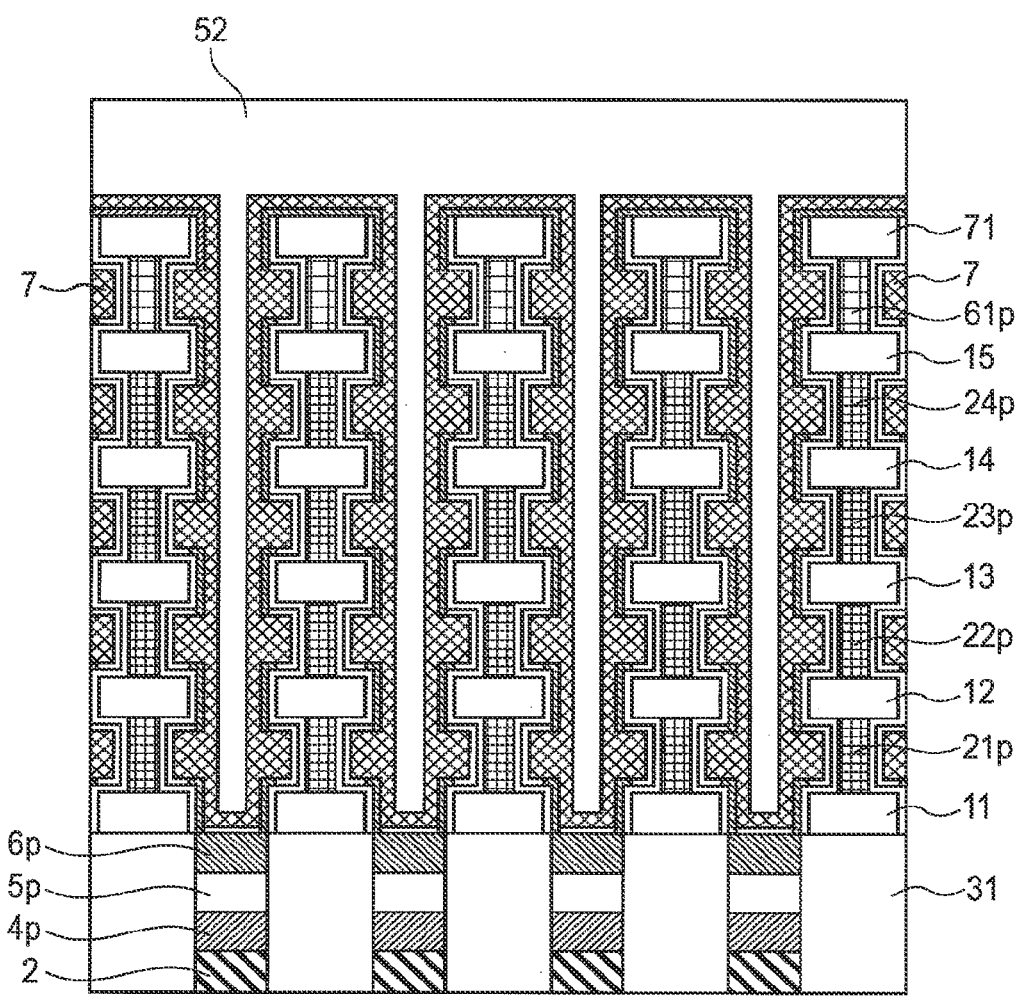
FIG. 68 is a partial three dimensional schematic view illustrating one example of the method for manufacturing the semiconductor storage device in the embodiment 2 of this invention.
Figure 69:
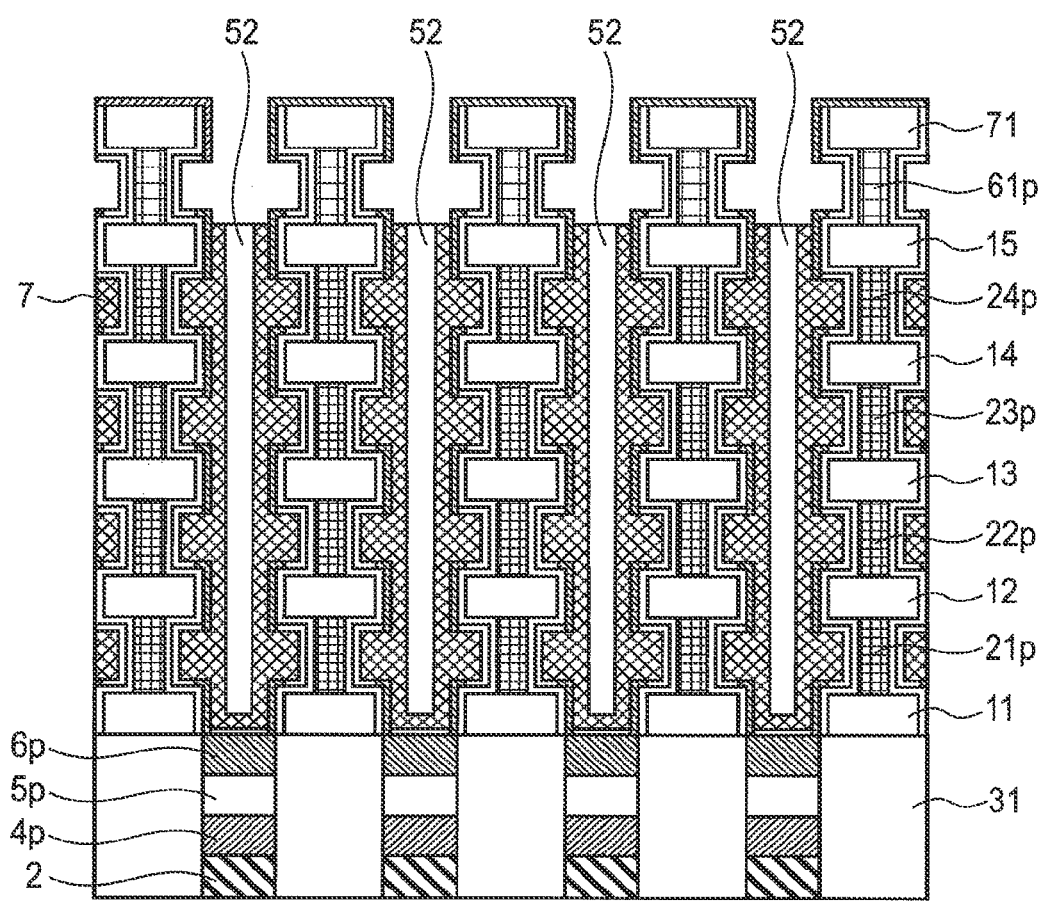
FIG. 69 is a partial three dimensional schematic view illustrating one example of the method for manufacturing the semiconductor storage device in the embodiment 2 of this invention.

Subsequently, as illustrated in FIG. 67, the phase change material layer 7 is formed so as not to completely plug the space. Subsequently, as illustrated in FIG. 68, the insulator film layer 52 is formed so as to completely plug the space. Subsequently, as illustrated in FIG. 69, an altitude of the top surface of the phase change material layer 7 is set lower than that of the top surface of the insulator film layer 15 and set higher than that of the lowest layer by the etch back. A part of the insulator film layer 52 is also removed at the same time.

Figure 70:
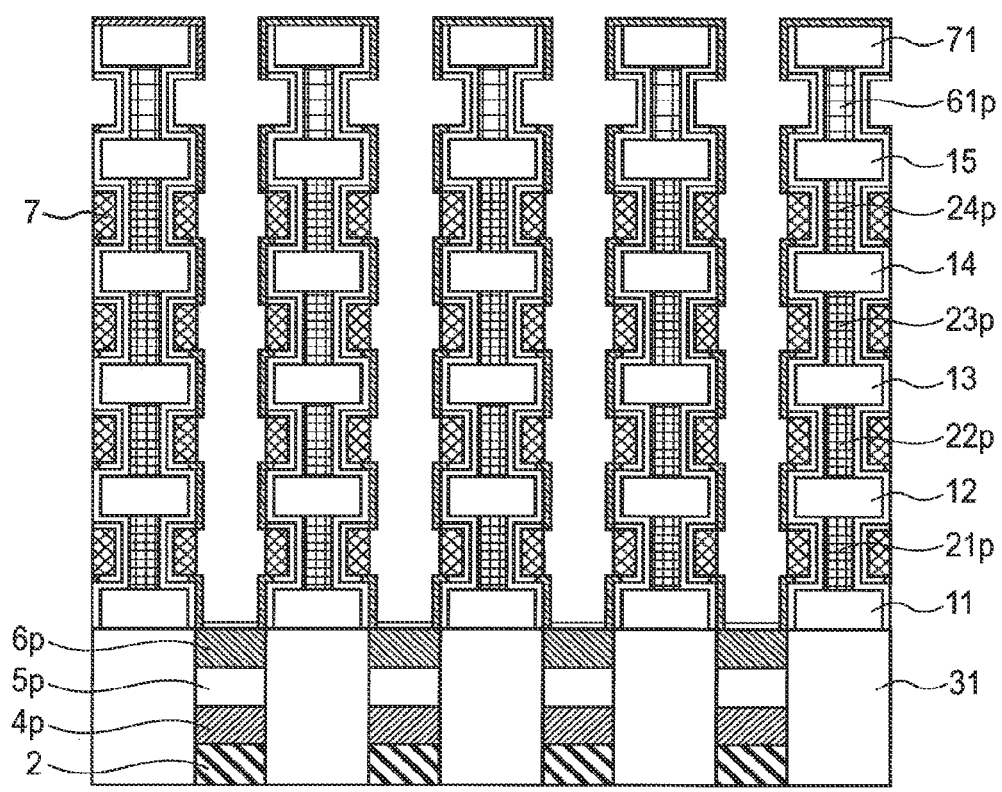
FIG. 70 is a partial three dimensional schematic view illustrating one example of the method for manufacturing the semiconductor storage device in the embodiment 2 of this invention.
Figure 71:
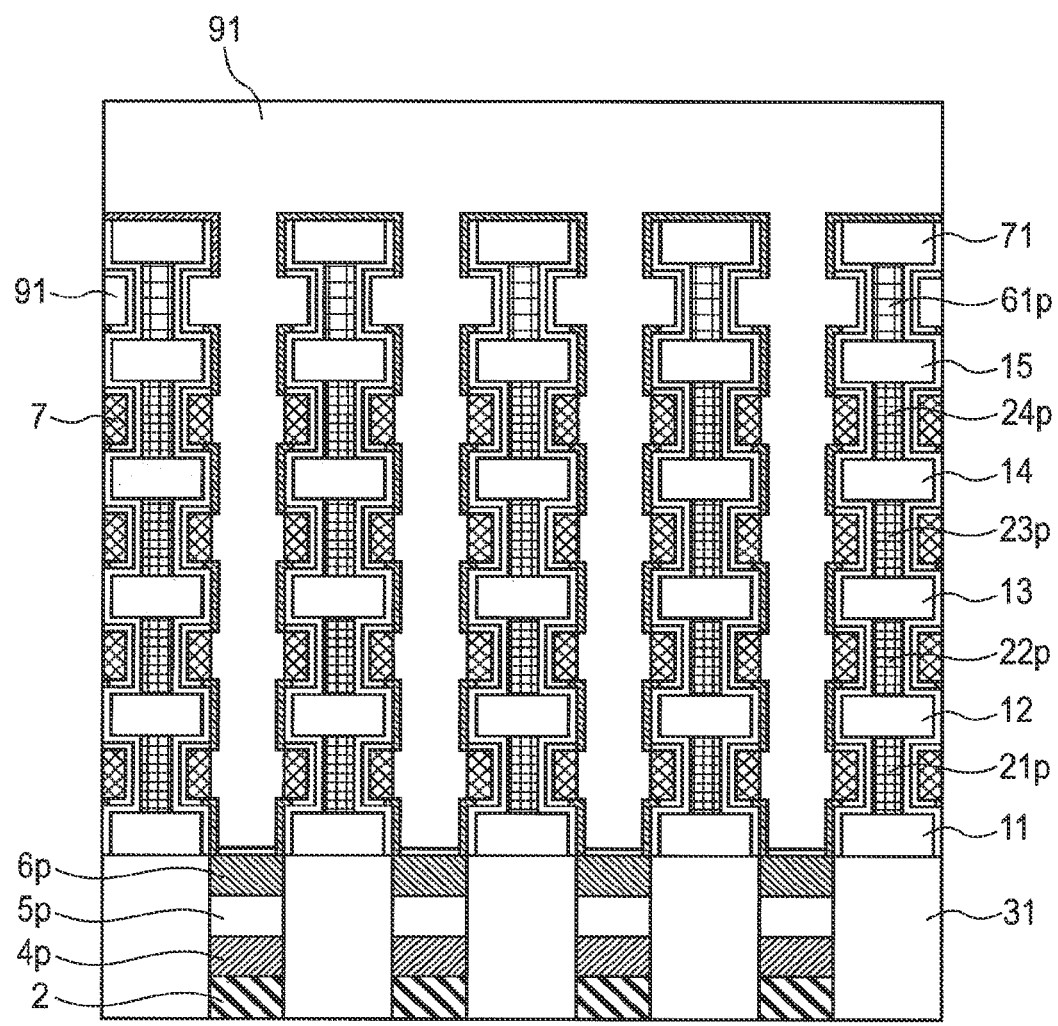
FIG. 71 is a partial three dimensional schematic view illustrating one example of the method for manufacturing the semiconductor storage device in the embodiment 2 of this invention.
Figure 72:
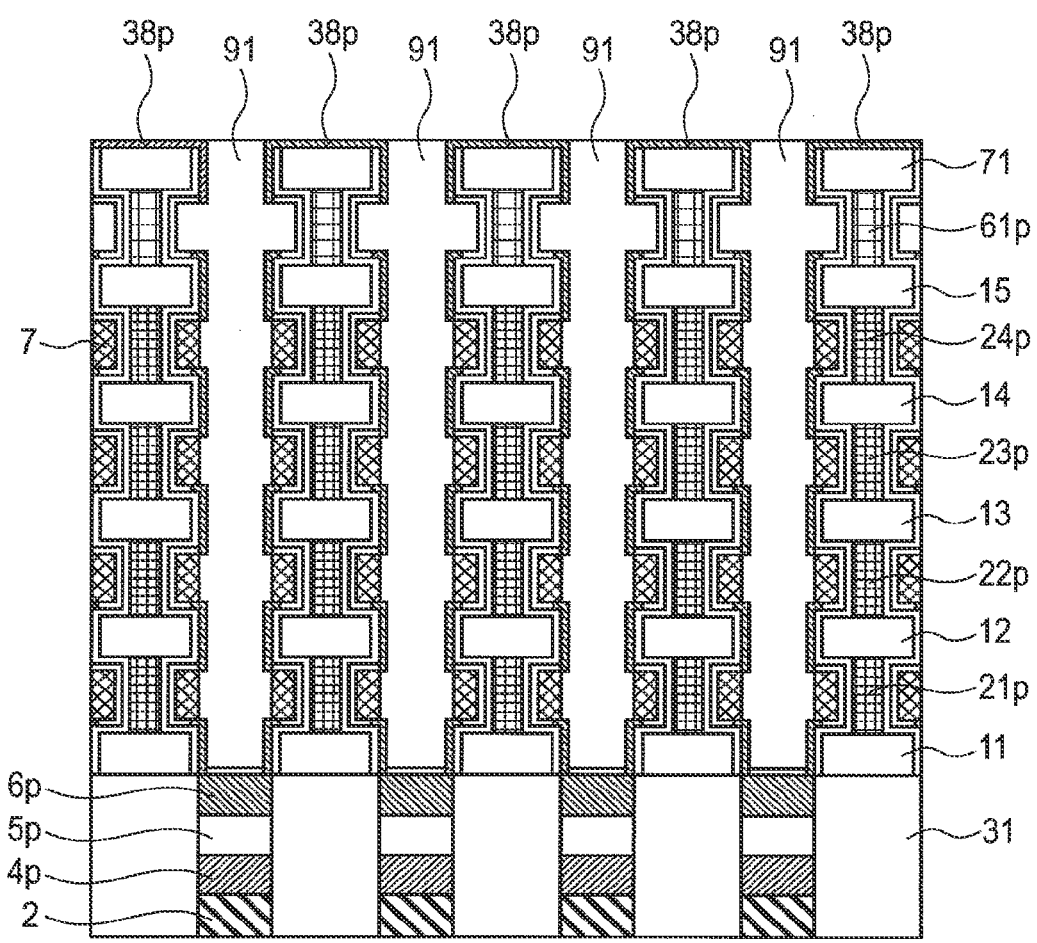
FIG. 72 is a partial three dimensional schematic view illustrating one example of the method for manufacturing the semiconductor storage device in the embodiment 2 of this invention.

Subsequently, as illustrated in FIG. 70, the insulator film 52 is removed and the phase change material layer 7 is made to remain on the sidewalls of the gate polysilicon 21p, 22p, 23p, 24p. Further, as illustrated in FIG. 71, the insulator film layer 91 is embedded and, as illustrated in FIG. 72, the top surface of the polysilicon layer 38p is exposed by the etch back.

Figure 73:
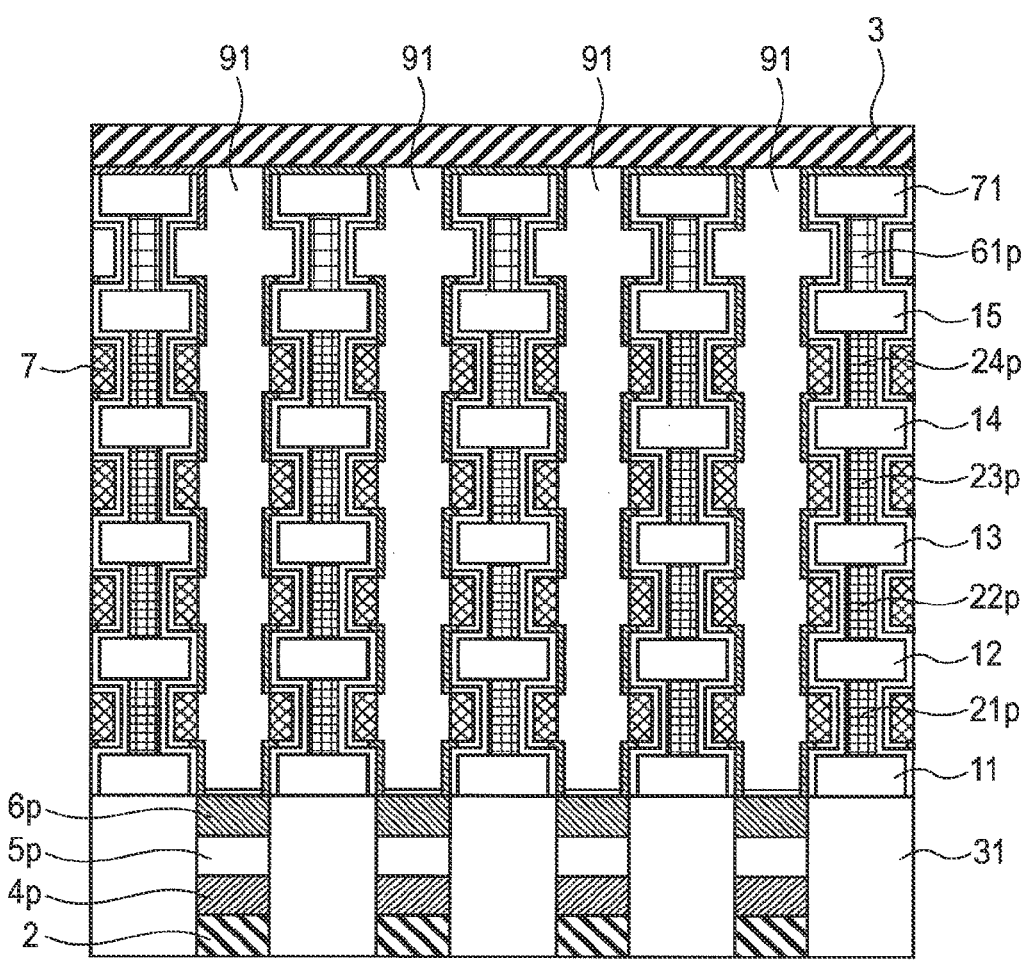
FIG. 73 is a partial three dimensional schematic view illustrating one example of the method for manufacturing the semiconductor storage device in the embodiment 2 of this invention.

Thereafter, BLC in FIG. 31, that is, the contact BLC for connecting the bit line 3 and the peripheral circuit previously formed above the semiconductor substrate is formed. Subsequently, as illustrated in FIG. 73, a film of a material that is patterned to the bit line 3 later is formed.

Figure 74:
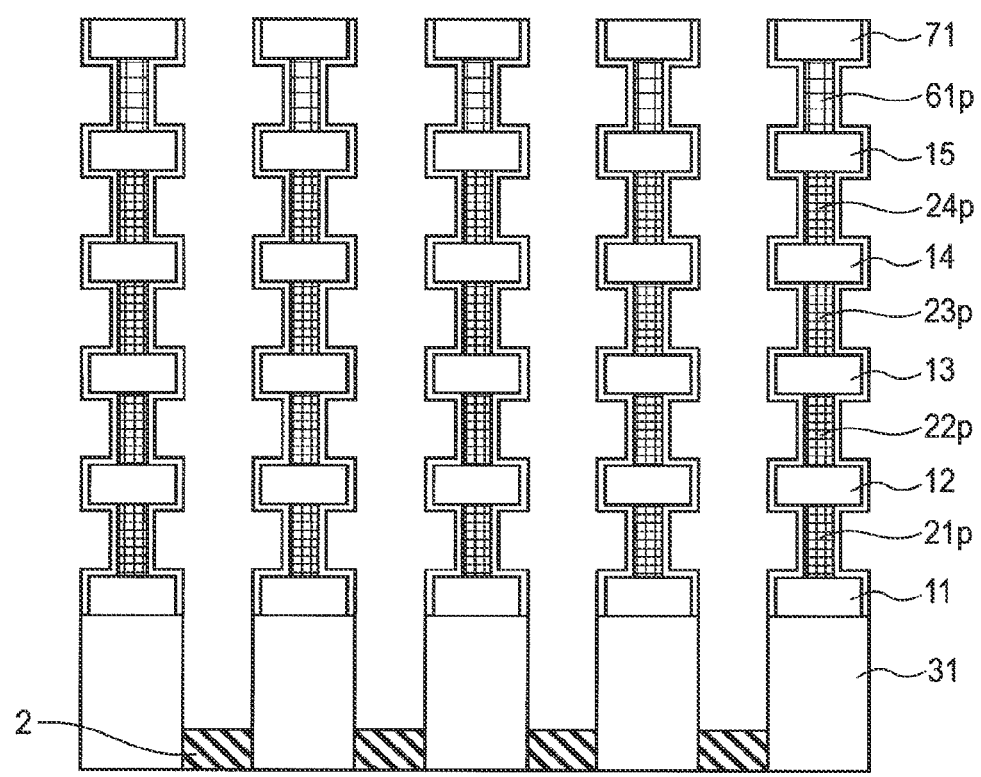
FIG. 74 is a partial three dimensional schematic view illustrating one example of the method for manufacturing the semiconductor storage device in the embodiment 2 of this invention.

The material that is patterned to the bit line 3 later, and the n-type polysilicon layer 38p, the insulator film layer 92, the channel polysilicon layer 8p, the phase change material layer 7, the insulator film layer 91, and the polysilicon layers 6p, 5p, 4p are patterned in a stripe shape extending in the direction perpendicular to the word line 2. When the bit line 3 is patterned in the stripe shape, the patterned parts of the stacked film made of the gate polysilicon layers 21p, 22p, 23p, 24p, 61p and the insulator film layers 11, 12, 13, 14, 15, 71 and the gate insulator film layer 9 remain without patterning. However, the patterned parts of the channel polysilicon layer 8p, 38p and the phase change material layer 7 are removed. The polysilicon diode PD above the word line 2 is collectively removed at the same time as the above-described stripe shape patterning, and turn into a space part. A section along the word line 2 is as illustrated in FIG. 73, and a section along the space of the word line 2 is as illustrated in FIG. 74.

In the drawings of the embodiment 2, the example of stacking four layers of the gate polysilicon layer of the memory cell is illustrated. However, the number of the stacked layers can be 5 or more.

Similar to the embodiment 1, also in the semiconductor storage device in the embodiment 2, patterning processes per unit memory cell can be reduced and the number of the processes can be reduced because the gate insulator films and the phase change material layers can be formed at the same time even when the number of the stacked layers is increased. As a result, the bit cost by stacking can be effectively reduced.

When constitution in which the diodes 4p-6p formed in the lower layer is also collectively patterned at the same time is used, the bit cost can be effectively reduced by stacking because the number of processes per unit cell can be further reduced.

Compared to the embodiment 1, the bit cost can be further reduced when the number of stack layers is the same as the embodiment 1 because two vertical type chain memories can be formed in a region where the word line 2 and the bit line 3 intersect each other.

Embodiment 3

In the embodiment 3, an example which realizes a high density memory by further stacking the vertical type chain memory being a stacked memory is shown.

Figure 75:
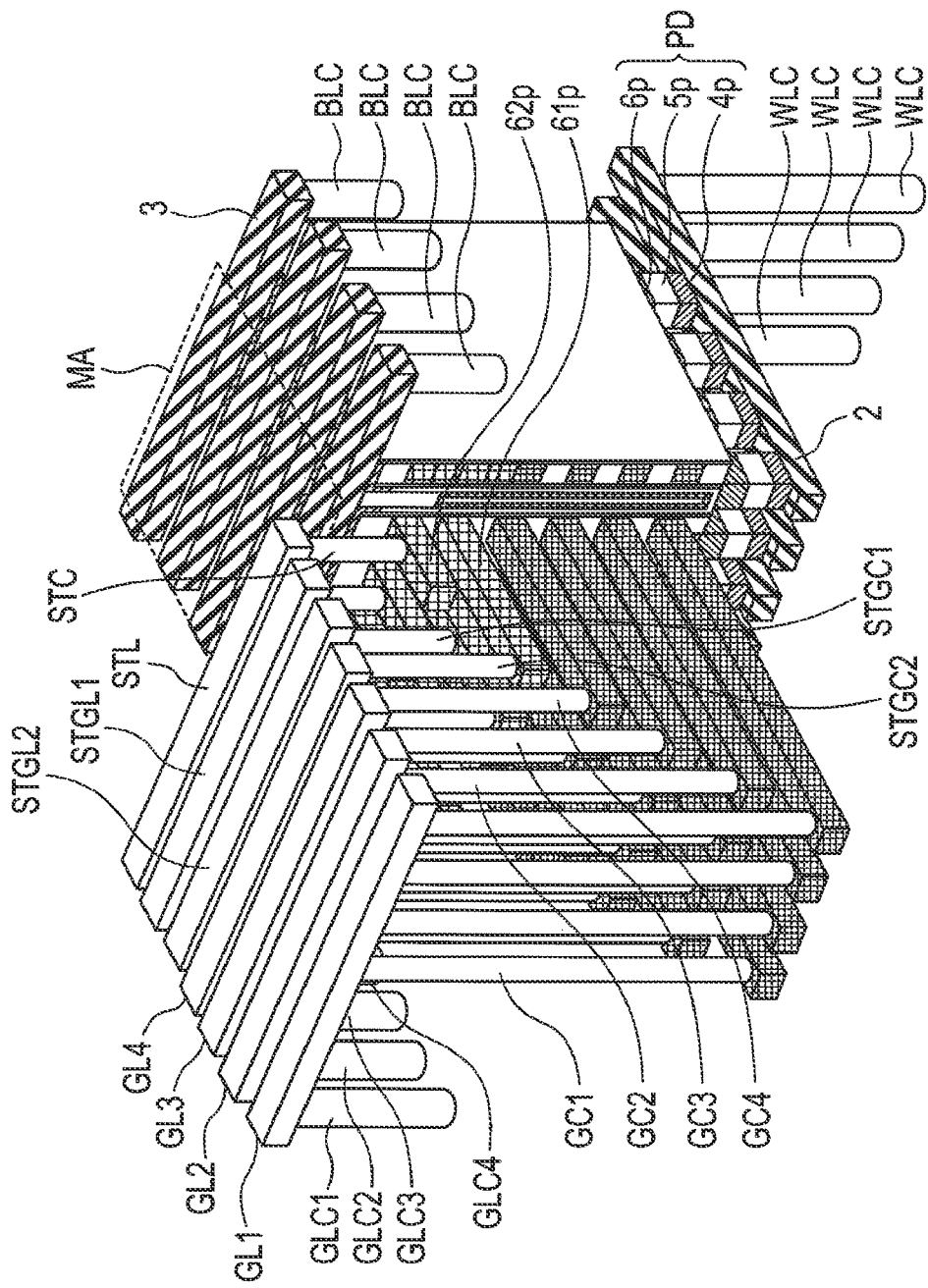
FIG. 75 is a partial three dimensional schematic view of a semiconductor storage device in a embodiment 3 of this invention.

FIG. 75 is a partial three dimensional schematic view of the semiconductor storage device in the embodiment 3, and the view illustrates an extracted part of one layer of the vertical type chain memory which is stacked.

FIG. 75 illustrates a part of the memory cell array, wires and contacts. The part constituting by the word line 2 made of a metal wire; the contact hole WLC connecting the word line 2 and the line selector illustrated in FIG. 1; the polysilicon diode PD made of the polysilicon layer 4p in which a p-type impurity is doped, the polysilicon layer 5p in which a low concentration impurity is doped and the polysilicon layer 6p in which an n-type impurity is doped; the gate polysilicon layers 21p, 22p, 23p, 24p of the memory cell; the gate polysilicon layer 61p of the select transistor; a gate polysilicon 62p of a layer select transistor; the metal wires GL1, GL2, GL3, GL4 for supplying electricity to the gate polysilicon layers of the memory cells; the metal wires STGL1, STGL2 for supplying electricity to the gate polysilicon layer 61p of the select transistor; a metal wire STL for supplying electricity to the gate polysilicon layer 61p of the layer select transistor; the contacts GC1, GC2, GC3, GC4 for connecting the gate polysilicon layers 21p, 22p, 23p, 24p and the metal wires GL1, GL2, GL3, GL4 of the memory cell, respectively; the contacts STGC1, STGC2 for connecting the gate polysilicon layer 61p of the select transistor and the wires STGL1, STGL2; a contact STC for connecting the gate polysilicon layer 62p of the layer select transistor and the wire STL; GLC1, GLC2, GLC3 and GLC4 for connecting the wires GL1, GL2, GL3, GL4 and the line selector, respectively; STGLC1 and STGLC2 for connecting the wires STGL1, STGL2 and the line selector; STLC for connecting the wire STL and the line selector; the bit line 3 made of a metal wire; the contact hole BLC for connecting the bit line 3 and the line selector illustrated in FIG. 1; the insulator film layer 11 between the polysilicon diode PD and the gate polysilicon layer 21; the insulator film layers 12, 13, 14, 15, 71 between the gate polysilicon layers; and an insulator film 72 between the gate polysilicon layer 62p and the bit line 3 is illustrated. Although a part of the constituents, that is, STGLC1, STGLC2 and STLC are not illustrated because STGLC1, STGLC2 and STLC are hidden by the wires GL1, GL2 and the like, STGLC1, STGLC2 and STLC are connected to the lower part of STGL1, STGL2 and STL respectively, similar to GLC1, GLC2, GLC3, and GLC4 being connected to the lower part of GL1, GL2 and GL3, and GL4, respectively.

Figure 76:
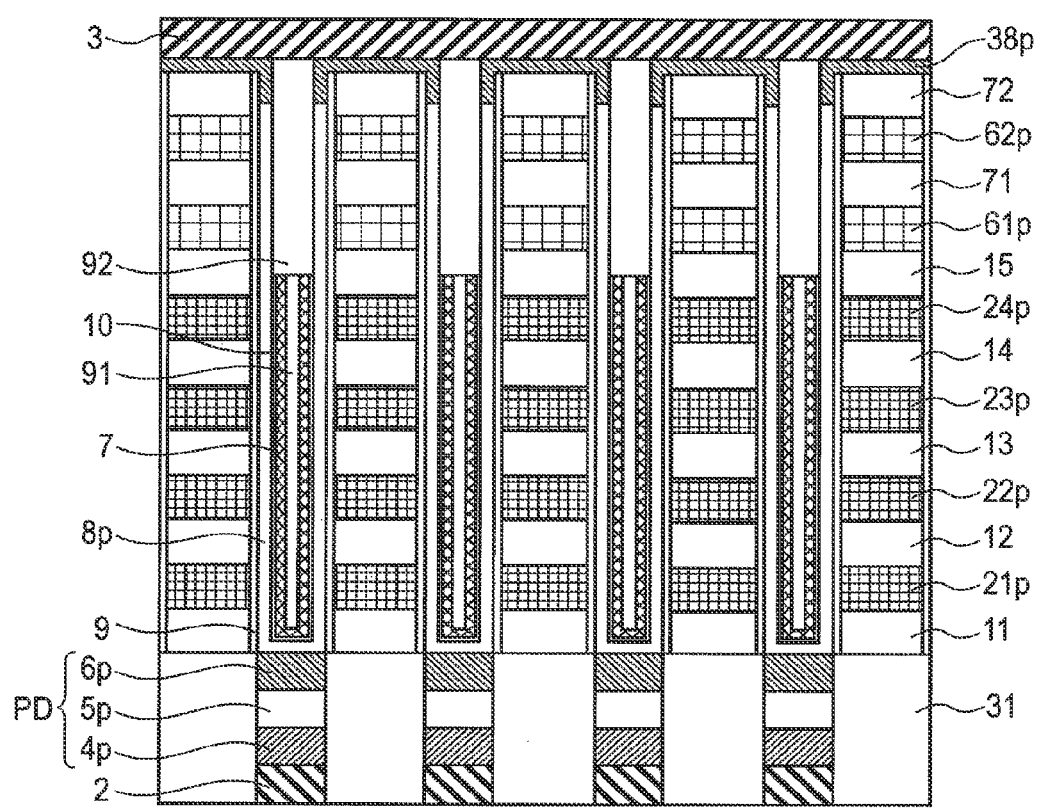
FIG. 76 is a partial cross-sectional view of a memory cell array in the embodiment 3 of this invention.

FIG. 76 is a cross-sectional view taken in parallel with the bit line 3, and the view illustrates a part of the memory array MA particularly extracted from FIG. 75. This structure is different from the structure of the embodiment 2 in that the gate polysilicon layer 62p is added. Above a plurality of word lines 2, the polysilicon diodes PD are periodically formed in an extending direction of the word lines 2. A stacked film made of the gate polysilicon layers 21p, 22p, 23p, 24p, 61p, 62p and the insulator film layers 11, 12, 13, 14, 15, 71, 72 is patterned in a stripe shape in a direction parallel to the word line 2. The line parts of the stripe of the stacked film made of the gate polysilicon layers 21p, 22p, 23p, 24p, 61p, 62p and the insulator film layers 11, 12, 13, 14, 15, 71, 72 are arranged just above the spaces between the word lines, and the space parts of the stripe of the insulator film layers of the gate polysilicon layers 21p, 22p, 23p, 24p, 61p, 62p and the insulator film layers 11, 12, 13, 14, 15, 71, 72 are arranged just above the word lines. The bit lines 3 are the stripe shape extending in the direction perpendicular to the word lines 2, and are arranged above the insulator film 72 through the n-type polysilicon 38p.

In the lower part of the bit lines 3 in the space parts of the stacked film made of the gate polysilicon layers 21p, 22p, 23p, 24p, 61p, 62p and the insulator film layers 11, 12, 13, 14, 15, 71, 72, the gate insulator film 9, the channel polysilicon layer 8p, an insulator film layer 10, and the phase change material layer 7 are stacked in this order on the sidewalls of the gate polysilicon layers 21p, 22p, 23p, 24p, the sidewalls of the insulator film layers 11, 12, 13, 14 and on the lower part of the sidewall of the insulator film 15. The insulator film layer 91 is embedded between the both surfaces of the phase change material layer 7. Further, the gate insulator film layer 9 and the channel polysilicon layer 8p are stacked on the upper part of the sidewall of the insulator film layer 15 and on the sidewalls of the gate polysilicon layer 61p, the insulator film layer 71, the gate polysilicon layer 62p, and the insulator film layer 72. The insulator film layer 92 is embedded between the both surfaces of the channel polysilicon layer 8p. An altitude of the lowest surface of the insulator film layer 92 is set lower than the altitude of the top layer of the insulator film layer 15 and set higher than the altitude of the lowest layer of the insulator film layer 15. This structure is made because of the same reason as described in FIG. 44.

At the bottom part of the lower part of the bit line 3 in the space of the stacked film made of the gate polysilicon layers 21p, 22p, 23p, 24p, 61p, 62p and the insulator film layers 11, 12, 13, 14, 15, 71, 72, the upper surface of the polysilicon layer 6p and the channel polysilicon layer 8p are contacted. The bit line 3 communicates with the polysilicon diode PD through the polysilicon layer 38p and the channel polysilicon layer 8p which are formed on the both side surfaces of the stacked film made of made of the gate polysilicon layers 21p, 22p, 23p, 24p, 61p, 62 and the insulator film layers 11, 12, 13, 14, 15, 71, 72.

As similar to FIG. 52, stripe shape patterning is performed in the bit line direction. When the bit line 3 is patterned in the stripe shape, the patterned parts of the stacked film made of the gate polysilicon layers 21p, 22p, 23p, 24p, 61p, 62p and the insulator film layers 11, 12, 13, 14, 15, 71, 72 and the gate insulator film layer 9 remain without patterning. However, the patterned parts of the channel polysilicon layer 8p, 38p, the phase change material layer 7, and the insulator film layer 10 are removed. The polysilicon diode PD above the word line 2 is collectively removed at the same time with the above-described stripe shape patterning, and turns into a space part. Thereafter, an insulator body is formed in a space part generated from the above-described stripe shape patterning.

Figure 77:
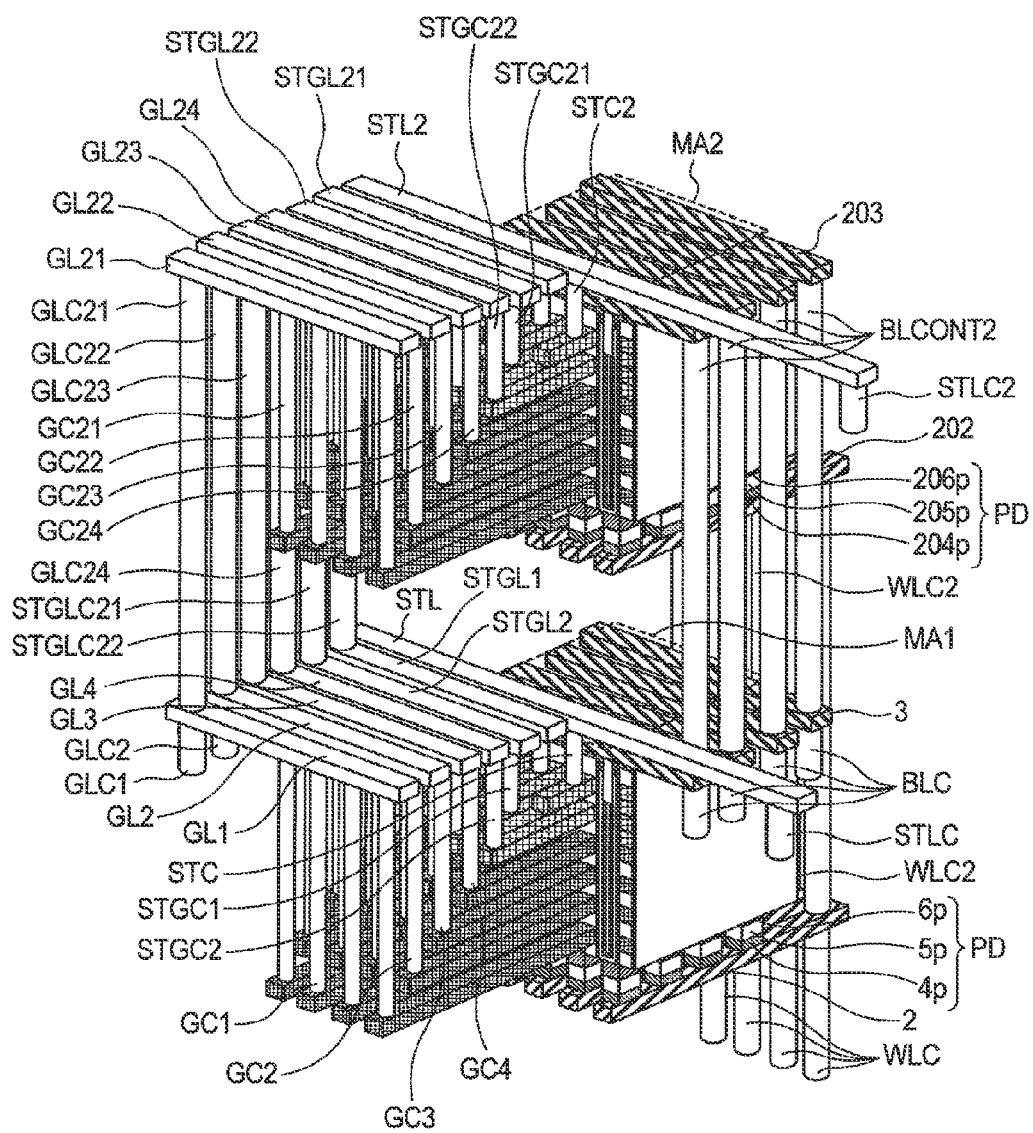
FIG. 77 is a partial three dimensional schematic view of the semiconductor storage device in the embodiment 3 of this invention.
Figure 78:
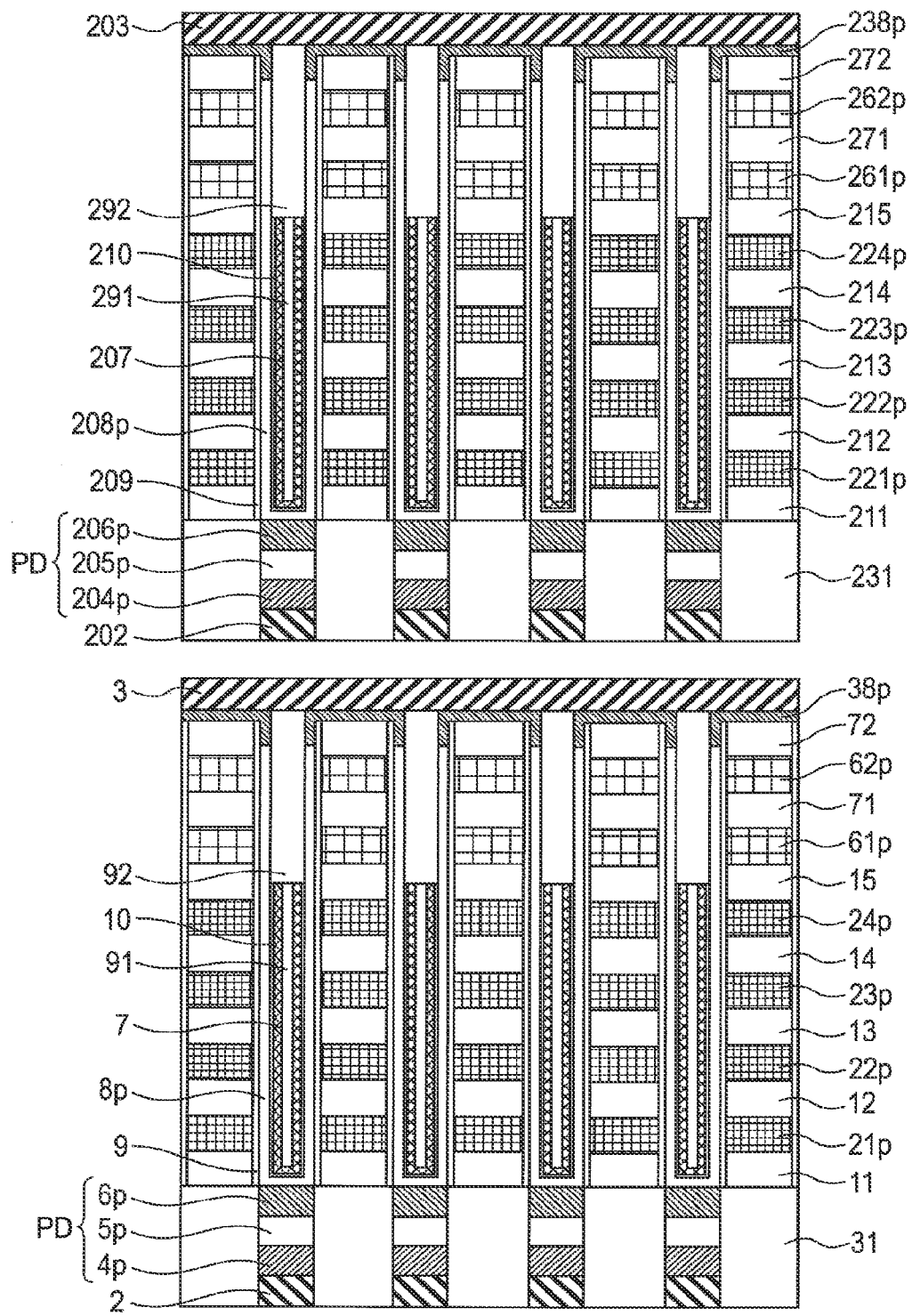
FIG. 78 is a partial cross-sectional view of the memory cell array in the embodiment 3 of this invention.

In the embodiment 3, the vertical type chain memory in FIG. 75 is stacked as illustrated in FIG. 77, and the wires are connected with each other. Similar to the first layer, in a second layer of the vertical type chain memory layer in FIG. 77, that is, in the upper layer of the chain memory layer, a word line 202 made of a metal wire; a contact hole WLC2 connecting the word line 202 and the word line 2; a polysilicon diode PD made of a polysilicon layer 204p in which a p-type impurity is doped, a polysilicon layer 205p in which a low concentration impurity is doped and a polysilicon layer 206p in which an n-type impurity is doped; gate polysilicon layers 221p, 222p, 223p, 224p of a memory cell; a gate polysilicon layer 261p of a select transistor; a gate polysilicon 262p of a layer select transistor; metal wires GL21, GL22, GL23, GL24 for supplying electricity to the gate polysilicon layers of the memory cells; metal wires STGL21, STGL22 for supplying electricity to the gate polysilicon layer 261p of the select transistor; a metal wire STL2 for supplying electricity to the gate polysilicon layer of the layer select transistor; contacts GC21, GC22, GC23, GC24 for connecting the gate polysilicon layers 221p, 222p, 223p, 224p and the wires GL21, GL22, GL23, GL24 of the memory cells, respectively; contacts STGC21, STGC22 for connecting the gate polysilicon layer 261p of the select transistor and the wires STGL21, STGL22; a contact STC2 for connecting the gate polysilicon layer 262p of the layer select transistor and the wire STL2; GLC21, GLC22, GLC23 and GLC24 for connecting the wires GL21, GL22, GL23, GL24 and the wires GL1, GL2, GL3, GL4, respectively; STGLC21 and STGLC22 for connecting the wires STGL21, STGL22 and the wires STGL1, STGL2; STLC2 for contacting the wire STL2 and the line selector; the bit line 203 made of a metal wire; and a contact hole BLCONT2 for connecting the bit line 203 and the bit line 3 are illustrated in FIG. 77. FIG. 78 is a cross-sectional view taken in parallel with the bit line 3 and the bit line 203, and the view illustrates parts of the memory array MA1, MA2 extracted from FIG. 77.

As illustrated in FIG. 78, as similar to the first layer, polysilicon diodes PD are also periodically formed in the extending direction of the word lines 2 above a plurality of word lines 202 in the second layer of the vertical type chain memory. A stacked film made of the gate polysilicon layers 221p, 222p, 223p, 224p, 261p, 262p and the insulator film layers 211, 212, 213, 214, 215, 271, 272 is patterned in a stripe shape in a direction parallel to the word line 202. The line parts of the stripe of the stacked film made of the gate polysilicon layers 221p, 222p, 223p, 224p, 261p, 262p and the insulator film layers 211, 212, 213, 214, 215, 271, 272 are arranged just above the spaces between the word lines, and the space parts of the stripe of the insulator film layers of the gate polysilicon layers 221p, 222p, 223p, 224 p, 261p, 262p and the insulator film layers 211, 212, 213, 214, 215, 271, 272 are arranged just above the word lines 202. The bit lines 203 are the stripe shape extending in the direction perpendicular to the word lines, and are arranged above the insulator film 272 through the n-type polysilicon 38p.

In the lower part of the bit lines 203 in the space parts of the stacked film made of the gate polysilicon layers 221p, 222p, 223p, 224p, 261p, 262 p and the insulator film layers 211, 212, 213, 214, 215, 271, 272, an gate insulator film 209, the channel polysilicon layer 208p, an insulator film layer 210, and a phase change material layer 207 are stacked in this order on the sidewalls of the gate polysilicon layers 221p, 222p, 223p, 224p, on the sidewalls of the insulator film layers 211, 212, 213, 214 and on the lower part of the sidewall of an insulator film 215. An insulator film layer 291 for limiting a path in which current is flown to the phase change material layer 7 is embedded between the both surfaces of the phase change material layer 7. Further, the gate insulator film layer 209 and the channel polysilicon layer 208p are stacked on the upper part of the sidewall of the insulator film layer 215 and on the sidewalls of the gate polysilicon layer 261p, the insulator film layer 271, the gate polysilicon layer 262p, and the insulator film layer 272. The insulator film layer 292 is embedded between the both surfaces of the channel polysilicon layer 208p. The gate insulator film layer 209 and a channel polysilicon layer 238p are stacked on the upper part of the insulator film layer 272, and the insulator film layer 292 is embedded between the both surfaces of the channel polysilicon layer 208p. An altitude of the lowest surface of the insulator film layer 292 is set lower than the altitude of the top layer of the insulator film layer 215 and set higher than the altitude of the lowest layer of the insulator film layer 215. This structure is made because of the same reason as described in FIG. 44.

At the bottom part of the lower part of the bit line 203 in the space of the stacked film made of the gate polysilicon layers 221p, 222p, 223p, 224p, 261p, 262p and the insulator film layers 211, 212, 213, 214, 215, 271, 272, the upper surface of the polysilicon layer 206p and the channel polysilicon layer 208p are contacted. The bit line 203 communicates with the polysilicon diode PD through the polysilicon layer 238p and the channel polysilicon layer 208p which are formed on the both side surfaces of the stacked film made of made of the gate polysilicon layers 21p, 22p, 23p, 24p, 61p, 62p and the insulator film layers 11, 12, 13, 14, 15, 71, 72.

As similar to FIG. 52, stripe shape patterning is performed in the bit line. When the bit line 3 is patterned in the stripe shape, the patterned parts of the stacked film made of the gate polysilicon layers 221p, 222p, 223p, 224p, 261p, 262p and the insulator film layers 211, 212, 213, 214, 215, 271, 272 and the gate insulator film layer 9 remain without patterning. However, the patterned parts of the channel polysilicon layer 208p, 238p, the phase change material layer 207, and the insulator film layer 210 are removed. The polysilicon diode PD above the word line 202 is collectively removed at the same time with the above-described stripe shape patterning, and turn into a space part. Thereafter, an insulator body is formed in a space part generated from the above-described stripe shape patterning.

Figure 79:
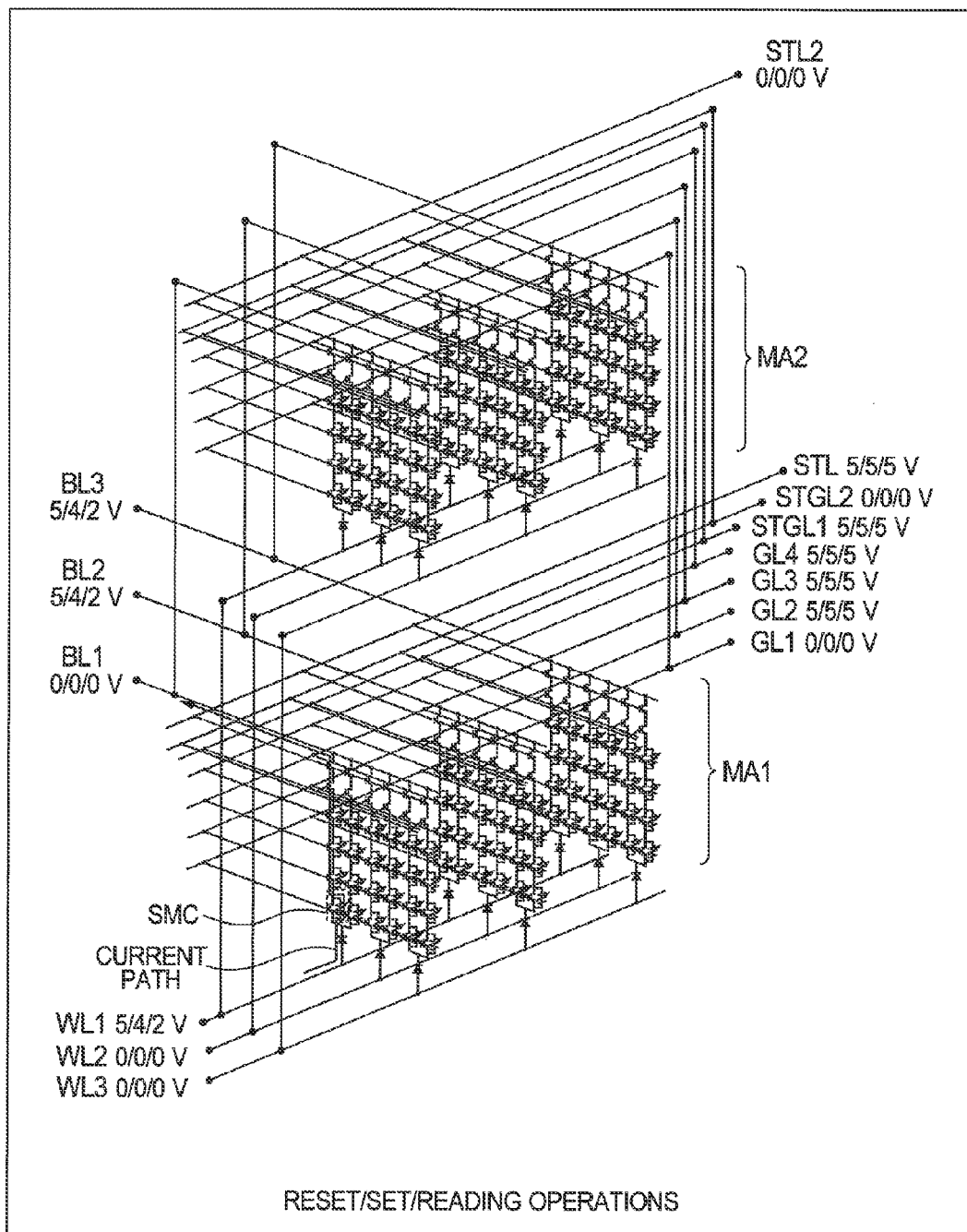
FIG. 79 is a circuit diagram illustrating the reset operation, the set operation and the read operation of the memory cell array in the embodiment 3 of this invention.

The semiconductor storage device of the embodiment 3 has two layers of the vertical type chain memories. Therefore, the reset operation, the set operation and the read operation are performed by, for example as illustrated in FIG. 79, controlling voltages of the bit lines BL1, BL2, BL3, BL4; the word lines WL1, WL2, WL3; and the gate signal lines GL1, GL2, GL3, GL4; the gate signal lines STGL1, STGL2; and the layer select gates STL, STL2. As described in FIG. 77, in the first layer and the second layer of the vertical type chain memories, the bit lines, the word lines, the gate signal lines of the memory cell and the gate signal lines of the select transistor are connected to the line selector in a state of connecting with each other. Only in the layer select transistor, the first layer and the second layer are not connected with each other and connected to the line selector. Therefore, in the first layer and the second layer of the vertical type chain memories, the same voltage is supplied to the bit lines, the word lines, the gate signal lines of the memory cell and the gate signal lines of the select transistor, and different voltages between the first layer and the second layer can be supplied only to the layer select transistor.

In FIG. 79, voltages of WL1, that is, 5/4/2 V, are voltages at the time of the reset operation, at the time of the set operation and at the time of the read operation, respectively. Similarly, notations of voltages of other terminals in FIG. 34 represent voltages at the time of the reset operation, at the time of the set operation and at the time of the read operation in this order. Approximately five volts are biased to the layer select transistor is the vertical type chain memory including the selected cell, that is, STL in the case of FIG. 79, and the layer select transistor is the first layer is set to the ON state. Approximately zero volts are biased to the layer select transistor in the vertical type chain memory other than the above case, that is, STL2 in the case of FIG. 79, and the layer select transistor in the second layer is set to the OFF state. Thereby, it is possible that current is not flown to the second layer of the vertical type chain memory.

In the first layer of the vertical type chain memory, in the vertical type chain memory in which the bit line side is connected to BL2, BL3, or BL4 and the word line side is connected to WL1, both voltages of the bit line and the word line are 5 V at the time of the reset operation, 4 V at the time of the set operation, and 2 V at the time of the read operation. As a result, current does not flow because the bit line and the word line have no voltage difference. In the vertical type chain memory in which the bit line side is connected to BL1 and the word line side is connected to WL2 or WL3, both voltages of the bit line and the word line are 0 V at the time of the reset operation, at the time of the set operation, and at the time of the read operation. As a result, current does not flow because the bit line and the word line have no voltage difference. In the vertical type chain memory in which the bit line side is connected to BL2, BL3 or BL4 and the word line side is connected to WL2 or WL3, 0 V and 5 V are biased to the word line and the bit line respectively at the time of the reset operation; 0 V and 4 V are biased to the word line and the bit line respectively at the time of the set operation; and 0 V and 2 V are biased to the word line and the bit line respectively at the time of the read operation. Voltages are biased in a reverse bias direction of the polysilicon diode PD that constitutes the vertical type chain memory. Withstand voltage of PD can be formed so as to be higher than 5 V, and thereby, it is possible that current does not flow.

Forward bias to PD can be biased so as to flow current through only a part of the first layer of the vertical type chain memory in which the bit line side is connected to BL1 and the word line side is connected to WL1. As a result, SMC in the memory array can be selected and operated because SMC in the vertical type chain can be selected and operated by the method described in FIG. 33 in the embodiment 2.

Figure 80:
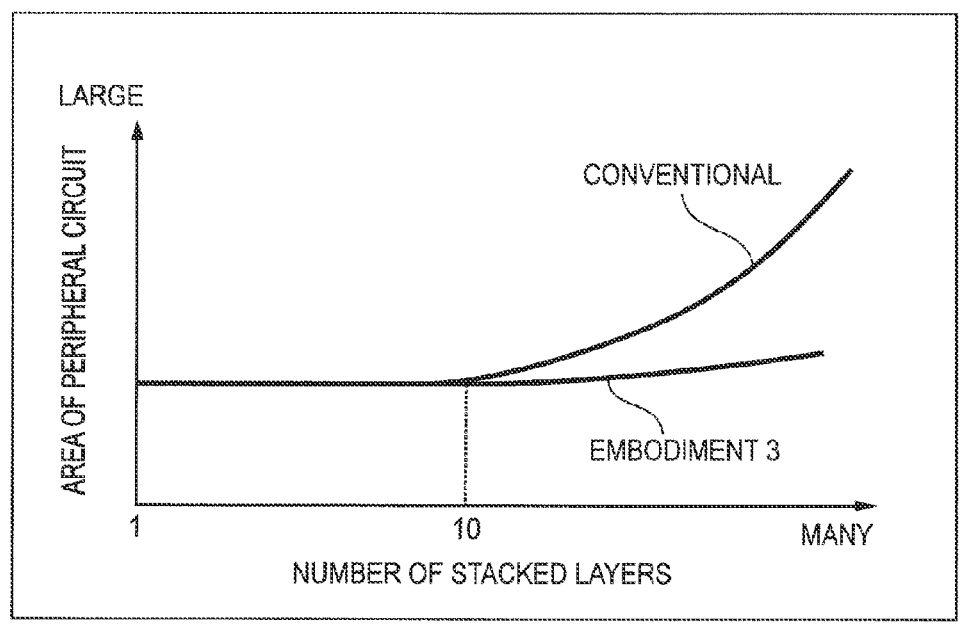
FIG. 80 is a view illustrating an effect of the embodiment 3 of this invention.

When the number of the stacked layers is increased in one layer of the vertical type chain memory, the area of the peripheral circuit, particularly, the line selector is rapidly increased in accordance with increase in the number of the stacked layers, because the number of gates in which voltage should be independently controlled is increased depending on the number of the stacked layers. On the other hand, when the vertical type chain memories including a plurality of memory layers are staked as the embodiment 3, the memory layers can be added by adding only one layer of a terminal which needs independent voltage controls, that is, a layer select gate. As a result, as illustrated in FIG. 80, the increase in the area of the peripheral circuit, particularly the line selector at the time of addition of the number of the stacked layers can be significantly suppressed. Thereby, cost reduction by stacking layers of the memory elements can be effectively achieved.

Embodiment 4

In the embodiment 1 to the embodiment 3, the spaces for forming the contacts GC1, GC2, GC3, GC4 for connecting the gate polysilicon layers 21p, 22p, 23p, 24p and the metal wires GL1, GL2, GL3, GL4 in the vertical type chain memory, and the contacts STGC1, STGC2 for connecting the gate polysilicon layer 61p of the select transistor and the wires STGL1, STGL2 are formed by setting protrusion amounts of the gate polysilicon layers 21p, 22p, 23p, 24p, 61p in the extending direction of the word line smaller in this order and patterning the gate polysilicon layers 21p, 22p, 23p, 24p, 61p stepwise.

However, when this method is used, a protrusion amount from the end part of the memory array MA of the gate polysilicon of the lowest layer is increased in proportion to the number of the stacked gate layers. Excess area other than the memory array is increased because the memory cell cannot be formed in the proportion part. Therefore, if this area can be reduced, an occupancy rate of the memory array can be increased. As a result, the cost can be reduced.

In the embodiment 4, even when the number of the stacked layers is increased, a method for decreasing the protrusion amount of the gate polysilicon from the memory array MA for a region of contact formation to the gate polysilicon is provided.

Similar to the embodiment 2, the example of the semiconductor storage device in which the gate polysilicon layers 21p, 22p, 23p, 24p, and the insulator film layer 11 formed between the polysilicon diode PD and the gate polysilicon, the insulator film layers 12, 13, 14 between the gate polysilicon layers, and an insulator film between the gate polysilicon and the bit line 3, which are components of the memory array of the vertical type chain memory, are patterned in the memory array MA part in a stripe shape in parallel with the word line 2 is illustrated.

Figure 81:
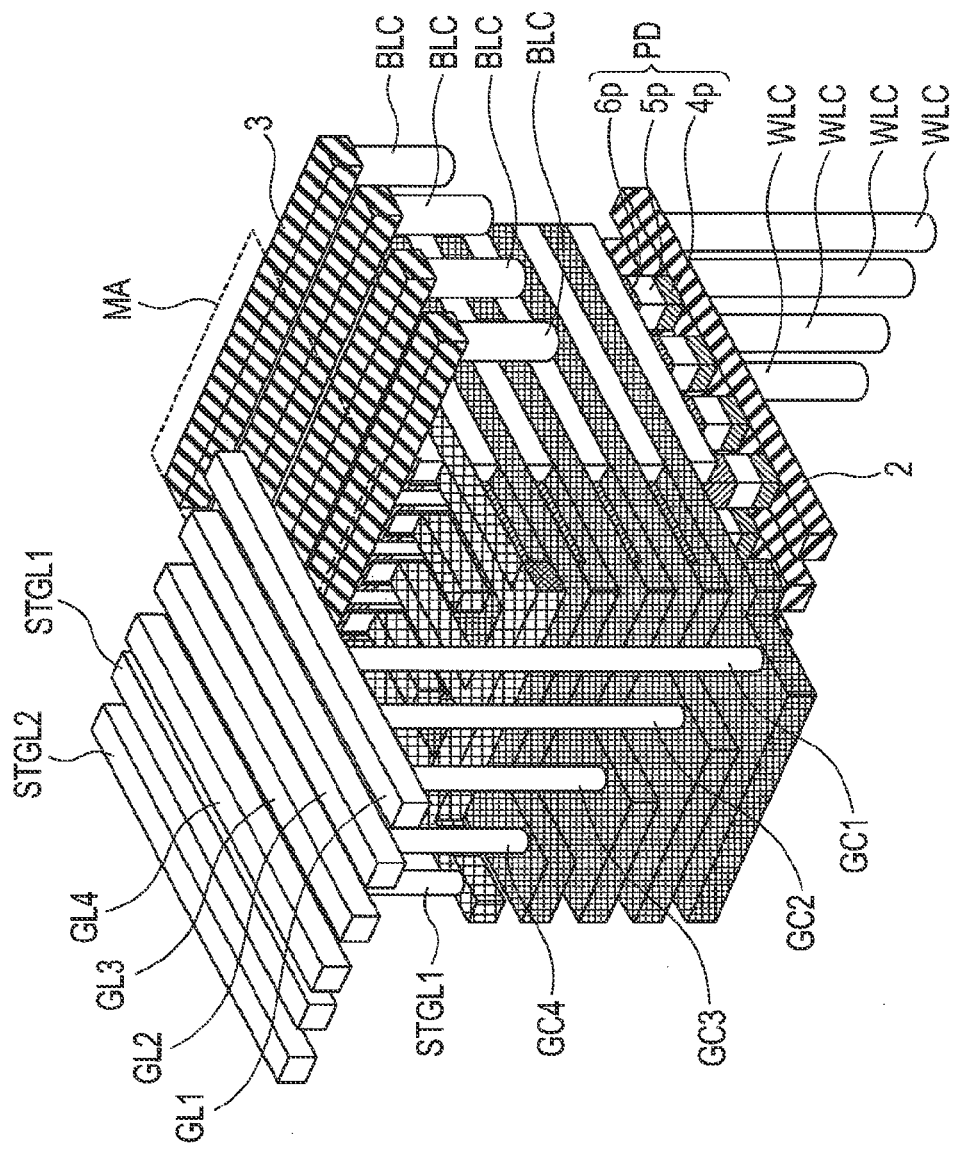
FIG. 81 is a partial three dimensional schematic view of a semiconductor storage device in an embodiment 4 of this invention.

FIG. 81 is a partial three dimensional schematic view of the semiconductor storage device in the embodiment 4. The view illustrates a part of the memory cell array, wires and contacts. The part constituted by the word line 2 made of a metal wire; the contact hole WLC connecting the word line 2 and the line selector illustrated in FIG. 1; the polysilicon diode PD made of the polysilicon layer 4p in which a p-type impurity is doped, the polysilicon layer 5p in which a low concentration impurity is doped and the polysilicon layer 6p in which an n-type impurity is doped; the gate polysilicon layers 21p, 22p, 23p, 24p of the memory cell; the gate polysilicon layer 61p of the select transistor; the metal wires GL1, GL2, GL3, GL4 for supplying electricity to the gate polysilicon layer of the memory cells; the metal wires STGL1, STGL2 for supplying electricity to the gate polysilicon layer 61p of the select transistor; the contacts GC1, GC2, GC3, GC4 for connecting the gate polysilicon layers 21p, 22p, 23p, 24p and the metal wires GL1, GL2, GL3, GL4 of the memory cell, respectively; the contacts STGC1 for connecting the gate polysilicon layer 61p of the select transistor and the wire STGL1; the bit line 3 made of a metal wire; the contact hole BLC for connecting the bit line 3 and the line selector illustrated in FIG. 1; the insulator film layer 11 between the polysilicon diode PD and the gate polysilicon layer 21p; the insulator film layers 12, 13, 14, 15 between the gate polysilicon layers; and the insulator film layer 71 between the gate polysilicon layer 61p and the bit line 3 is illustrated in FIG. 81.

Although not illustrated, the wires GL1, GL2, GL3, and GL4 are connected to the line selector through GLC1, GLC2, GLC3 and GLC4, respectively. The wires STGL1, STGL2 are connected to the line selector through STGLC1 and STGLC2, respectively.

In FIG. 81, the gate polysilicon layers 21p, 22p, 23p, 24p, 61p are illustrated so as to be communicated every other line. Stripe patterns seen as being isolated are similarly connected in the opposite side of the word line direction. At this position, the gate polysilicon layers 21p, 22p, 23p, 24p, 61p are similarly connected to GL1, GL2, CL3, CL4 and STGL2 through GC1, GC2, GC3, GC4 and STGC2, respectively. Therefore, in the gate polysilicon layer 21 of the memory cell, all adjacent stripe patterns are connected to the same wire GL1. The gate polysilicon layers 22p, 23 p, 24p have similar structures. The gate polysilicon layer 61p of the select transistor is connected to the two wires STGL1 and STGL2 which are insulated each other in every one stripe, and voltage can be independently biased.

Different from the first and embodiment 2s, in FIG. 81, step structures of the gate polysilicon 21p, 22p, 23p, 24p, 61p for forming the contacts GC1, GC2, GC3, GC4, STGC1 are formed stepwise in an extending direction of the bit line 3, and GL1, GL2, GL3, GL4, STGL1 and STGL2 are formed in a direction parallel to the word line 2.

Thereby, even when the number of the stacked layers of the gates is increased, the gate polysilicon can be formed stepwise with the protrusion amount from MA being constant, and can be connected to wires for supplying electricity to the gates by the contacts.

In the embodiment 4, the memory array MA part has similar structure to the embodiment 2, while a shape of the gate polysilicon around MA, and peripheral parts such as contacts and wires are different from the embodiment 2.

Hereinafter, one example of a method for manufacturing the semiconductor storage device in the embodiment 4 is described. Manufacturing processes up to FIG. 36 are similar to the embodiment 2. However, the insulator films 11, 12, 13, 14, 15, 71 are made of silicon nitride films.

Figure 82:
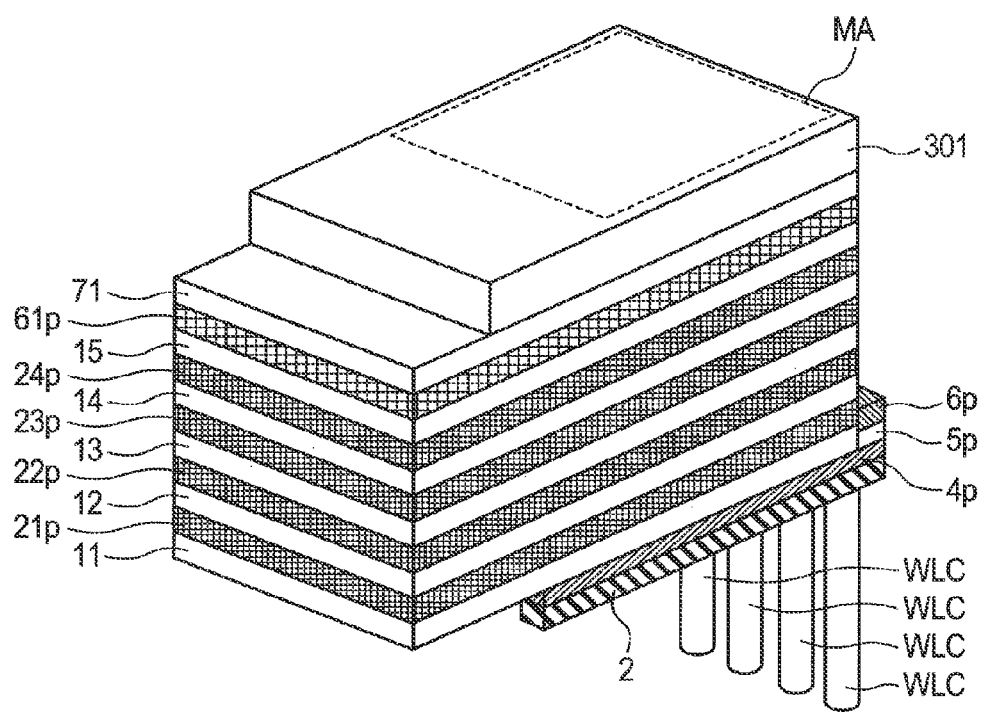
FIG. 82 is a partial three dimensional schematic view illustrating one example of a method for manufacturing the semiconductor storage device in the embodiment 4 of this invention.

A titanium nitride (TiN) film 301 turning into a hard mask is further formed above the stacked film formed in FIG. 36. Subsequently, by using known lithography and dry-etching technologies, 301 in a contact forming part to the polysilicon 21p, 22p, 23p, 24p, 61p in FIG. 81 is removed (FIG. 82). In the MA region, 301 remains.

Figure 83:
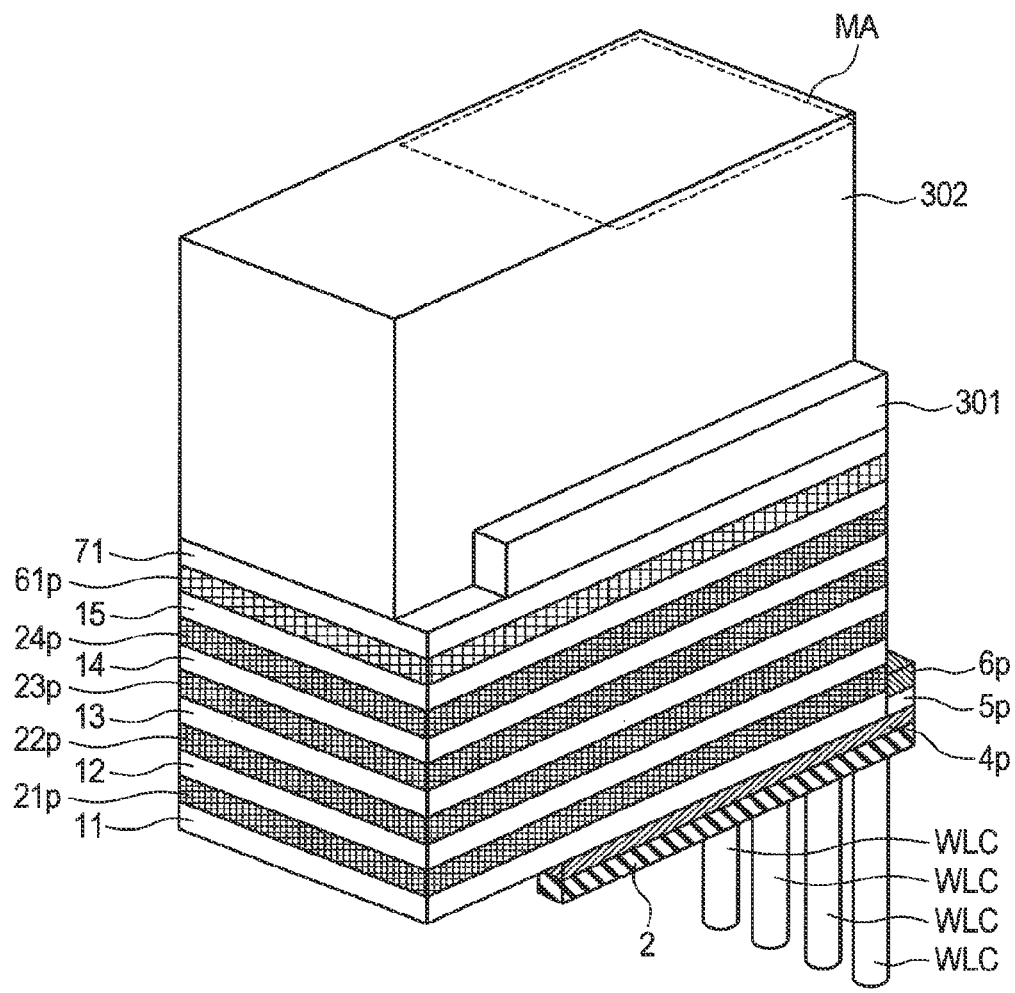
FIG. 83 is a partial three dimensional schematic view illustrating one example of methods for manufacturing the semiconductor storage device in the embodiment 4 of this invention.

Subsequently, a silicon oxide film 302 turning into a hard mask is formed, and patterned by using the known lithography and dry-etching technologies so that the silicon oxide film 302 has the same shape as the final shape of the gate polysilicon 21p of the lowest layer in a space part of 301 in FIG. 81 (FIG. 83).

Figure 84:
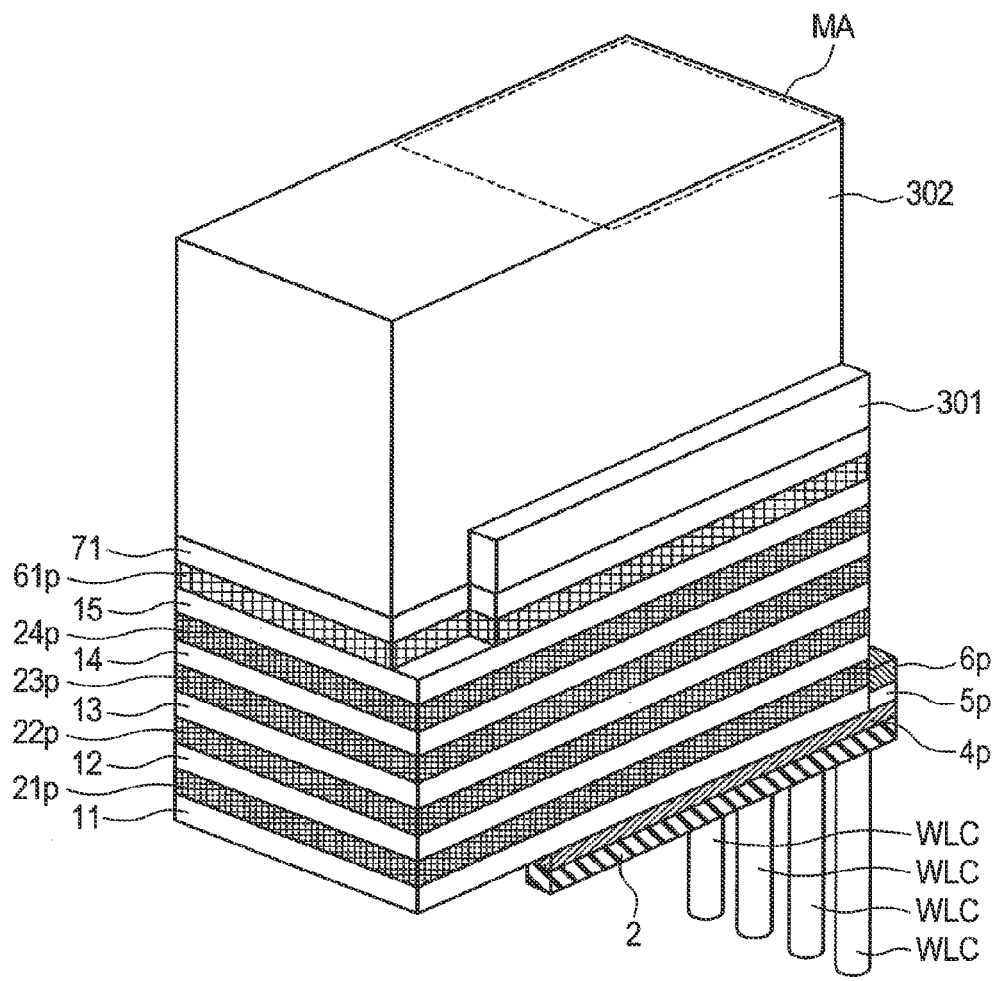
FIG. 84 is a partial three dimensional schematic view illustrating one example of the method for manufacturing the semiconductor storage device in the embodiment 4 of this invention.

Subsequently, the silicon nitride film 71 and the gate polysilicon 61p are sequentially patterned by dry-etching using the hard masks 301, 302 as masks (FIG. 84).

Figure 85:
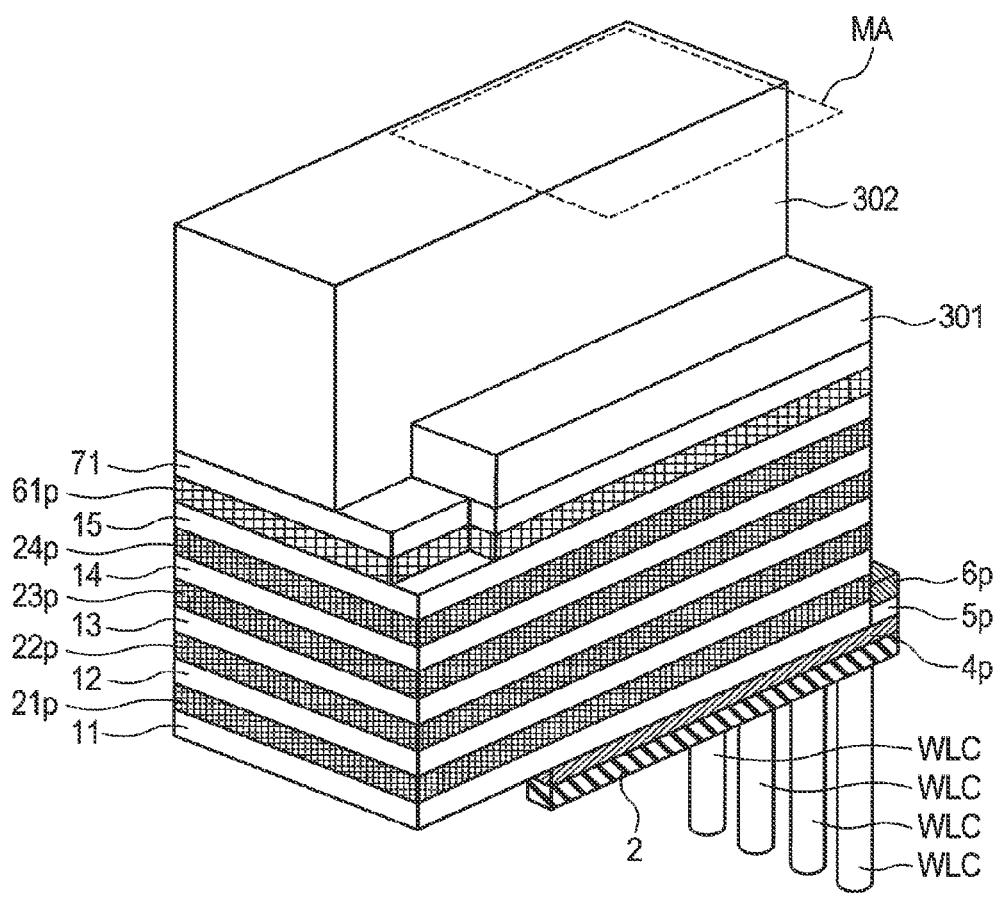
FIG. 85 is a partial three dimensional schematic view illustrating one example of the method for manufacturing the semiconductor storage device in the embodiment 4 of this invention.

Subsequently, the hard mask 302 is isotropically etched by, for example, wet etching. The hard mask 302 reduces its film thickness as well as is horizontally dry-etched, and becomes as illustrated in FIG. 85. At this time, exposed other parts, that is, the hard mask 301, the silicon nitride film 71, the gate polysilicon 61p, and the silicon nitride film 15 are not etched.

Figure 86:
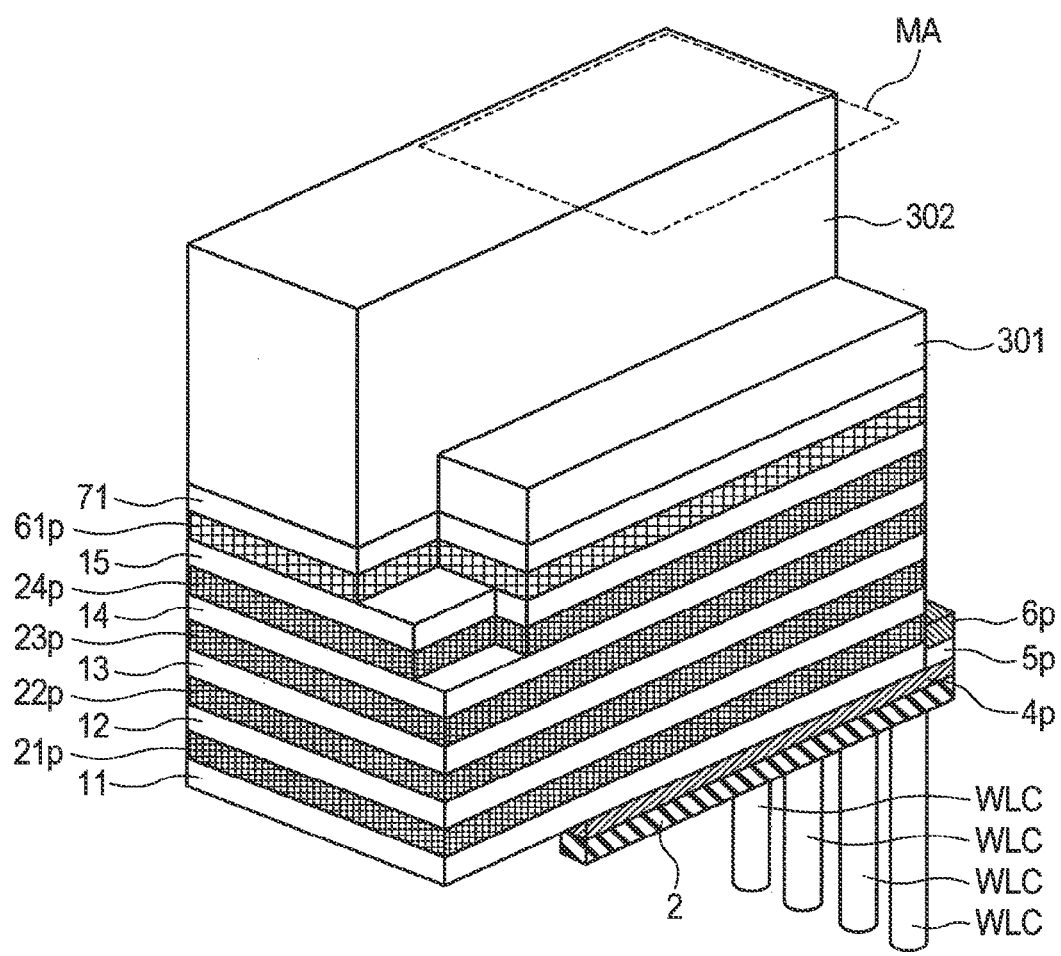
FIG. 86 is a partial three dimensional schematic view illustrating one example of the method for manufacturing the semiconductor storage device in the embodiment 4 of this invention.

Subsequently, the hard mask 301 and 302 whose dimension becomes smaller by the wet-etching are used as masks, and thereby the silicon nitride film 71, 15, the gate polysilicon 61p, 24p are sequentially patterned by dry-etching (FIG. 86).

Figure 87:
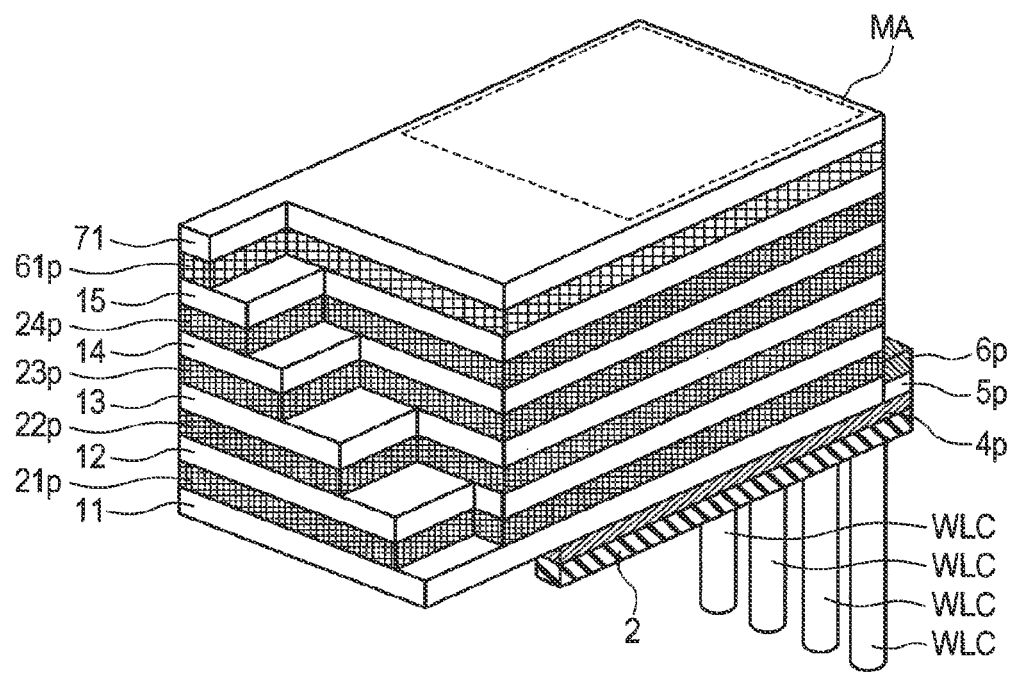
FIG. 87 is a partial three dimensional schematic view illustrating one example of the method for manufacturing the semiconductor storage device in the embodiment 4 of this invention.

Similarly, after streamlining the hard mask 302 by wet-etching and patterning the silicon nitride film/the gate polysilicon are repeated, the hard masks 301, 302 are removed. As a result, a stacked film made of the gate polysilicon 21p, 22p, 23p, 24p, 61p and the silicon nitride films 11, 12, 13, 14, 15, 71 is processed as illustrated in FIG. 87. Thereafter, manufacture of the semiconductor storage device illustrated in FIG. 81 is possible through similar processes from FIG. 37 to FIG. 52.

Compared to the embodiment 2, a manufacturing process of gate contact formation is added to the semiconductor storage device in the embodiment 4. However, particularly in the case that the number of the stacked layer is high, this embodiment is advantageous for reduction in the bit cost because increase in the area of the semiconductor storage device with increase in the number of the stacked layer can be suppressed.

Embodiment 5

Although embodiments using the diode PD as the selection element are described from the embodiment 1 to the embodiment 4, a vertical type transistor can be provided as a selection element as described in Patent Literature 1. However, when the vertical type transistor is positioned in the lower side of the memory part as described in Patent Literature 1, after forming the vertical type transistor, a through hole in the memory part is required to be firmed. In this case, a position of the vertical type transistor and a position of the through hole are required to be aligned. In addition, since the channel layer of the vertical type transistor and the channel layer of the memory part are formed in two-step processes, a boundary part thereof has larger contact resistance. Therefore, the embodiment 5 provides a method for being capable of collectively forming the vertical type transistor and the memory part at the same time.

Figure 88:
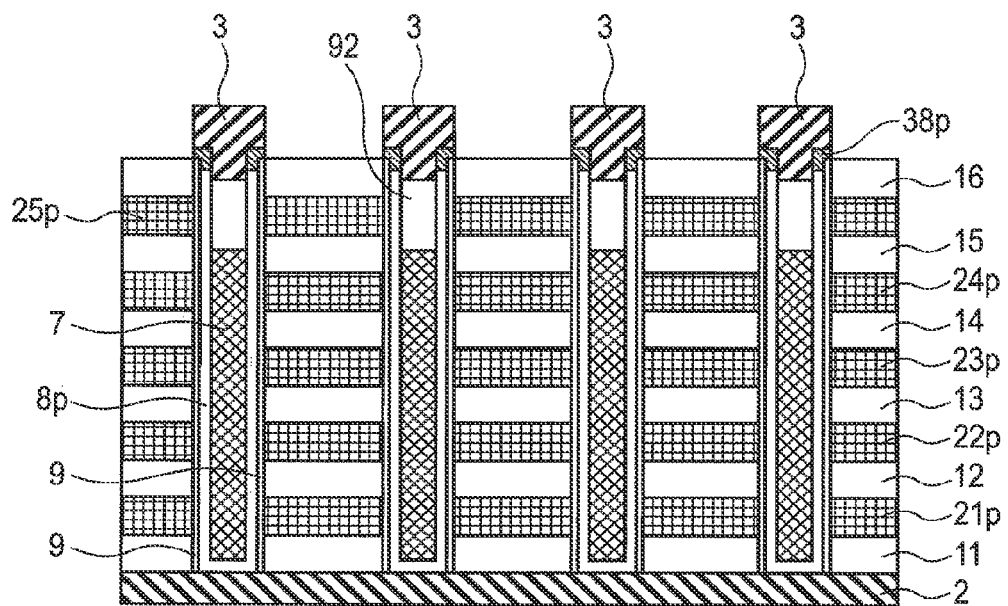
FIG. 88 is a partial cross-sectional view of a memory cell array in an embodiment 5 of this invention.
Figure 89:
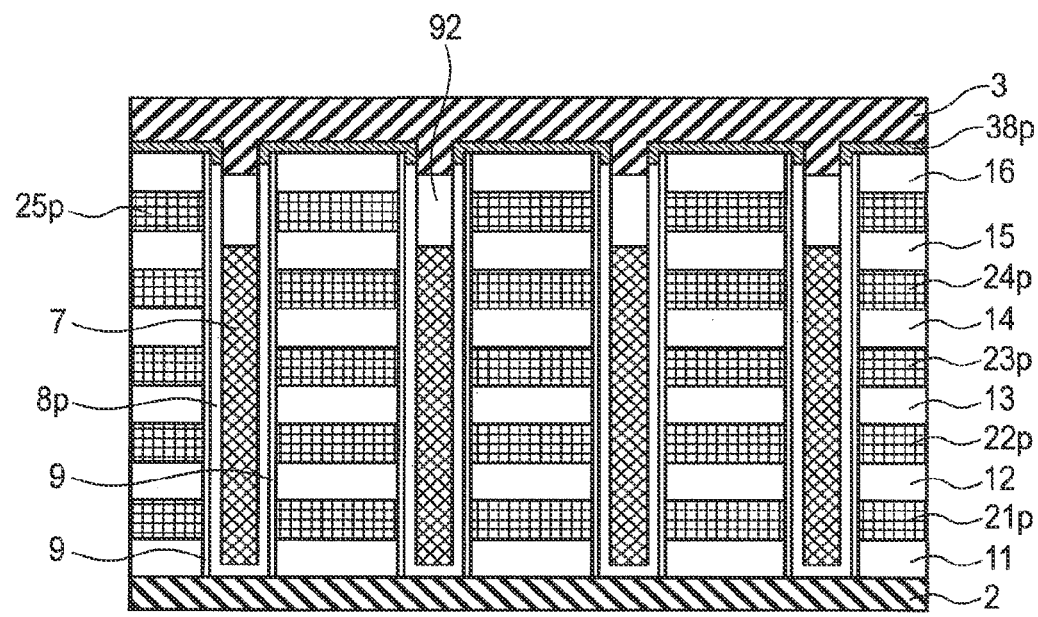
FIG. 89 is a partial cross-sectional view of the memory cell array in the embodiment 5 of this invention.

FIG. 88 and FIG. 89 are views illustrating the embodiment 5. FIG. 88 is a cross-sectional view of a structure of the embodiment 5 taken in the direction of the bit line, and FIG. 89 is a cross-sectional view of the structure of the embodiment 5 taken in the direction orthogonal to the bit line. The structure of the embodiment 5 is basically corresponding to the structures of the first and the embodiment 2s, so that description of the common parts is omitted.

The structure of the embodiment 5 has a gate polysilicon layer 25p turning into a selection element above the gate polysilicon layers 21p, 22p, 23p, 24p turning into gates of the memory cell transistors. As illustrated in FIG. 88, the gate polysilicon layer 25p is isolated by the insulator films in every through hole in the direction of the bit line. By this structure, one through hole can be selected by selecting one of the bit lines 3 and the one of the gate polysilicon layer 25p. The metal wire 2 functioning as the word line in the embodiment 1 to the embodiment 4 turns into a source line. The gate polysilicon layer 25p is corresponding to the word line. The source line has a plate structure and is in common with all through holes.

Following processes can be performed in order to form this structure.

The insulator film layer 11, the amorphous silicon layer 21a, the insulator film layer 12, the amorphous silicon layer 22a, the insulator film layer 13, the amorphous silicon layer 23a, the insulator film layer 14, the amorphous silicon layer 24a, the insulator film layer 15, and the amorphous silicon layer 25a are formed in this order above the metal wire 2 having the plate structure, and subsequently, the amorphous silicon layer 25a turning into a gate of the select transistor is patterned in a stripe shape. Subsequently, after the space of the amorphous silicon patterned in the insulator film 16 is embedded, the upper surface is planarized by the CMP method.

Subsequently, a hole from the upper surface of the stacked film to the upper surface of the metal wire 2 is formed.

Subsequently, the gate insulator film, the channel silicon 8p, and the phase change material 7 can be embedded into the hole by performing similar processes from FIG. 14 to FIG. 25 in the embodiment 1.

However, the phase change material 7 in the altitude part of the gate polysilicon 25p is removed and the removed part is embedded with the insulator film 92. A structure illustrated in FIGS. 88 and 89 can be completed by forming a metal film turning into the bit line 3 and patterning the metal film in a stripe shape in a direction perpendicular to the select transistor.

As described above, by providing the continuous channel layer 38p on the sidewalls of the gate polysilicon layer 25p turning into the gate of the select transistor and the gate polysilicon layers 21p, 22p, 23p, 24p turning into the gate of the memory cell transistor, alignment is not required and contact resistance of the channel layer does not cause problem.

This invention is described by assuming that chalcogenide materials are used for the memory elements. However, materials for the memory elements are not limited. Not only the phase change memory but also various semiconductor memories in which electric properties are varied by applying current to elements such as magnetoresistive random access memory and a resistive memory can be applied.

This invention is also described by assuming that polysilicon is used for the gate polysilicon layer performing a gate operation and the channel polysilicon layer 8p turning into a source-drain path. However, materials for the gate polysilicon layer and the channel polysilicon layer are not limited. This invention can be achieved by applying semiconductor materials which can perform the gate operation.

In this specification, the terms a "word line" and a "bit line" are used for understandability of the description. Both lines are selection lines used for selecting one vertical type chain memory. Therefore, it goes without saying that positional relation and the like can be turned upside down, and connection of a read circuit such as a sense amplifier to the bit line side is not required.

REFERENCE SIGNS LIST

2 Word Line
3 Bit Line
4a P-type Impurity Doped Amorphous Silicon Layer
5a Low Concentration Impurity Doped Amorphous Silicon Layer
6a N-type Impurity Doped Amorphous Silicon Layer
4p P-type Impurity Doped Polysilicon Layer
5p Low Concentration Impurity Doped Polysilicon Layer
6p N-type Impurity Doped Polysilicon Layer
7 Phase Change Material Layer
8a Amorphous Silicon Layer
8p Channel Polysilicon Layer
9 Gate Insulator Film Layer
10 Insulator Film Layer
11, 12, 13, 14, 15, 16 Insulator Film Layer
21a, 22a, 23a, 24a Amorphous Silicon Layer
21p, 22p, 23p, 24p, 25p Polysilicon Layer
30, 31, 32, 33 Insulator Film Layer
38a N-type Impurity Doped Amorphous Silicon Layer
38p N-type Impurity Doped Polysilicon Layer
50 Hole Formed in Insulator Film and Silicon Layer
51, 52 Insulator Film Layer
61a, 62a Amorphous Silicon Layer
61p, 62p Polysilicon Layer
71, 72 Insulator Film Layer
88a, 89a Amorphous Silicon Layer
88p, 89p Polysilicon Layer
91, 92 Insulator Film Layer
98p, 99p Polysilicon Layer
202 Word Line
203 Bit Line
204p P-type Impurity Doped Polysilicon Layer
205p Low Concentration Impurity Doped Polysilicon Layer
206p N-type Impurity Doped Polysilicon Layer
207 Recording Layer of Variable Resistance Type Element
208p Channel Semiconductor Layer
209 Gate Insulator Film Layer
210 Insulator Film Layer
211, 212, 213, 214, 215 Insulator Film Layer
221p, 22p, 223p, 224p Polysilicon Layer
231 Insulator Film Layer
238p N-type Impurity Doped Polysilicon Layer
261p, 262p Polysilicon Layer
271, 272 Insulator Film Layer
291, 292 Insulator Film Layer
301 Hard Mask (TiN)
302 Hard Mask (Silicon Oxide Film)
1001 I/O Interface
1002 Memory Cell Array
1003 Source circuit 1004 Source circuit
1005 Source circuit
1006 Source circuit
1007 Voltage Selector
1008 Line selector
1009 Control circuit
1010 Readout circuit
MA, MA1, MA2 Vertical Type Chain Memory Array
BL, BL1, BL2, BL3, BL4 Bit Line
WL, WL1, WL2, WL3 Word Line
BLC, BLCONT2 Bit Line Contact
WLC, WLC2 Word Line Contact
GC1, GC2, GC3, GC4 Contact to Gate Electrode
GL1, GL2, GL3, GL4 Metal Wire for Supplying Electricity to Gate Electrode
GLC1, GLC2, GLC3, GLC4 Contact between Metal Wire and Peripheral Circuit
STGC1, STGC2 Contact to Select Transistor Gate
STGL1, STGL2 Metal Wire for Supplying Electricity to Select Transistor
SMC Selected Memory Cell
USMC, USMC1, USMC2, USMC3 Unselected Memory Cell GRB1, GRB2, GRB3 Grain Boundary of Polysilicon
θ Angle Using Ion Implantation Direction Perpendicular to Semiconductor Substrate as Standard
θMAX Acceptable Maximum Value of θ
STC, STC2 Contact to Gate Electrode of Layer Selection Switch
STL, STL2 Metal Wire for Supplying Electricity to Gate Electrode of Layer Selection Switch
STLC, STLC2 Contact between Metal Wire and Peripheral Circuit
GC21, GC22, GC23, GC24 Contact to Gate Electrode
GL21, GL22, GL231 GL24 Metal Wire for Supplying Electricity to Gate Electrode
GLC21, GLC22, GLC23, GLC24 Contact between Metal Wire and Peripheral Circuit
STGC21, STGC22 Contact to Select Transistor Gate
STGL21, STGL22 Metal Wire for Supplying Electricity to Select Transistor
STGLC21, STGLC22 Contact between Metal Wire and Peripheral Circuit
PD Polysilicon Diode

The invention claimed is:

1. A method for manufacturing a semiconductor storage device, comprising:
a first step of forming a stacked body which comprises N+1 (N≥1) number of inter-gate insulator layers and N number of gate semiconductor layers alternately stacked;
a second step of removing a part of the stacked body from a lower surface of a first inter-gate insulator layer to an upper surface of an (N+1)th inter-gate insulator layer in a stripe shape in a first direction;
a third step of forming a first insulator layer on a side surface of the stacked body which is formed by the removing in the second step;
a fourth step of forming a first variable resistance material layer including a variable resistance material along the first insulator layer which is formed in the third step; and
a fifth step of removing a part of the first variable resistance material layer which is formed in the fourth step, and alternately forming a region where the first variable resistance material layer remains and a region where the first variable resistance material layer is removed in the first direction.

2. The method of claim 1, further comprising:
a sixth step of stacking a second insulator layer, a first selection line layer, a first semiconductor layer in which a first conductive impurity is doped, a second semiconductor layer, and a third semiconductor layer in which a second conductive impurity is doped in this order on a semiconductor substrate before the first step;
a seventh step of patterning the first selection line layer, the first semiconductor layer, the second semiconductor layer, and the third semiconductor layer in a stripe shape in the first direction;
an eighth step of depositing a third insulator layer after the seventh step;
a ninth step of patterning the first semiconductor layer, the second semiconductor layer, and the third semiconductor layer in a stripe shape in a second direction which intersects with the first direction;
a tenth step of depositing a fourth insulator layer after the ninth step; and
an eleventh step of removing the third insulator layer and the forth insulator layer by a chemical mechanical polishing method to expose the upper surface of the third semiconductor layer.

3. The method of claim 2, further comprising:
collectively patterning the first selection line layer, the first semiconductor layer, the second semiconductor layer, and the third semiconductor layer at a same time in the seventh step.

4. The method of claim 1, further comprising:
a twelfth step of forming a mask layer in a stripe shape in a second direction which intersects with the first direction after the fourth step,
wherein, in the fifth step, a part of the first variable resistance material layer is removed by using the mask layer formed in the twelfth step as a mask.

5. The method of claim 1, further comprising:
a thirteenth step of stacking a second selection line layer and patterning the second selection line layer in a stripe shape in a second direction which intersects with the first direction after the forth step,
wherein, in the fifth step, a part of the variable resistance material layer is removed by using the second selection line formed in the thirteenth step as a mask.

6. The method of claim 1,
wherein, in the third step, a first semiconductor channel layer is formed on the first insulator layer after forming the first insulator layer;
in the fourth step, the first variable resistance material layer is formed on a side surface of the first semiconductor channel layer;
in the fourth step, further, a fifth insulator layer is formed along a side surface of the first variable resistance material layer and a gap of the stacked body which is patterned in the stripe shape is embedded; and
in the fifth step, the first semiconductor channel layer and the fifth insulator layer are removed together with the first variable resistance material layer.

7. The method of claim 1, further comprising:
a sixth step of stacking a second insulator layer, a first selection line layer, a first semiconductor layer in which a first conductive impurity is doped, and a second semiconductor layer in which a second conductive impurity is doped in this order on a semiconductor substrate before the first step; and
a seventh step of patterning the first selection line layer, the first semiconductor layer, and the second semiconductor layer in a stripe shape in the first direction, wherein the first semiconductor layer and the second semiconductor layer are collectively patterned at a same time together with the first variable resistance material layer in the fifth step.

8. The method of claim 2,
wherein the third insulator layer and the fourth insulator layer are formed by an insulating material having a different etching ratio to the inert-gate insulator film.

9. The method of claim 1,
wherein, after forming the first insulator layer, a first semiconductor channel layer is further formed on a side surface of the first insulator layer in the third step.

10. The method of claim 9,
wherein, after forming the first semiconductor channel layer, a second semiconductor channel layer is formed on a side surface of the first semiconductor channel layer in the third step.

11. The method of claim 10,
wherein, after forming the first semiconductor channel layer, the first insulator layer and the first semiconductor channel layer at a bottom in a region between the stacked body which is patterned in the stripe shape are removed and thereafter the second semiconductor channel layer is formed in the third step.

12. The method of claim 1, further comprising:
removing the first variable resistance material layer in a position between the upper surface and a lower surface of the (N+1)th inter-gate insulator film layer from a bottom, and thereafter, stacking a second selection line layer after the fourth step.

13. The method of claim 1,
wherein an inter-gate insulator layer is formed by a material having higher dielectric constant than the inter-gate insulator layer.

14. The method of claim 1,
wherein each thickness of an inter-gate insulator layer is formed to be thinner than each thickness of a semiconductor layer.

15. The method of claim 2,
wherein, in the sixth step, a third insulator layer is formed in a region among the first selection line layer, the first semiconductor layer, the second semiconductor layer, and the third semiconductor layer which are patterned in the stripe shape; and
in the second step, a width of the stacked body which is patterned in the stripe shape in the second direction which intersect the first direction is smaller than a width in the second direction of the third insulator layer formed in the sixth step.

16. The method of claim 1,
wherein a gate semiconductor layer is formed by polysilicon.

17. The method of claim 1, wherein the first variable resistance material layer is formed by a phase change material.

* * * * *